(12) United States Patent
Okada et al.

(10) Patent No.: US 6,809,529 B2
(45) Date of Patent: Oct. 26, 2004

(54) FORCE DETECTOR

(75) Inventors: Kazuhiro Okada, Ageo (JP); Nobumitsu Taniguchi, Ageo (JP)

(73) Assignee: Wacoh Corporation, Saitama (JP)

(*) Notice: Subject to any disclaimer, the term of this patent is extended or adjusted under 35 U.S.C. 154(b) by 80 days.

(21) Appl. No.: 10/022,580

(22) Filed: Dec. 17, 2001

(65) Prior Publication Data

US 2003/0030452 A1 Feb. 13, 2003

(30) Foreign Application Priority Data

Aug. 10, 2001 (JP) .................... 2001-243814

(51) Int. Cl.[7] .................... G01R 27/26; G01D 7/00
(52) U.S. Cl. .................... 324/681; 73/862.043
(58) Field of Search .................... 324/681; 73/862.043; 463/36; 345/161

(56) References Cited

U.S. PATENT DOCUMENTS

| | | | |
|---|---|---|---|
| 4,793,193 A | * 12/1988 | Borgudd | 73/362.043 |
| 4,905,523 A | 3/1990 | Okada | 73/862.04 |
| 4,967,605 A | 11/1990 | Okada | 73/862.04 |
| 4,969,366 A | 11/1990 | Okada | 73/862.08 |
| 5,014,415 A | 5/1991 | Okada | 29/621.1 |
| 5,035,148 A | 7/1991 | Okada | 73/862.04 |
| 5,092,645 A | 3/1992 | Okada | 294/86.4 |
| 5,182,515 A | 1/1993 | Okada | 324/259 |
| 5,263,375 A | 11/1993 | Okada | 73/862.042 |
| 5,295,386 A | 3/1994 | Okada | 73/1 D |
| 5,343,765 A | 9/1994 | Okada | 73/862.043 |
| 5,365,799 A | 11/1994 | Okada | 73/862.041 |
| 5,392,658 A | 2/1995 | Okada | 73/862.043 |
| 5,406,848 A | 4/1995 | Okada | 73/517 R |
| 5,421,213 A | 6/1995 | Okada | 73/862.043 |
| 5,437,196 A | 8/1995 | Okada | 73/862.043 |
| 5,440,237 A | * 8/1995 | Brown et al. | 324/601 |
| 5,492,020 A | 2/1996 | Okada | 73/862.626 |
| 5,497,668 A | 3/1996 | Okada | 73/862.626 |

(List continued on next page.)

FOREIGN PATENT DOCUMENTS

| JP | 311671 | 11/2001 |
|---|---|---|
| JP | 2001 311671 | 11/2001 |
| WO | 99 17180 | 4/1999 |

OTHER PUBLICATIONS

Patent Abstracts of Japan, JP 2001 311671 dated Nov. 9, 2001.

*Primary Examiner*—N. Le
*Assistant Examiner*—Timothy J. Dole
(74) *Attorney, Agent, or Firm*—Ladas & Parry

(57) ABSTRACT

The invention provides a force detector in which power consumption is suppressed. Four electrodes (E11–E14) are formed on a substrate, and an elastic deformable body formed of a ruber film is disposed thereon. A conductive coating is applied on the lower surface of the elastic deformable body to provide a displacing conductive layer (26). Four capacitance elements (C11–C14) are comprised by the electrodes (E11–E14) and the displacing conductive layer (26) opposed to the electrodes. The capacitance values thereof are converted into voltage values (V11–V14) by C/V converter circuit (50), and based on operation by signal processing circuit (60), an external force applied to the elastic deformable body is detected. A pair of contacting electrodes (E15) and (E16) are formed on the substrate, and when an external force with a predetermined strength or more is applied, the elastic deformable body deforms, and the displacing conductive layer (26) comes into contact with both electrodes (E15) and (E16). The potential of the electrode (E16) is taken-in from the terminal (T5), and when said potential is Vcc, the C/V converter circuit (50) is operated in a standby mode with less power consumption, and when said potential is GND, the circuit is operated in a normal mode.

33 Claims, 24 Drawing Sheets

U.S. PATENT DOCUMENTS

| | | | |
|---|---|---|---|
| 5,531,002 A | 7/1996 | Okada | 29/25.41 |
| 5,531,092 A | 7/1996 | Okada | 73/1 D |
| 5,571,972 A | 11/1996 | Okada | 73/862.043 |
| 5,639,973 A | 6/1997 | Okada | 73/862.043 |
| 5,646,346 A | 7/1997 | Okada | 73/504.04 |
| 5,668,318 A | 9/1997 | Okada | 73/504.11 |
| 5,682,000 A | 10/1997 | Okada | 73/862.043 |
| 5,744,718 A | 4/1998 | Okada | 73/514.33 |
| 5,780,749 A | 7/1998 | Okada | 73/862.043 |
| 5,811,693 A | 9/1998 | Okada | 73/862.043 |
| 5,831,163 A | 11/1998 | Okada | 73/504.12 |
| 5,850,040 A | 12/1998 | Okada | 73/504.04 |
| 5,856,620 A | 1/1999 | Okada | 73/514.32 |
| 5,912,612 A | 6/1999 | DeVolpi | |
| 5,948,990 A * | 9/1999 | Hashida | 73/725 |
| 5,949,354 A | 9/1999 | Chang | |
| 5,962,787 A | 10/1999 | Okada | 73/514.32 |
| 5,987,985 A | 11/1999 | Okada | 73/504.04 |
| 6,003,371 A | 12/1999 | Okada | 73/504.02 |
| 6,053,057 A | 4/2000 | Okada | 73/862.043 |
| 6,076,401 A | 6/2000 | Okada | 73/504.12 |
| 6,087,925 A | 7/2000 | DeVolpi | |
| 6,098,461 A | 8/2000 | Okada | 73/514.34 |
| 6,158,291 A | 12/2000 | Okada | 73/862.043 |
| 6,159,761 A | 12/2000 | Okada | 438/53 |
| 6,185,814 B1 | 2/2001 | Okada | 29/621.1 |
| 6,205,856 B1 | 3/2001 | Okada | 73/504.11 |
| 6,269,697 B1 | 8/2001 | Okada | 73/504.02 |
| 6,282,956 B1 | 9/2001 | Okada | 73/504.12 |
| 6,313,826 B1 * | 11/2001 | Schrum et al. | 345/161 |
| 6,314,823 B1 | 11/2001 | Okada | 73/862.043 |
| 6,530,283 B2 * | 3/2003 | Okada et al. | 73/780 |
| 2001/0011994 A1 * | 8/2001 | Morimoto et al. | 345/156 |

* cited by examiner

Fig. 8
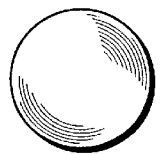
30
Fig. 9 A       Fig. 9 B
       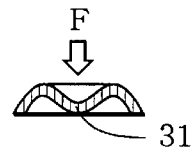
Fig. 10
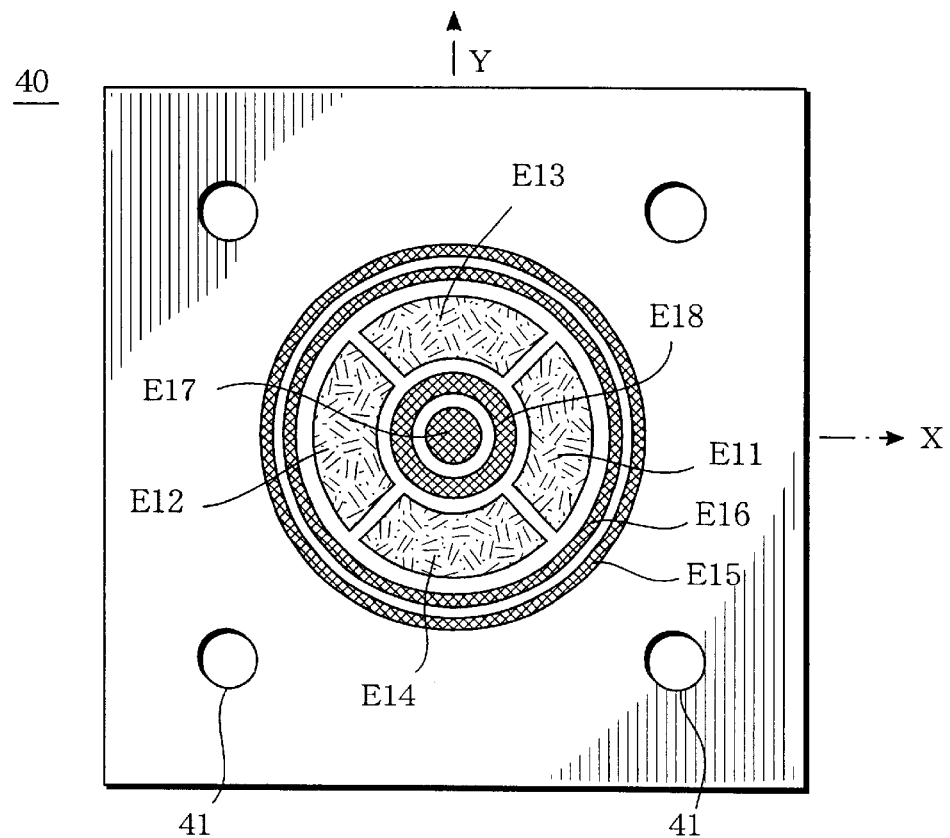

Fig. 25
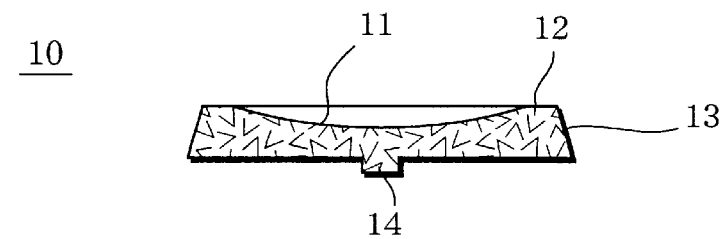
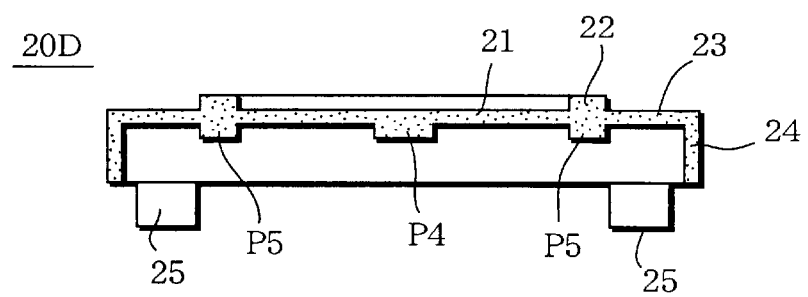
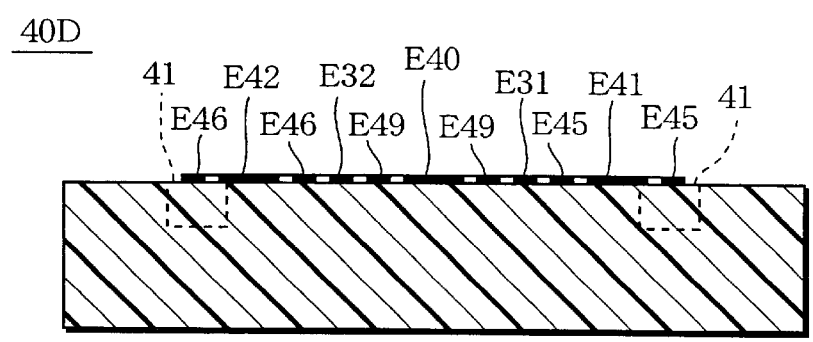

FORCE DETECTOR

BACKGROUND OF THE INVENTION

The present invention relates to a force detector using capacitance elements or variable resistance elements and, more specifically, to a force detector suitable for being applied to an input device which obtains operational inputs indicating predetermined operation amounts into an electronic apparatus such as a portable telephone, game machine, or the like which executes predetermined processing based on predetermined programs.

In an electronic apparatus such as a portable telephone, game machine, or the like, a predetermined operational input by a user is accepted, and based on this operational input, an execution of program proceeds. Normally, such an operational input is accepted while a user looks at a cursor or other objects displayed on a display screen, and an input indicating one of four directions including upward, downward, rightward, and leftward directions, or one of eight directions including diagonal directions as well are generally required. A device called a joystick has been used for executing such an input with directivity. Such type of device normally includes a built-in two-dimensional force detector which detects a direction and an operation amount of the applied operational input by independently detecting a component in the X-axis direction and a component in the Y-axis direction. For example, an operational input with a +5 component in the X-axis direction indicates an operation amount of 5 in the rightward direction, and an operational input with a −8 component in the Y-axis direction indicates an operation amount of 8 in the downward direction. Of course, detection of an operational input applied diagonally is also possible by carrying out an operation for composing the component in the X-axis direction and the component in the Y-axis direction, and so forth.

In an electronic apparatus such as a portable telephone, game machine, or the like, a clicking input is required as well as the abovementioned operational input with directivity. This clicking input is basically an input indicating a binary condition of ON/OFF, and it is important to provide an operator with a clicking sensation through this input. Therefore, a reaction force must be applied with respect to a pressing force applied from the operator's finger while securing some degree of stroke. As a switch suitable for such ON/OFF inputs with a clicking sensation, switches using elasticity of elastic materials such as rubber and metals have been generally used, and force detectors with a function for making operational inputs in predetermined directions as well as clicking inputs have been made practicable.

As relatively inexpensive input devices for electronic apparatuses, force detectors using capacitance elements have been frequently used. For a force detector using a capacitance element, a structure in which the distance between a couple of electrodes is changed by externally applied forces is employed, and by electrically detecting this electrode distance as a capacitance value for the capacitance element, the externally applied forces can be determined. Thus, basic components of a force detector using a capacitance element are a pair of electrodes, wherein advantages of a simple structure and low parts costs can be obtained. Therefore, a force detector using a capacitance element has been widely used as an input device for an electronic apparatus such as a portable telephone, game machine, or the like.

As a method for electrically detecting a capacitance value C of a capacitance element, a method using a C/V converter circuit for converting the capacitance value C into a voltage value V and a method using a C/f converter circuit for converting a capacitance value C into a frequency f have been generally known. However, general C/V converter circuits and C/f converter circuits have oscillation circuits inside, so that power consumption during operation is relatively great. Therefore, if conventional force detectors using such capacitance elements are installed into various electronic apparatuses, power consumption increases as a whole. Particularly, a design in which battery consumption is reduced as long as possible has been demanded for electronic apparatuses such as a portable telephone, game machine, or the like which are operated by built-in batteries. Therefore, a force detector using a capacitance element is disadvantageous in terms of power consumption although it is advantageous in terms of manufacturing costs.

Of course, a measure for reducing the entire power consumption by intermittently operating a C/V converter circuit or C/f converter circuit with great power consumption can be taken. For example, if an intermittent operation with 200 msec periods is carried out in which the circuit is operated for 20 msec and then stopped for the next 180 msec, five measurements per second are possible while the power consumption is reduced to be one tenth. However, even by taking this measure, wasteful power consumption cannot be completely suppressed. Considering the actual use pattern of a portable telephone or the like, the period of input operation for cursor movements or the like is very short, so that operation of circuits with great power consumption while an operator does not carry out operational inputs at all is not efficient.

Also, in Japanese Patent Application No. 2000-132012, a force detector using a variable resistance element is proposed. In this detector, a variable resistance element whose resistance value changes in accordance with applied pressures is used, and externally applied forces can be detected by detecting changes in resistance value of this variable resistance element.

In this force detector using the variable resistance element, to obtain a detection value of an applied force, a measurement of electric resistance of a resistor is essential. However, to measure the electric resistance of the resistor, it is necessary to make a current flow in the resistor, and some degree of power consumption is inevitable during the measurement. Therefore, if the abovementioned force detector using the variable resistance element is installed into various electronic apparatuses, power consumption increases as a whole.

SUMMARY OF THE INVENTION

The object of the invention is, therefore, to provide a force detector using capacitance elements or variable resistance elements wherein power consumption can be efficiently suppressed.

(1) The first feature of the present invention resides in a force detector having a function for detecting a strength of an applied external force, comprising:

a substrate;

an elastic deformable body which is disposed at a position opposed to the substrate, at least a portion of the elastic deformable body being made of material having elastic deformability, and the elastic deformable body displacing with respect to the substrate due to an elastic deformation caused by the applied external force;

a force detecting element disposed between the substrate and the elastic deformable body and changes in a predetermined electrical characteristic due to a displacement of the elastic deformable body;

a switching element including a pair of contacting electrodes and carrying out a switching function so that an electrical insulated condition is normally maintained between the pair of contacting electrodes, and when an external force with more than a predetermined strength is applied to the elastic deformable body, an electrical conductive condition is obtained between the pair of contacting electrodes in response to a deformation of the elastic deformable body; and a detection circuit for detecting a change in the electrical characteristic of the force detecting element as an electric signal;

wherein the detection circuit selectively operates in two modes of a detection mode and a standby mode, the detection circuit performing a detecting function for outputting a change in the electrical characteristic as an electric signal when the detection circuit operates in the detection mode, the detection circuit maintaining a standby condition waiting for a transition to the detection mode without performing the detecting function when the detection circuit operates in the standby mode, a power consumption in the standby mode being less than a power consumption in the detection mode; and wherein the standby mode is selected when an electrical condition between the pair of contacting electrodes is an insulated condition, and the detection mode is selected when an electrical condition between the pair of contacting electrodes is a conductive condition.

(2) The second feature of the present invention resides in a force detector having the first feature:

wherein the pair of contacting electrodes included in the switching element are comprised of a contacting fixed electrode disposed on the substrate and a contacting displacing electrode disposed on the elastic deformable body, and when an external force with more than the predetermined strength is applied to the elastic deformable body, due to a deformation of the elastic deformable body, the contacting displacing electrode comes into physical contact with the contacting fixed electrode.

(3) The third feature of the present invention resides in a force detector having the first feature:

wherein the switching element includes a pair of contacting electrodes disposed on the substrate and a mediating electrode which simultaneously comes into contact with both of the pair of contacting electrodes to make an electrical conductive condition between the pair of contacting electrodes, and the mediating electrode is disposed so that the mediating electrode is normally maintained to be contacted with neither of the pair of contacting electrodes, or contacted with either one of the pair of contacting electrodes, and when an external force with more than the predetermined strength is applied to the elastic deformable body, due to a deformation of the elastic deformable body, the mediating electrode simultaneously comes into contact with both of the pair of contacting electrodes.

(4) The fourth feature of the present invention resides in a force detector having the third feature:

wherein the mediating electrode is formed at a position at which a deformation of the elastic deformable body occurs.

(5) The fifth feature of the present invention resides in a force detector having the fourth feature:

wherein the pair of contacting electrodes are comprised of a first ring-shaped electrode and a second ring-shaped electrode disposed adjacent to and outside the first electrode, and the mediating electrode is disposed at a position so as to be able to be simultaneously contacted with both the first ring-shaped electrode and the second ring-shaped electrode at any position.

(6) The sixth feature of the present invention resides in a force detector having the fourth feature:

wherein the pair of contacting electrodes are comprised of a plural number N of electrodes belonging to a first group and a plural number N of electrodes belonging to a second group which are arranged on the substrate so that the i-th electrode ($1 \leq i \leq N$) belonging to the first group and the i-th electrode belonging to the second group are adjacent to each other, a pair of contacting electrodes are formed of an electrode belonging to the first group and an electrode belonging to the second group which are adjacent to each other, and a total of N pairs of contacting electrodes are provided.

(7) The seventh feature of the present invention resides in a force detector having the sixth feature:

wherein electrodes belonging to the first group and electrodes belonging to the second group are alternately disposed along a circumference defined on the substrate, and the mediating electrode is disposed along a circumference on the elastic deformable body opposed to the circumference defined on the substrate.

(8) The eighth feature of the present invention resides in a force detector having the third feature:

wherein a domed structure is provided and disposed turned down in a vicinity of the pair of contacting electrodes on the substrate, the domed structure having a property whereby a vicinity of an apex elastically deforms to be convexed downward when a downward pressing force with more than predetermined strength is applied to a vicinity of the apex, and having a conductive contacting surface which is used as a mediating electrode so that, when an external force with more than the predetermined strength is applied to the elastic deformable body, a shape of the domed structure is inverted due to a deformation of the elastic deformable body, and the conductive contacting surface simultaneously comes into contact with both of the pair of contacting electrodes.

(9) The ninth feature of the present invention resides in a force detector having the eighth feature:

wherein the mediating electrode is comprised of a conductive contacting surface which extends from a lower surface part of an apex of the domed structure to a bottom circumferential part of the domed structure, a first electrode among the pair of contacting electrodes being disposed at a position to be contacted with the bottom circumferential part of the domed structure, a second electrode among the pair of contacting electrodes being disposed at a center of the domed structure, and the mediating electrode normally maintains a contacted condition with only the first electrode, and simultaneously comes into contact with both of the first electrode and the second electrode due to a shape inversion of the domed structure when an external force with more than the predetermined strength is applied to the elastic deformable body.

(10) The tenth feature of the present invention resides in a force detector having the eighth feature:

wherein the pair of contacting electrodes are disposed in a region surrounded by a bottom circumferential surface of the domed structure, the mediating electrode comprised of a conductive contacting surface formed on a lower surface of an apex of the domed structure normally maintains non-contact condition to be contacted with neither of the pair of contacting electrodes, and when an external force with more than the predetermined strength is applied to the elastic deformable body, the mediating electrode simultaneously comes into contact with both of the pair of contacting electrodes due to a deformation of the elastic deformable body.

(11) The eleventh feature of the present invention resides in a force detector having one of the first to the tenth features:

wherein a capacitance element is used as a force detecting element, and the detection circuit detects a capacitance value of the capacitance element as an electric signal, the capacitance element comprising a detecting fixed electrode provided on the substrate and a detecting displacing electrode provided at a position on the elastic deformable body which is opposed to the detecting fixed electrode and at which a displacement occurs.

(12) The twelfth feature of the present invention resides in a force detector having the third feature:

wherein a capacitance element is used as a force detecting element, and the detection circuit detects a capacitance value of the capacitance element as an electric signal, the capacitance element comprising a detecting fixed electrode provided on the substrate and a detecting displacing electrode provided at a position on the elastic deformable body which is opposed to the detecting fixed electrode and at which a displacement occurs, the mediating electrode and the detecting displacing electrode being electrically connected, and the detection circuit has a function for detecting a capacitance value between a contacting electrode which is contacted with the mediating electrode and the detecting fixed electrode as a capacitance value of the capacitance element in the detection mode.

(13) The thirteenth feature of the present invention resides in a force detector having the third feature:

wherein a capacitance element is used as a force detecting element, and the detection circuit detects a capacitance value of the capacitance element as an electric signal, the capacitance element comprising a detecting fixed electrode provided on the substrate and a detecting displacing electrode provided at a position on the elastic deformable body which is opposed to the detecting fixed electrode and at which a displacement occurs, a domed structure is provided and disposed turned down in a vicinity of the pair of contacting electrodes on the substrate, the domed structure having a property whereby a vicinity of an apex elastically deforms to be convexed downward when a downward pressing force with more than predetermined strength is applied to a vicinity of the apex, and having a conductive contacting surface which is used as a mediating electrode so that, when an external force with more than the predetermined strength is applied to the elastic deformable body, a shape of the domed structure is inverted due to a deformation of the elastic deformable body, and the conductive contacting surface simultaneously comes into contact with both of the pair of contacting electrodes, and at least an upper surface and a lower surface of a vicinity part of an apex of the domed structure are comprised of a conductive material and are electrically connected with each other, a mediating conductive layer electrically connected to the detecting displacing electrode is formed at a portion of the elastic deformable body to be contacted with a vicinity part of the apex of the domed structure, and the detection circuit has a function for detecting a capacitance value between one of the pair of contacting electrodes which is electrically contacted with the mediating conductive layer via the domed structure and the detecting fixed electrode as a capacitance value of the capacitance element in the detection mode.

(14) The fourteenth feature of the present invention resides in a force detector having one of the eleventh to the thirteenth features:

wherein on a surface of at least either one of the detecting fixed electrode and the detecting displacing electrode, an insulating film is formed to prevent an electrical contact between the detecting fixed electrode and the detecting displacing electrode.

(15) The fifteenth feature of the present invention resides in a force detector having one of the eleventh to the fourteenth features:

wherein the detection circuit has a C/V converter circuit for converting a capacitance value C of the capacitance element into a voltage value V, and a control is carried out so that the C/V converter circuit is operated in the detection mode and is not operated in the standby mode.

(16) The sixteenth feature of the present invention resides in a force detector having the fifteenth feature:

wherein the C/V converter circuit comprises an oscillation circuit for supplying an AC signal to one of the electrodes comprising the capacitance element, and a switching circuit which causes the oscillation circuit to oscillate in the detection mode, and stop an oscillation of the oscillation circuit in the standby mode.

(17) The seventeenth feature of the present invention resides in a force detector having one of the eleventh to the fourteenth features:

wherein the detection circuit has a C/f converter circuit for converting a capacitance value C of the capacitance element into a frequency f, and control is carried out so that the C/f converter circuit is operated in the detection mode and is not operated in the standby mode.

(18) The eighteenth feature of the present invention resides in a force detector having one of the eleventh to the seventeenth features:

wherein the detecting displacing electrode is comprised of a conductive coating layer applied on a surface of an integrally molded rubber.

(19) The nineteenth feature of the present invention resides in a force detector having one of the first to the tenth features:

wherein a variable resistance element with a property by which a resistance value between two predetermined points changes depending on an applied pressure is used as a force detecting element, and the detection circuit detects a resistance value between the two points of the variable resistance element as an electric signal.

(20) The twentieth feature of the present invention resides in a force detector having the nineteenth feature:

wherein a variable resistance element has a first resistor and a second resistor disposed at a position opposed to the first resistor, and a surface of at least one resistor of the first and second resistors, which is opposed to the other resistor, has an uneven structure to elastically deform, and a contact surface area between the first resistor and the second resistor changes in accordance with a pressure applied in response to an applied external force which is a detecting subject so that a resistance value between a predetermined point connected to the first resistor and a predetermined point connected to the second resistor changes in accordance with changes in the contact surface area.

(21) The twenty-first feature of the present invention resides in a force detector having the twentieth feature:

wherein the first resistor and the second resistor are formed from a sensitive conductive ink.

(22) The twenty-second feature of the present invention resides in a force detector having the twentieth or the twenty-first feature:

wherein the detection circuit has a circuit for detecting a resistance value between the two points of the resistors by applying a voltage between the two points, and control is carried out so that the voltage is applied in the detection mode and is not applied in the standby mode.

(23) The twenty-third feature of the present invention resides in a force detector having the twenty-second feature:

wherein an electrical conductive/insulated condition between the pair of contacting electrodes comprising a switching element is used as an ON/OFF switch to apply a voltage to the two points of the resistors.

(24) The twenty-fourth feature of the present invention resides in a force detector having one of the first to the twenty-third features:

wherein an operation panel made of a rigid material is attached to the elastic deformable body, and the elastic deformable body deforms based on an operational input applied to the operation panel.

(25) The twenty-fifth feature of the present invention resides in a force detector having one of the first to the twenty-fourth features:

wherein the elastic deformable body comprises a film portion disposed almost in parallel to an upper surface of the substrate, a side wall portion for fixing a surrounding of the film portion to the upper surface of the substrate, and columnar projections extending downward from a plurality of positions of a lower surface of the film portion, at least a part of the film portion and the columnar projections being made of elastic material.

(26) The twenty-sixth feature of the present invention resides in a force detector having the twenty-fifth feature:

wherein the elastic deformable body is made of an integrally-molded rubber.

(27) The twenty-seventh feature of the present invention resides in an input device for an electronic apparatus for applying operational input indicating an operation amount in a predetermined direction to the electronic apparatus which executes particular processing based on a predetermined program, wherein the input device comprises a force detector having one of the first to the twenty-sixth features, and handles an external force detected by the force detector as an operation amount.

BRIEF DESCRIPTION OF THE DRAWINGS

FIG. 8 is a top view of domed structure 30 shown in FIG. 1, a side section along the center of which is shown in FIG. 1;

FIG. 9A and FIG. 9B are side sectional views for explaining shape inverting operation of the domed structure 30 shown in FIG. 1;

FIG. 10 is a top view of substrate 40, a side section along the center (XZ plane) of which is shown in FIG. 1;

FIG. 22 is a top view of substrate 40A to be used as an input device for an electronic apparatus which has only a one-dimensional operational input function;

FIG. 25 is an exploded side sectional view of an input device for an electronic apparatus using a plurality of domed structures;

FIG. 26 is a bottom view of elastic deformable body 20D, a side section along the center of which is shown in FIG. 25;

FIG. 27 is a bottom view showing displacing conductive layer 26 formed on the lower surface of the elastic deformable body 20D shown in FIG. 26;

DESCRIPTION OF THE PREFERRED EMBODIMENTS

Hereinafter, the invention is explained based on illustrated embodiments. A force detector relating to the invention can be installed in various apparatuses and industrially used. Herein, an example is described in which a force detector relating to the invention is used as an input device for an electronic apparatus such as a portable telephone, game machine, or the like.

Section 1

BASIC STRUCTURE OF INPUT DEVICE FOR AN ELECTRONIC APPARATUS RELATING TO THE INVENTION

Figure 1:
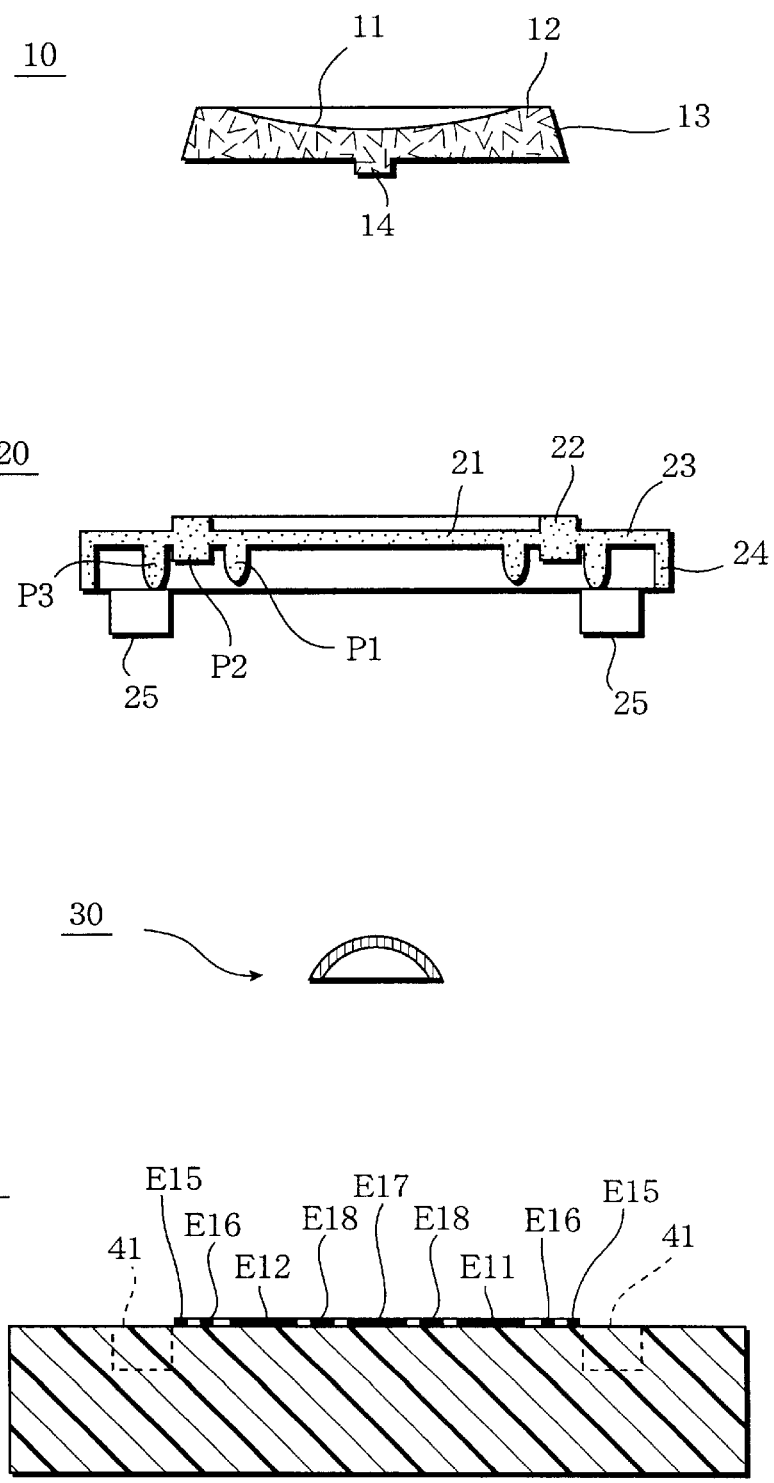
FIG. 1 is an exploded side sectional view of an input device for an electronic apparatus relating to a basic embodiment of the invention.

First, the basic structure of an input device for an electronic apparatus relating to a basic embodiment of the invention is explained. FIG. 1 is an exploded side sectional view showing components by breaking down this input device for an electronic apparatus. As illustrated, this input device for an electronic apparatus is comprised of operation panel 10, elastic deformable body 20, domed structure 30, and substrate 40. In actuality, this input device is constructed so that the domed structure 30 is disposed on the substrate 40 and covered by the elastic deformable body 20, and furthermore the operation panel 10 is attached thereon. This input device is suitable for use as an input device for an electronic apparatus such as a portable telephone, game machine, or the like which executes predetermined processing based on predetermined programs, which can carry out a switching input indicating ON/OFF condition and an operational input indicating an operation amount in a predetermined direction.

The operation panel 10 is disposed on the upper surface of the elastic deformable body 20, and has a function for transmitting a force applied in response to an operator's action to the elastic deformable body 20 and elastically deforming the elastic deformable body 20. If this input device is regarded as a force detector, an operational input into the operation panel 10 by the operator is equivalent to an external force to be detected by this force detector. Therefore, the operation panel 10 performs a function as an operating body for causing a part of the elastic deformable body 20 to elastically deform with respect to the substrate 40 based on the action of this external force.

Figure 2:
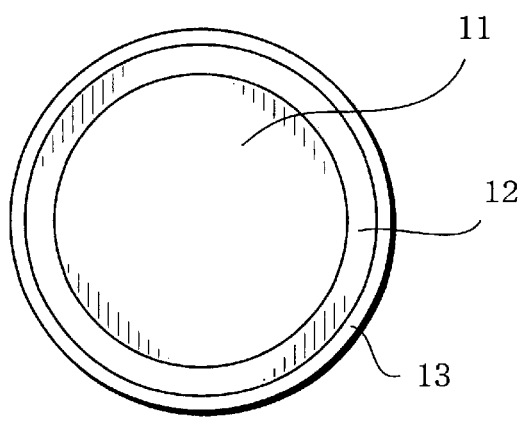
FIG. 2 is a top view of operation panel 10, a side section along the center of which is shown in FIG. 1.
Figure 3:
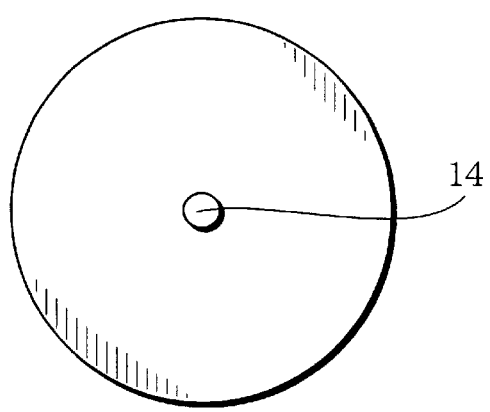
FIG. 3 is a bottom view of the operation panel 10, a side section along the center of which is shown in FIG. 1.

FIG. 2 is a top view of this operation panel 10, and FIG. 3 is a bottom view of this operation panel 10. As illustrated, the operation panel 10 has a disk shape as a whole, and in this embodiment, formed from a resin such as plastic. As mentioned above, the form of the operation panel 10 does not come into question if it can perform the function for transmitting a force to the elastic deformable body 20, however, a disk shape is suitable for inputting various directional operation amounts. To securely transmit the operator's operation to the elastic deformable body 20, it is preferable that the panel is formed from a rigid material such as a resin or metal. In the case of the illustrated embodiment, as shown in FIG. 2, the operation panel 10 is comprised of three portions including operating portion 11, bank portion 12, and outer circumferential portion 13, and from the lower surface thereof, columnar pressing rod 14 projects as shown in FIG. 3. The operating portion 11 is a smooth depressed portion formed inside the bank portion 12 so as to fit the operator's finger, and the outer circumferential portion 13 is a tapered portion formed outside the bank portion 12. The pressing rod 14 is for effectively carrying out switching inputs indicating ON/OFF conditions as described later, and performs a function for effectively transmitting a vertical downward force from the operator to the apex of the domed structure 30.

In the case of this embodiment, the elastic deformable body 20 is formed of an integrally molded silicon rubber.

Figure 4:
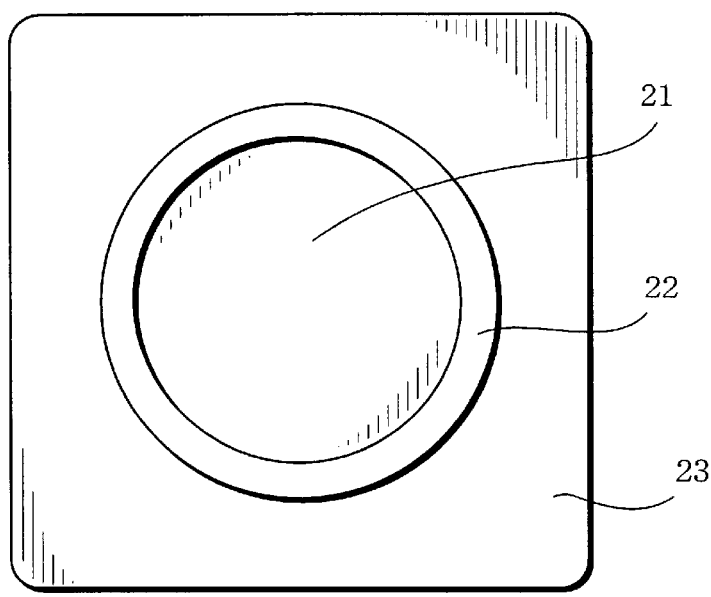
FIG. 4 is a top view of elastic deformable body 20, a side section along the center of which is shown in FIG. 1.
Figure 5:
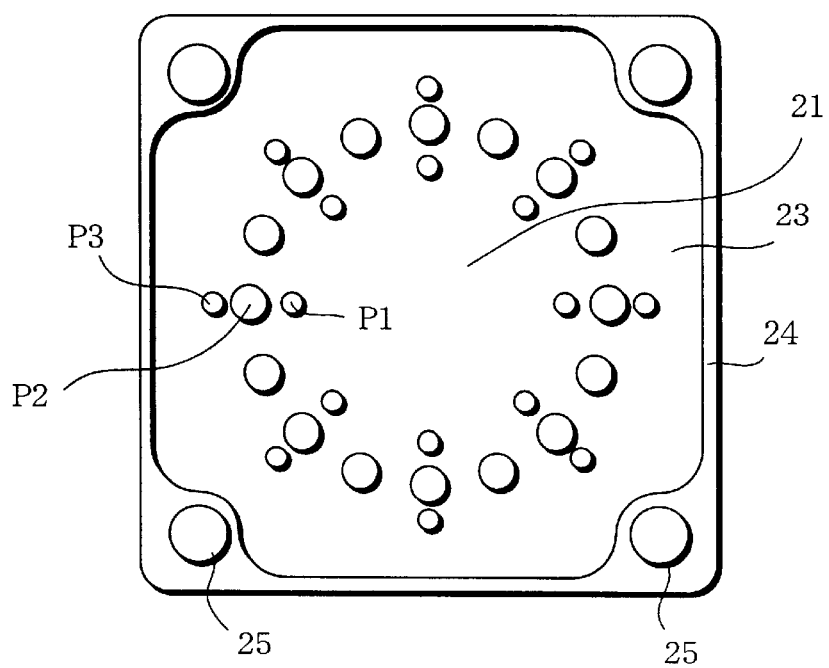
FIG. 5 is a bottom view of the elastic deformable body 20, a side section along the center of which is shown in FIG. 1.

FIG. 4 is a top view of this elastic deformable body 20, and FIG. 5 is a bottom view of the same. As illustrated, this elastic deformable body 20 has almost a square shape in a plan view. The basic components thereof are, as shown in the side sectional view of FIG. 1, inner film portion 21, ring-shaped protruding portion 22, outer film portion 23, side wall portion 24, fixed leg portion 25, and columnar projections P1 through P3. As shown in FIG. 4, the inner film portion 21 and outer film portion 23 are film-shaped structures forming the whole square upper surface of this elastic deformable body 20. Herein, for description convenience, the portion inside the ring-shaped protruding portion 22 is referred to as inner film portion 21, and the outside portion is referred to as outer film portion 23. The film portions 21 and 23 are disposed almost in parallel on the upper surface of the substrate 40 while sandwiching the domed structure 30. The ring-shaped protruding portion 22 is formed on the upper surface of the film portion, and the circumference of the upper surface of the inner film portion 21 is surrounded by this ring-shaped protruding portion 22. In this embodiment, the ring-shaped protruding portion 22 is a so-called washer-shaped structure with a rectangular section, which is for efficiently receiving a force from the operation panel 10 disposed thereon.

On the other hand, the side wall portion 24 performs a function for fixing the circumference of the outer film portion 23 onto the upper surface of the substrate 40. The film portions 21 and 23 which have a shape of a square are supported at four sides by the side wall portion 24 and maintained in a condition almost in parallel to the upper surface of the substrate 40. As shown in the bottom view of FIG. 5, at the four corners of the lower surface of the elastic deformable body 20, columnar fixed leg portions 25 extend downward, respectively. These four fixed leg portions 25 are inserted into fixing holes 41 (see FIG. 1) formed at four positions of the upper surface of the substrate 40. Thus, the elastic deformable body 20 is fixed at a predetermined position on the substrate 40.

Figure 6:
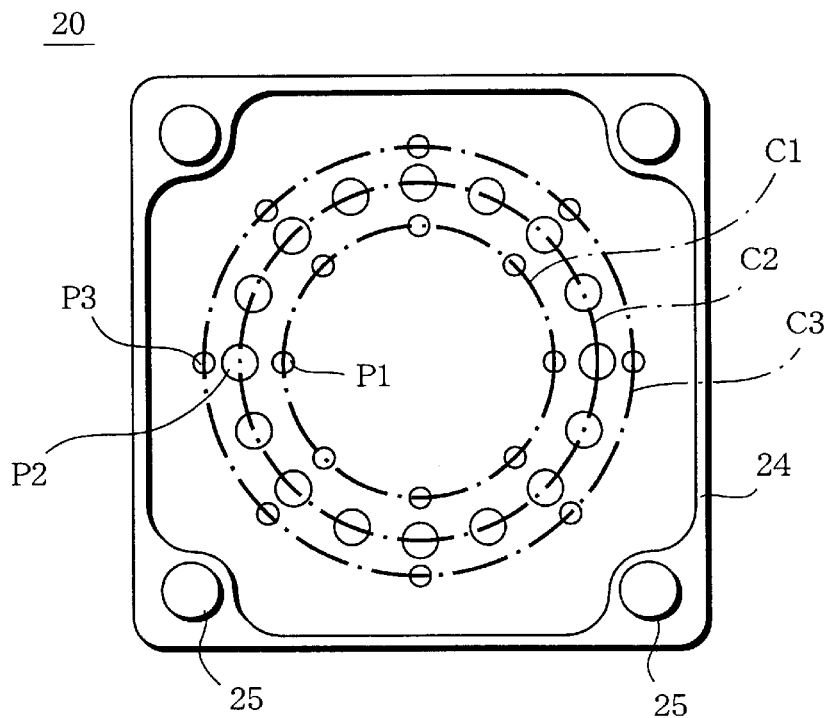
FIG. 6 is a bottom view for explaining disposition of each columnar projection formed on the lower surface of the elastic deformable body 20 of FIG. 5.

As shown in FIG. 5, on the lower surfaces of the film portions 21 and 23, a number of columnar projections P1 through P3 extending downward are formed. FIG. 6 clearly shows the positions of the columnar projections P1 through P3 by adding concentric circles drawn by alternate long and short dashed lines to the bottom view of FIG. 5. As illustrated, if three concentric circles C1, C2, and C3 are defined around the central point of the elastic deformable body 20, it is understood that each of the columnar projections P1 through P3 is disposed along the circumference of any of the concentric circles. That is, a total of eight columnar projections P1 are disposed every 45° angle of circumference along the circumference of the inside concentric circle C1, a total of sixteen columnar projections P2 are disposed every 22.5° angle of circumference along the circumference of the reference concentric circle C2, and a total of eight columnar projections P3 are disposed every 45° angle of circumference along the circumference of the outside concentric circle C3.

The side surface shapes of the columnar projections P1 through p3 are clearly shown in the side sectional view of FIG. 1. To avoid complication, in the side sectional view of FIG. 1, only the portions of the columnar projections P1 through P3 which are positioned at the section are described, however, in actuality, as shown in the bottom views of FIG. 5 and FIG. 6, more columnar projections extend downward from the lower surface of the film portion. Herein, as shown in FIG. 1, the lengths of the columnar projections P2 are set to be shorter than that of the columnar projections P1 and P3, and this is because the columnar projections P1 and P3 and the columnar projections P2 have main functions that are different from each other. That is, the main function of the columnar projections P1 and P3 is for supporting the inner film portion 21 and outer film portion 23 onto the upper surface of the substrate 40 in a condition where no inputs are made from an operator. The lengths of the columnar projections P1 and P3 are set to be suitable for the projections to perform the supporting function. In the illustrated example, the lengths of the columnar projections P1 are slightly shorter than that of the columnar projections P3, and this is because the thickness of electrodes formed on the substrate 40 are taken into consideration. Focusing on this function, the columnar projections P1 and P3 are referred to as supporting columnar projections herein.

Meanwhile, the main function of the columnar projections P2 is, as described later, by coming into contact with electrodes formed on the upper surface of the substrate 40, for aiding a function as a mediating electrode to cause a change into an electrical conductive condition. Therefore, the columnar projections P2 are referred to as columnar projections for electrodes herein. A setting of the lengths of the columnar projections P2 for electrodes to be shorter than that of the supporting columnar projections P1 and P3 is so that the lower ends of the columnar projections P2 for electrodes are suspended so as to be in a physically non-contacted condition with the electrodes formed on the upper surface of the substrate 40 when no inputs are applied to the operation panel 10 from an operator.

The supporting columnar projections P1 and P3 and the columnar projections P2 for electrodes are different from each other in not only length but also in the side surface shape. That is, the supporting columnar projections P1 and P3 are slightly rounded at the lower ends, while the columnar projections P2 for electrodes are disk-shaped projections with plane lower ends. This shape difference is also based on the abovementioned difference in function, and the lower ends of the supporting columnar projections P1 and P3 are shaped to be suitable for supporting by coming into contact with the upper surface of the substrate 40, while the lower ends of the columnar projections P2 for electrodes are shaped to be suitable for securing an electric conductive condition by coming into contact with the electrodes formed on the upper surface of the substrate 40.

As the embodiment described herein, in a case where the operation panel 10 is comprised of a disk-shaped rigid member, it is considered that a force applied from an operator is transmitted along the concentric circles around the center axis of the operation panel 10, so that it is preferable that the columnar projections P1 through P3 are also disposed along predetermined circumferences. Particularly, in the case of the illustrated embodiment, if an operational input indicating a predetermined direction is inputted to the operation panel 10, the applied force is transmitted from the periphery of the operation panel 10 to the ring-shaped protruding portion 22. Herein, the reference concentric circle C2 shown in FIG. 6 is defined as a circle corresponding to the center position of the ring-shaped protruding portion 22, and the columnar projections P2 for electrodes are disposed at predetermined positions (sixteen positions) immediately under the ring-shaped protruding portion 22. Furthermore, inside concentric circle C1 is defined to be inside the reference concentric circle C2, the supporting columnar projections P1 are disposed along the circumference of the concentric circle C1, the outside concentric circle C3 is defined to be outside the reference concentric circle C2, and the supporting columnar projections P3 are disposed along the circumference of the concentric circle C3.

In some electronic apparatuses, there are many cases where an operational input for a total of eight directions including diagonal directions in addition to the four upward, downward, rightward, and leftward directions is required. Therefore, assuming such an operational input for eight directions, it is preferable that the columnar projections disposed along the circumferences are comprised of at least eight columnar projections disposed every 45° angle of circumference. In the illustrated embodiment, a total of eight supporting columnar projections are provided for each of P1 and P3 every 45° angle of circumference on the inside concentric circle C1 and outside concentric circle C3, meanwhile, in order to obtain secure contact to the electrodes of the substrate 40 side, the number of columnar projections P2 for electrodes to be disposed on the reference concentric circle C2 is further increased to a total of sixteen disposed every 22.5° angle of circumference.

Figure 7:
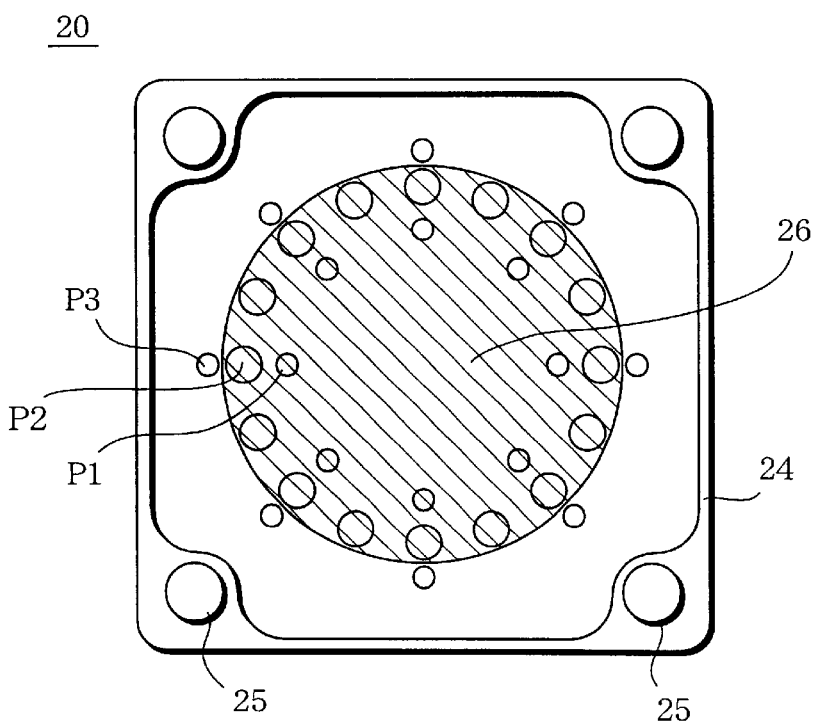
FIG. 7 is a bottom view showing a displacing conductive layer 26 formed on the lower surface of the elastic deformable body 20 of FIG. 5.

As a component of this elastic deformable body 20, one more important component is a displacing conductive layer 26 formed in a predetermined region of the lower surface of the film portion. FIG. 7 is a bottom view of the elastic deformable body 20 to show the formation region of this displacing conductive layer 26. In this figure, in a circular region shown by applying hatching, the displacing conductive layer 26 is formed (the hatching in FIG. 7 does not show the section but shows the region). As mentioned above, a number of columnar projections are formed on the lower surface of the elastic deformable body 20, and this displacing conductive layer 26 is formed on the lower surface of the elastic deformable body 20 including the surfaces of these columnar projections. Therefore, this means that the displacing conductive layer 26 is also formed on the surfaces of the supporting columnar projections P1 and columnar projections P2 for electrodes that are positioned in the hatched region. Concretely, this displacing conductive layer 26 can be formed of a layer made from a conductive material applied on the lower surface of the elastic deformable body 20. As mentioned above, in this embodiment, since the elastic deformable body 20 is formed of an integrally molded silicon rubber. After the illustrated structure including the columnar projections is integrally molded from silicon rubber, a conductive coating is applied on a part of the lower surface of the structure (the circled region with hatching applied in FIG. 7) and dried, whereby the displacing conductive layer 26 can be formed. The thickness of this displacing conductive layer 26 is smaller than that of each portion of the elastic deformable body 20, so that the displacing conductive layer 26 is not shown in a side sectional view.

On the other hand, the domed structure 30 has a shape of a turned-down cup as shown in the side sectional view of FIG. 1, which is disposed in the vicinity of the center of the upper surface of the substrate 40 so as to be turned down. FIG. 8 is a top view of this domed structure 30. The form of the domed structure is not especially limited, however, the use of the domed structure 30 whose plane shape is circular shown in the figure is preferable since this makes operational inputs in various directions smooth. The domed structure 30 has a property of elastic deforming in the vicinity of the apex and inverting the shape to be convexed downward when a downward pressing force with a predetermined strength or more is applied to the apex. FIG. 9A and FIG. 9B are side sectional views showing such a shape-inverted condition. FIG. 9A shows a condition where no external forces are applied, and FIG. 9B shows a condition where a downward pressing force F is applied to the apex, and the apex is elastically deformed and inverted to be convexed downward. Needless to say, this shape inversion is elastic deformation, so that if the pressing force F is eliminated, the domed structure 30 restores to its original condition shown in FIG. 9A.

The shape inversion of this domed structure 30 is used for switching inputs by an operator. Therefore, at least the lower surface of the domed structure 30 must comprise a conductive contact surface 31. That is, as shown in FIG. 9B, when the shape of the vicinity of the apex is inverted, a switching input is detected by means of contact between the conductive contact surface 31 and the electrodes provided on the substrate 40. In this embodiment, a metal dome is used as the domed structure 30. Generally, when a domed structure is formed from a metal material, the above-mentioned shape inversion occurs, and a dome having the conductive contact surface 31 can be realized, however, it is not always necessary that the domed structure 30 is made from a metal. For example, a domed structure is formed from a resin, and a conductive material film is formed on the lower surface thereof, whereby the conductive contact surface 31 may be realized.

Next, the construction of the substrate 40 is explained. The basic functions of the substrate 40 are a function for placing the above-mentioned components thereon and supporting them and a function for providing a reference surface for formation of the electrodes. FIG. 10 shows a top view of the substrate 40. Four fixing holes 41 shown in the figure are made in the upper surface of the substrate 40 for insertion of the fixed leg portions 25 of the elastic deformable body 20 as mentioned above.

On the upper surface of the substrate 40, the illustrated electrodes E11 through E18 are formed. Herein, based on the positions at which the electrodes are disposed, four fan-shaped electrodes E11 through E14 are referred to as intermediate electrodes, two ring-shaped electrodes E15 and E16 disposed outside the intermediate electrodes are referred to as outside electrodes, and round electrode E17 and ring-shaped electrode E18 disposed inside are referred to as inside electrodes. In FIG. 10, to clearly show the shapes of the electrodes, hatching is applied to each electrode. Therefore, the hatching does not show sectional views in FIG. 10. In the figure, two hatching patterns are used, and this shows that a part of the surfaces of the electrodes is covered by an insulating film. Concretely, since four intermediate electrodes E11 through E14 function as detecting fixed electrodes for comprising capacitance elements, the surfaces thereof are covered by insulating films. However, since the outside electrodes E15 and E16 and the inside electrodes E17 and E18 function as contacting electrodes for judging electrical contact conditions, the conductive surfaces are left to be exposed. The two hatching patterns show the distinction between the electrodes covered by insulating films and the electrodes with exposed conductive surfaces.

The ring-shaped outside electrode E15 located at the extreme outside is formed at the outer circumferential opposing portion (a portion of the substrate 40 upper surface at which the outside contour line of the operation panel 10 is projected on the substrate) opposed to the outer circumference of the operation panel 10. In the case of this embodiment, since the operation panel 10 has a disk shape, the outer circumferential opposing portion opposed to the outer circumferential circle is also circular, and as illustrated, the outside electrode E15 is a ring-shaped (washer-shaped) electrode disposed at a position opposed to the outer circumferential circle of the operation panel 10.

The outside electrode E16 is a ring-shaped (washer-shaped) electrode disposed slightly inside the outside electrode E15. More accurately explaining the positions, the boundary between the outside electrode E15 and outside electrode E16 is positioned along the circumference opposed to the reference concentric circle C2 shown in FIG. 6, and the distance between the outside contour of the outside electrode E15 and the inside contour of the outside electrode E16 is designed so as to be almost equal to the diameter of the columnar projections P2 for electrodes. Therefore, the two outside electrodes E15 and E16 are regarded as being disposed immediately under the columnar projections P2 for electrodes.

The role of the outside electrodes E15 and E16 is to detect an operational input with a predetermined or a more strength in a predetermined direction by coming into contact with the displacing conductive layer 26 formed on the lower surface of the columnar projections P2 for electrodes when the input is applied to the operation panel 10 by an operator and the elastic deformable body 20 deforms. That is, when the elastic deformable body 20 deforms in response to an operational input by an operator and the displacing conductive layer 26 formed on the lower surface of any one of columnar projections P2 for electrodes comes into contact with both outside electrodes E15 and E16, the outside electrodes E15 and E16 come into an electrical conductive condition via the contacted displacing conductive layer 26. Therefore, it can be recognized whether or not an operational input with a predetermined strength or more is inputted by electrically detecting the electrical condition between the outside electrodes E15 and E16. Based on this function, the outside electrodes E15 and E16 are referred to as a pair of contacting electrodes, and the displacing conductive layer 26 formed on the lower surface of the columnar projections P2 for electrodes is referred to as a mediating electrode. Accordingly, a switching element is comprised of the pair of contacting electrodes formed on the substrate 40 and the mediating electrode formed on the elastic deformable body 20. The pair of contacting electrodes comprising this switching element are normally (unless an operational input with a predetermined strength or more is applied to the operation panel 10) maintained to be in an electrically insulated condition, however, when an operational input with a predetermined strength or more is applied to the operation panel 10, the mediating electrode comes into contact at the same time by deformation of the elastic deformable body 20, whereby an electrical conductive condition is obtained.

The four fan-shaped intermediate electrodes E11 through E14 are disposed at positions suitable for detecting operational inputs with directivity applied by an operator. That is, in FIG. 10, when an origin O is taken at the upper surface center of the substrate 40, an X-axis is taken in the rightward direction in the figure, and a Y-axis is taken in the upward direction to define an XYZ three-dimensional coordinate system, the intermediate electrode E11 is formed in an X-axis positive region, the intermediate electrode E12 is formed in an X-axis negative region, the intermediate electrode E13 is formed in a Y-axis positive region, and the intermediate electrode E14 is formed in a Y-axis negative region. The role of these intermediate electrodes E11 and E14 is to provide capacitance elements together with the displacing conductive layer 26 positioned at the upper side. That is, as shown in FIG. 7 with hatching applied, the displacing conductive layer 26 is formed on the lower surface of the elastic deformable body 20 as a film, and a total of four capacitance elements are formed of the intermediate electrodes E11 through E14 and portions of the displacing conductive layer 26 opposed to the electrodes. Concretely, a first capacitance element C11 is formed of the intermediate electrode E11 disposed in an X-axis positive region and a portion of the displacing conductive layer 26 opposed to the electrode. A second capacitance element C12 is formed of the intermediate electrode E12 disposed in an X-axis negative region and a portion of the displacing conductive layer 26 opposed to the electrode. A third capacitance element C13 is formed of the intermediate electrode E13 disposed in a Y-axis positive region and a portion of the displacing conductive layer 26 opposed to the electrode. A fourth capacitance element C14 is formed of the intermediate electrode E14 disposed in a Y-axis negative region and a portion of the displacement conductive layer 26 opposed to the electrode.

The four capacitance elements C11 through C14 thus formed are comprised of the detecting fixed electrodes (that is, intermediate electrodes E11 through E14) which are fixed on the substrate 40 and the detecting displacing electrode (that is, displacing conductive layer 26) formed at a position of the elastic deformable body 20 opposed to the detecting fixed electrodes at which elastic deformation occurs. As mentioned above, the upper surfaces of the four intermediate electrodes E11 through E14 that serve as detecting fixed electrodes are covered by insulating films to obstruct electrical contact with the displacing conductive layer 26 which serves as a detecting displacing electrode. As described later, when an operational input is made, due to deformation of the elastic deformable body 20, the displacing conductive layer 26 reaches proximity to the substrate 40, however, since the insulating films have been formed, the displacing conductive layer 26 does not come into electrical contact with the intermediate electrodes E11 through E14. Therefore, the capacitance elements C11 through C14 always maintain the function as capacitance elements. In addition, the insulating films may be formed at the detecting displacing electrode side (that is, on the lower surface of the displacing conductive layer 26), not at the detecting fixed electrode side, or may be formed at both sides. However, in the case of this embodiment shown herein, since the displacing conductive layer 26 is formed as a conductive coating applied on the lower surface of the elastic deformable body 20, in practical use, it is preferable that the insulating film is formed at the detecting fixed electrode side, that is, the side of the intermediate electrodes E11 through E14.

Figure 11:
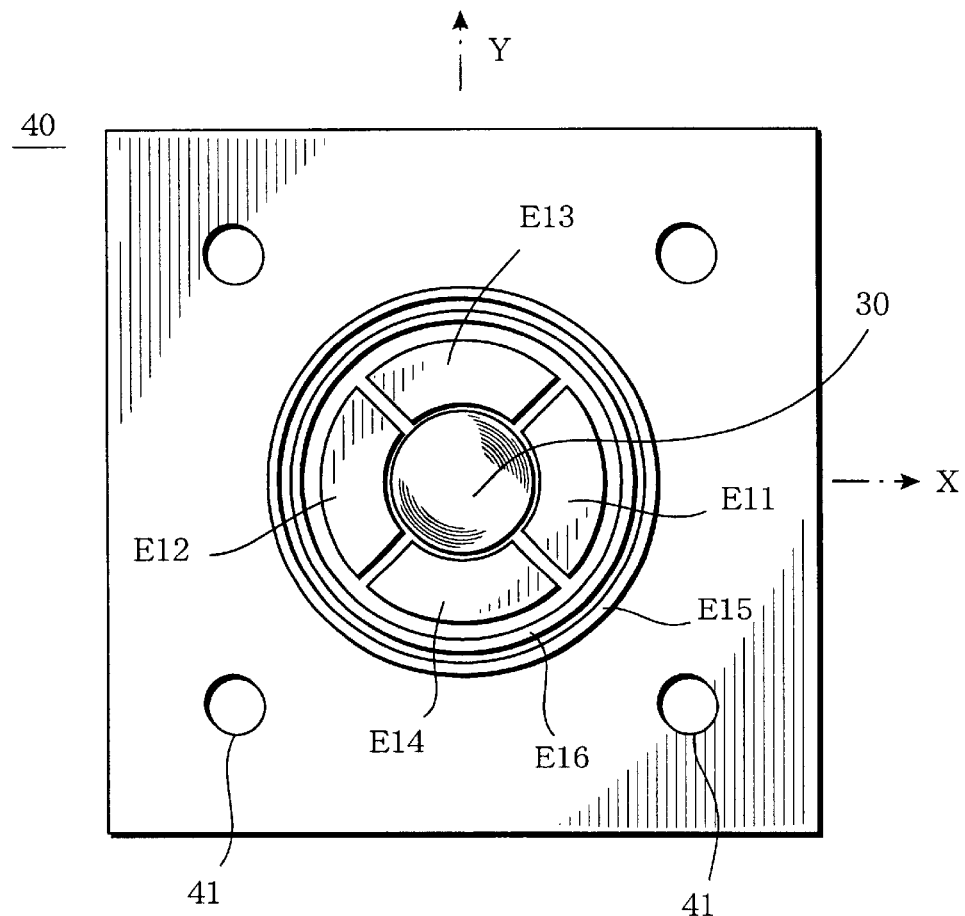
FIG. 11 is a top view showing a condition where the domed structure 30 is disposed on the substrate 40 of FIG. 10.

As shown in FIG. 10, further inside the intermediate electrodes E11 through E14, that is, in the vicinity of the center of the substrate 40, two inside electrodes E17 and E18 are provided. The role of the pair of inside electrodes E17 and E18 is to detect a switching input applied to the operation panel 10 by an operator, that is, a vertical downward pressing force. The inside electrode E17 is a disk-shaped electrode disposed at the center of the substrate, and the diameter thereof is set to be smaller than that of the circle composing the bottom circumferential surface (edge portion of the bottom) of the domed structure 30. On the other hand, the inside electrode E18 is a washer-shaped electrode, and the outer diameter thereof is set to be almost equal to the diameter of the circle composing the bottom circumferential surface of the domed structure 30, and the domed structure 30 is placed on this washer-shaped inside electrode E18. FIG. 11 is a top view showing the condition where the domed structure 30 of FIG. 8 is disposed at the center of the upper surface of the substrate 40 of FIG. 10. In actuality, the domed structure 30 is fixed onto the upper surface of the substrate 40 with an adhesive agent or adhesive tape.

As shown in FIG. 9B, when a vertical downward pressing force F is applied to the vicinity of the apex of the domed structure 30, the shape of the domed structure 30 is inverted. At this time, the inside electrode E17 has a shape suitable for contact with the conductive contact surface 31 on the lower surface of the domed structure 30. In this embodiment, since the entire domed structure 30 is formed from a metal, although the domed structure 30 comes into contact with only the washer-shaped inside electrode E18 in the condition shown in FIG. 9A, the vicinity of the inverted apex also comes into contact with the inside electrode E17 in the condition shown in FIG. 9B to perform a function for making an electrical contact between the pair of inside electrodes E17 and E18. That is, the inside electrodes E17 and E18 are formed of a pair of electrodes that are physically separated from each other, however, when the domed structure 30 made of metal is inverted, the bottom circumferential surface of this domed structure 30 keeps contact with the inside electrode E18, and the lower surface in the vicinity of the apex comes into contact with the inside electrode E17 and, therefore, the domed structure 30 made of conductive material simultaneously comes into contact with both inside electrodes E17 and E18. Thereby, both electrodes are electrically shorted. As a result, by electrically detecting the electrical condition between the pair of inside electrodes E17 and E18, the ON/OFF condition in accordance with a switching input by an operator can be detected. It is not always necessary that the entire domed structure 30 is formed from a conductive material, and if at least a portion from the inner surface (lower surface when being turned down) to the bottom circumferential surface forms a conductive contact surface, an electrical conductive condition between the inside electrodes E17 and E18 can be obtained.

As mentioned above, on the upper surface of the substrate 40, three types of electrodes, that is, a pair of outside electrodes E15 and E16 (contacting electrodes), four intermediate electrodes E11 through E14 (detecting fixed electrodes), and a pair of inside electrodes E17 and E18 (contacting electrodes) are formed. The electrodes are disposed as follows by considering the functions of each electrode. First, the inside electrode E18 is disposed at a position to be contacted with the bottom circumferential surface of the domed structure 30 as mentioned above, and the inside electrode E17 is disposed at a position to be contacted with the conductive contact surface 31 which is equivalent to the lower surface in the vicinity of the apex of the domed structure when the shape of the domed structure 30 is inverted. The pair of outside electrodes E15 and E16 are disposed at the outer circumferential opposing portions on the substrate 40 opposed to the outer circumferential portion of the operation panel 10 (portions opposed to the reference concentric circle C2 of FIG. 6). On the other hand, the intermediate electrodes E11 through E14 are disposed at predetermined positions in the intermediate region of the upper surface of the substrate 40 to be outside the disposition region of the domed structure 30 and inside the outer circumferential opposing portions. In this embodiment, the substrate 40 is comprised of a printed circuit board for mounting electronic circuits, and the electrodes are comprised of printed patterns of copper or the like formed on this printed circuit board. The substrate 40 comprised of a printed circuit board for electronic circuits is convenient for practical use, since various wiring can be laid on the substrate 40 by means of printed patterns.

The displacing conductive layer 26 shown in FIG. 7 with hatching applied is a single conductive layer formed on the lower surface of the elastic deformable body 20, which performs an important function by co-action with the electrodes on the above-mentioned substrate 40. That is, a portion of the displacing conductive layer 26 formed on the lower surfaces of the columnar projections P2 for electrodes simultaneously comes into contact with both of the pair of outside electrodes E15 and E16 on the substrate 40 to serve as a mediating electrode and perform a function for making an electrical contact between the pair of outside electrodes E15 and E16 (contacting electrodes). Meanwhile, a portion of the displacing conductive layer 26 opposed to the intermediate electrodes E11 through E14 serves as a detecting displacing electrode and performs a function for comprising capacitance elements together with the intermediate electrodes E11 through E14 (detecting fixed electrodes). Considering operational convenience described in Section 2, it is preferable that the mediating electrode and detecting displacing electrode are electrically continued although their functions are thus different from each other. Therefore, as shown in FIG. 7 with hatching applied, it is preferable for practical use that the displacing conductive layer 26 is physically comprised of a single conductive layer having outer extending portions at which the columnar projections P2 for electrodes are disposed, and a portion of this displacing conductive layer 26 (the portion formed on the lower surfaces of the columnar projections P2 for electrodes) is caused to serve as a mediating electrode, and the other portion (portion opposed to the intermediate electrodes E11 through E14) is caused to serve as a detecting displacing electrode.

Details of the structure of the components shown in FIG. 1 are explained above. An actual input device for an electronic apparatus is constructed by accumulating these components. That is, the domed structure 30 is placed at the center of the substrate 40, the elastic deformable body 20 is placed on the structure to cover it (the fixed leg portions 25 are inserted into the fixing hole portions 41 and fixed), and the operation panel 10 is adhered thereon, whereby the input device for an electronic apparatus as shown in the side sectional view of FIG. 12 (the domed structure 30 is not shown in a sectional view, but shown in a side view) is assembled.

Section 2

BASIC OPERATION OF THE INPUT DEVICE
FOR AN ELECTRONIC APPARATUS
RELATING TO THE INVENTION

Figure 12:
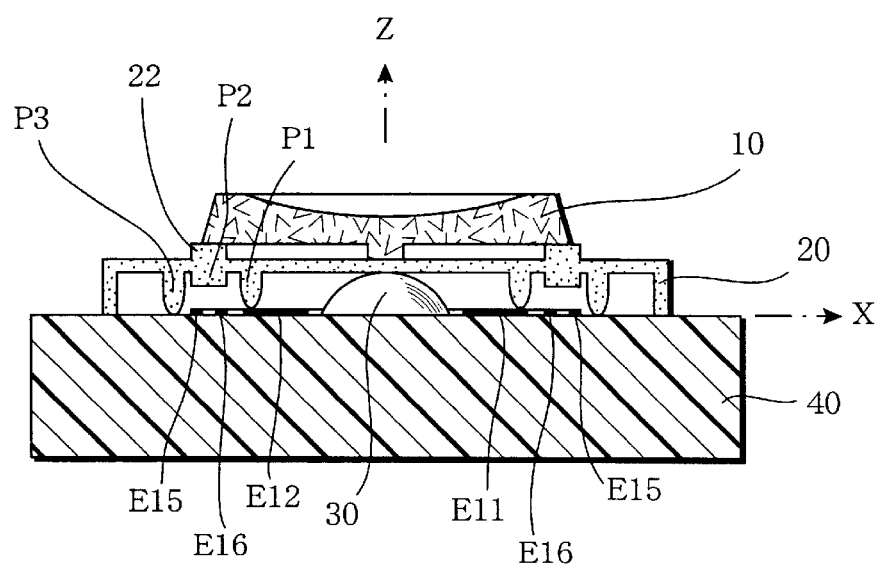
FIG. 12 is a side sectional view of an input device for an electronic apparatus constructed by assembling the components shown in FIG. 1, wherein the domed structure 30 is not shown in a sectional view, but shown in a side view, only sectional views of the columnar projections P1 through P3 are shown, and illustration of deep portions thereof is omitted.

Next, the basic operation of the input device for an electronic apparatus shown in FIG. 12 is explained. Herein, for description convenience, an origin O is taken at the center of the upper surface of the substrate 40, an X-axis is taken in the rightward direction of the figure, and a Y-axis is taken in the upward direction of the figure to define an XYZ three-dimensional coordinate system so that the substrate upper surface is included in the XY plane, and the following explanation is given based on this. In FIG. 12, an X-axis is defined to be rightward in the figure, a Z-axis is defined to be upward in the figure, and a Y-axis is defined in the vertical direction of the drawing paper plane.

As described above, the input device of the invention has a function for making a switching input indicating ON/OFF condition (so-called clicking inputs) and an operational input indicating an operation amount in a predetermined direction into an optional electronic apparatus. Herein, an operator makes these inputs on the operation panel 10, and basically, in the case of making a switching input, the operator fits his/her finger to the center of the operation panel 10 and presses the portion downward (toward the Z-axis negative direction), and in the case of making an operational input in a predetermined direction, the operator presses the operation panel 10 diagonally downward.

Figure 13:
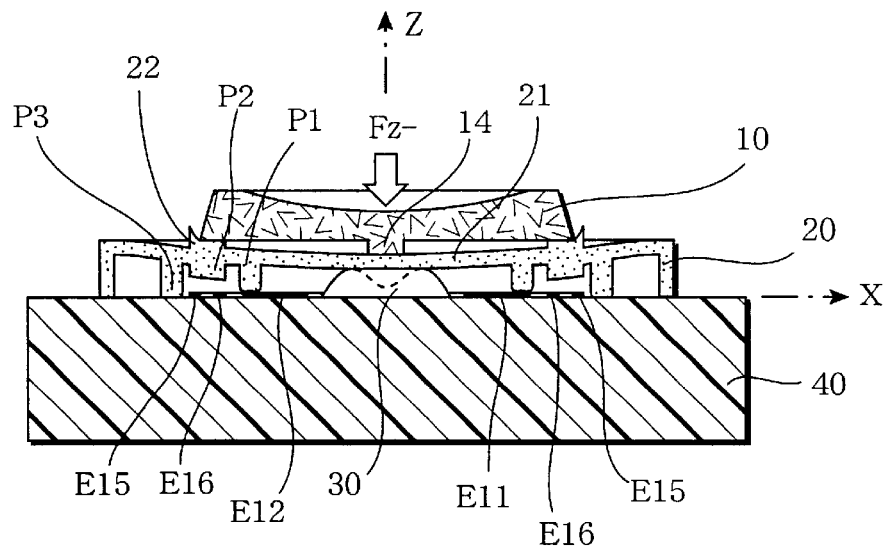
FIG. 13 is a side sectional view showing a condition where a switching input (clicking input) is made in the input device for an electronic apparatus of FIG. 12, wherein the domed structure 30 is not shown in a sectional view, but shown in a side view, only sectional views of the columnar projections P1 through P3 are shown, and illustration of deep portions thereof is omitted.

FIG. 13 is a side sectional view showing a deformed condition of each part when an operator carries out a switching input (the domed structure 30 is shown in a side section). When a pressing force downward in the figure (referred to as Fz– meaning the force in the Z-axis negative direction) is applied to the operation panel 10, in response to this pressing force Fz–, the pressing rod 14 is displaced downward, and a downward force is applied to the apex of the domed structure 30 through the inner film portion 21. The domed structure 30 has a property of inverting its shape so as to be convexed downward by elastic deformation in the vicinity of the apex when a downward pressing force with a predetermined strength or more is applied to the apex. Therefore, if the strength of the pressing force Fz– exceeds a predetermined critical value, as illustrated, the shape of the vicinity of the apex of the domed structure 30 is inverted. That is, as the operator gradually increases the downward pressing force Fz–, the domed structure 30 is suddenly collapsed and changed into the illustrated condition, and a clicking sensation is transmitted to the fingertip of the operator. At this time, the supporting columnar projections P1 and P3 formed from an elastic material are elastically deformed and slightly collapsed vertically. However, the columnar projections P2 for electrodes are still suspended.

Thus, when the shape of the domed structure 30 is inverted, a condition is obtained where the conductive contact surface 31 on the lower surface of the domed structure 30 comes into contact with the inside electrode E17 of FIG. 10, so that the inside electrode E17 and inside electrode E18 are electrically connected. When the operator stops the pressing operation, the domed structure 30 returns to the original condition, and the device returns to the condition of FIG. 12. In this condition, the inside electrodes E17 and E18 are insulated from each other. As a result, by detecting the electrical connected condition between the inside electrodes E17 and E18, detection of switching inputs becomes possible, and detection of so-called clicking inputs becomes possible.

Next, a case where an operator carries out an operational input indicating an operation amount in a predetermined direction is considered. Such an operational input is provided as an input indicating an operation amount in four directions including upward, downward, rightward, and leftward directions, or eight directions additionally including diagonal directions. In the embodiment shown herein, a total of four capacitance elements are formed of four intermediate electrodes E11 through E14 (the upper surfaces thereof are covered by insulation layers) shown in FIG. 10 and displacing conductive layer 26 opposed to the electrodes. Based on the capacitance values of the four capacitance elements, operation amounts in the respective directions can be detected.

Figure 14:
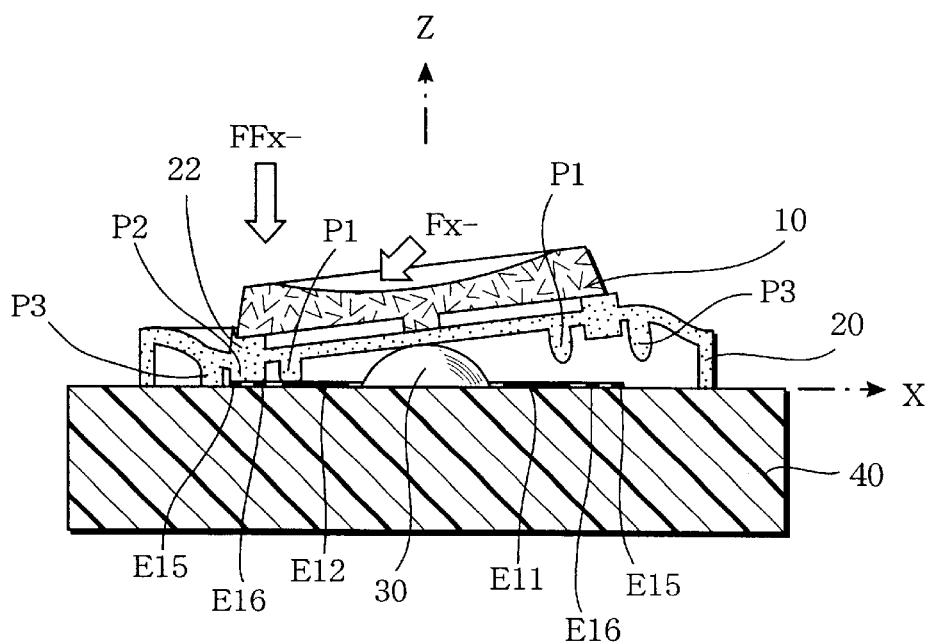
FIG. 14 is a side sectional view showing a first condition when an operational input in the X-axis negative direction is made in the input device for an electronic apparatus shown in FIG. 12, wherein the domed structure 30 is not shown in a sectional view, but shown in a side view, only sectional views of the columnar projections P1 through P3 are shown, and illustration of deep portions thereof is omitted.

For example, a case is assumed where an operator applies a diagonal downward force containing a force in the X-axis negative direction to the operation panel 10. Herein, a force to be applied in response to such an operation is referred to as Fx–. FIG. 14 is a side sectional view (the domed structure 30 is shown in a side view) showing a deformed condition of each part when such a pressing force Fx– is applied by the operator (it is not always necessary that the force be applied to the center of the operation panel 10, and in actuality, as illustrated, the force is mostly applied to a position which is slightly displaced leftward). The operating force Fx– is a diagonal downward force component, so that it also contains the downward force component (Z-axis negative directional component) as shown in the figure. However, since this downward force component is smaller than the pressing force Fz– in response to the above-mentioned clicking operation, the force is not sufficient to invert the shape of the domed structure 30. Therefore, the operation panel 10 inclines in FIG. 14 so that the left side lowers and the right side rises. In other words, for the domed structure 30, a structure may be used, which has a property whereby the shape is inverted by a vertical downward pressing force applied as a switching input, and the shape is not inverted by a diagonal downward pressing force applied as an operational input in a predetermined direction. Furthermore, the same phenomenon also occurs when a vertical downward pressing force FFx– is applied to the vicinity of the left end of the operation panel 10 in the figure in place of the diagonal downward operating force Fx– shown in FIG. 14. In this embodiment, an "operational input indicating an operation amount in the X-axis negative direction" contains not only a diagonal downward operational input such as the operating force Fx– but also an operational input for vertically pressing-in the position displaced in the X-axis negative direction downward such as the operating force FFx–. The operating force FFx– is an operational input equivalent to the operating force Fx–.

Figure 15:
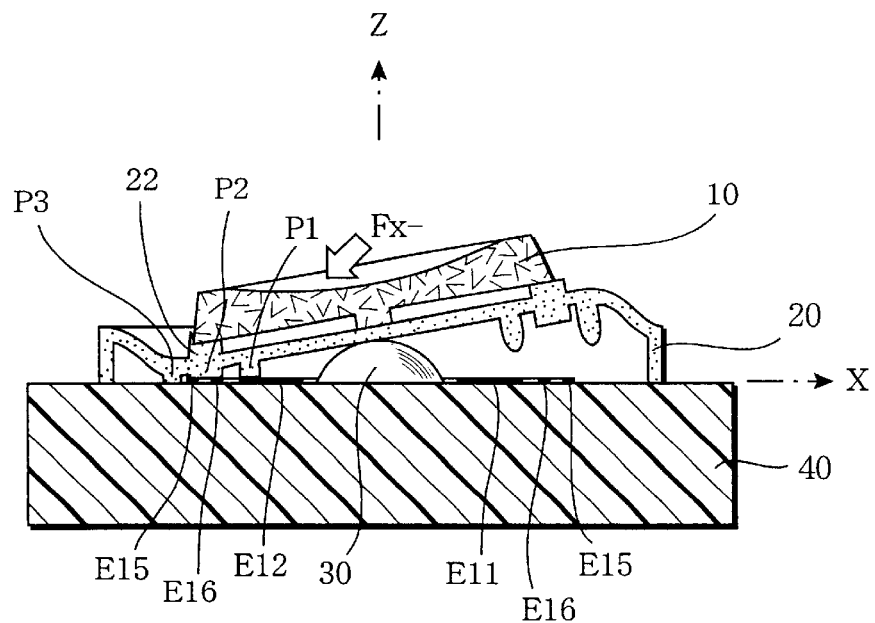
FIG. 15 is a side sectional view showing a second condition when an operational input in the X-axis negative direction is made in an input device for an electronic apparatus shown in FIG. 12, wherein the domed structure 30 is not shown in a sectional view, but shown in a side view, only sectional views of the columnar projections P1 through P3 are shown, and illustration of deep portions thereof is omitted.
Figure 16:
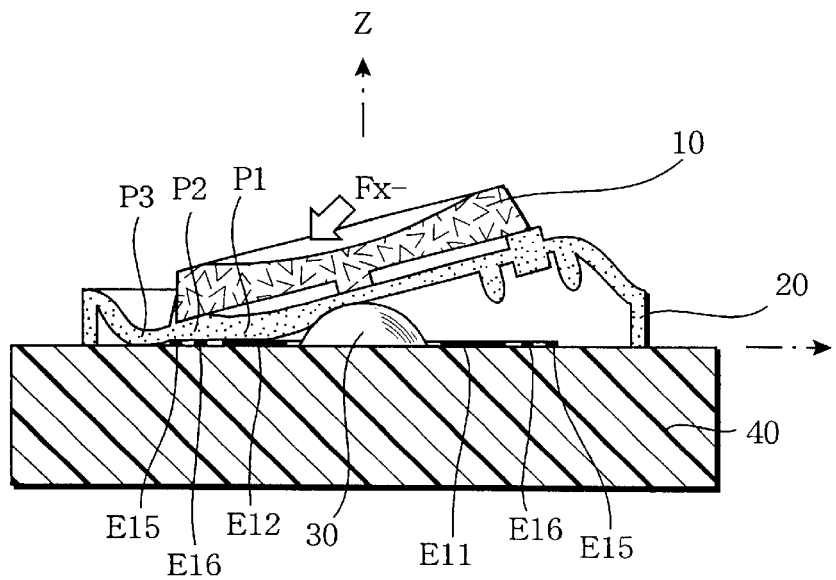
FIG. 16 is a side sectional view showing a third condition when an operational input in the X-axis negative direction is made in an input device for an electronic apparatus shown in FIG. 12, wherein the domed structure 30 is not shown in a sectional view, but shown in a side view, only sectional views of the columnar projections P1 through P3 are shown, and illustration of deep portions thereof is omitted.

As shown in FIG. 14, when the operating force Fx– (or FFx–, and so forth) which inclines the operation panel 10 leftward is applied, the columnar projections P1 and P3 in the left half of the figure are elastically deformed and collapsed vertically. On the other hand, the supporting columnar projections P1 and P3 in the right half of the figure come into a floating condition from the upper surface of the substrate 40 as illustrated. As a result, when an operating force Fx– with a predetermined strength or more is applied, as shown in FIG. 14, the lower end face of the columnar projection P2 for an electrode at the left end of the figure (displacing conductive layer to serve as a mediating electrode) comes into contact with both outside electrodes E15 and E16 to make continuity between the outside electrodes E15 and E16, and the potential of the entire displacing conductive layer 26 becomes equal to the potential of the outside electrodes E15 and E16. As the operating force Fx– is further strengthened from this condition, as shown in FIG. 15, the supporting columnar projections P1 and P3 in the left half of the figure are further elastically deformed and collapsed, and the columnar projection P2 for an electrode is also slightly elastically deformed and collapsed. Finally, as shown in FIG. 16, the supporting columnar projections P1 and P3 and the columnar projection P2 for an electrode on the left side of the figure are completely collapsed. As mentioned above, the surfaces of the intermediate electrodes E11 through E14 are covered by insulation layers. Therefore, even if the displacing conductive layer 26 is closely contacted with the intermediate electrode E12 as shown in FIG. 16, the insulation layers are interposed between the electrodes, and the electrodes still serve as capacitance elements.

Herein, when the condition of FIG. 12 is changed into the conditions of FIG. 14, FIG. 15, and FIG. 16, if changes in the capacitance values of the capacitance elements comprised of the intermediate electrodes E11 through E14 and the displacing conductive layer 26 opposed to the electrodes are considered, in the second capacitance element C12 comprised of the intermediate electrode E12 shown on the left of the figure and displacing conductive layer 26 opposed to the electrode, since the electrode interval is gradually reduced, the capacitance value gradually increases. On the other hand, in the first capacitance element C11 comprised of the intermediate electrode E11 shown on the right of the figure and the displacing conductive layer 26 opposed to the electrode, since the electrode interval is gradually increased, the capacitance value is gradually lowered. Therefore, the difference between the capacitance value of the first capacitance element C11 and the capacitance value of the second capacitance element C12 that are disposed along the X-axis is calculated, and this difference indicates the strength of the operating force Fx−. To the contrary, when an operating force Fx+ in the X-axis positive direction is applied, the operation panel 10 inclines rightward, so that the relationship of the increase and decrease in electrode intervals becomes reversed. Still in this case, the difference between the capacitance value of the first capacitance element C11 and the capacitance value of the second capacitance element C12 indicates the strength of the operating force Fx+. In short, the absolute value of the difference between the capacitance value of the first capacitance element C11 (capacitance element comprised of the intermediate electrode E11 and displacing conductive layer 26) and the capacitance value of the second capacitance element C12 disposed along the X-axis (capacitance element comprised of the intermediate electrode E12 and displacing conductive layer 26) indicates the operation amount inputted as an operating force Fx− or Fx+ in the X-axis direction, and the sign of the value indicates the direction of the inputted operation amount (X-axis positive direction or negative direction).

According to the same principle, the difference between the capacitance value between the third capacitance element C13 (capacitance element comprised of the intermediate electrode E13 and displacing conductive layer 26) disposed along the Y-axis and the fourth capacitance element C14 (capacitance element comprised of the intermediate electrode E14 and displacing conductive layer 26) is calculated, the absolute value of this difference indicates the operation amount inputted as the operating force Fy− or Fy+ in the Y-axis direction, and the sign of the value indicates the direction (Y-axis positive or negative direction) of the inputted operation amount.

When only an operating force in the X-axis direction is applied, the operation panel 10 inclines in only the X-axis direction, and the panel does not incline in the Y-axis direction. Therefore, the electrode interval of the third capacitance element C13 and fourth capacitance element disposed along the Y-axis is partially lengthened and partially shortened, and the capacitance value of the entirety of the capacitance elements does not change. Likewise, when only an operating force in the Y-axis direction is applied, the operation panel 10 inclines in only the Y-axis direction, and does not incline in the X-axis direction. Therefore, the electrode interval of the first and second capacitance elements disposed along the X-axis is partially lengthened and partially shortened, and the capacitance value of the entirety of the capacitance elements does not change. As a result, the first and second capacitance elements can detect only operation amounts in the X-axis direction, and the third and fourth capacitance elements can detect only operation amounts in the Y-axis direction. Therefore, components of the operation amounts in the respective axial directions can be separately detected.

Such operation amounts in the X- or Y-axis direction can be inputted when the operator inclines the operation panel 10 in four directions, upward, downward, rightward, and leftward, and if predetermined operation processing is executed, detection of operation amounts in more directions becomes possible. For example, an operation amount relating to a total of eight directions additionally including 45° directions can be calculated as a composite component of an operation amount in the X-axis direction and an operation amount in the Y-axis direction. Concretely, for example, if an operation amount x in the X-axis direction and an operation amount y in the Y-axis direction are calculated, it can be regarded that an operation amount of square root $(x^2+y^2)$ acted in a diagonal 45° direction (which direction can be determined from the combination of the signs of the operation amounts x and y).

Thus, by measuring the capacitance values of the four capacitance elements, an inputted operation amount in an optional direction can be detected in principle. However, in the device according to this embodiment a measure is taken to prevent such an operation amount detected value from being unexpectedly outputted. In a case of an input device using the elastic deformable body 20, even when an applied force is slight, the elastic deformable body 20 elastically deforms, and the capacitance values of the capacitance elements change. For example, in FIG. 13, a condition is shown where a pressing force Fz− is applied downward in the figure in order for the operator to carry out a clicking operation. When only the pressing force Fz− is thus accurately applied downward, the capacitance values of the four capacitance elements equally change, so that if the above-mentioned differential detection is carried out, the detected value of the operation amount in the predetermined direction becomes zero. However, in actuality, the operator operating the operation panel 10 is human, and even if he/she applies a force as a downward clicking operation, the applied operation pressing force will include not only a component in the Z-axis negative direction but also a component in the X-axis or Y-axis direction. Therefore, if the differential detection using the four capacitance elements is carried out, when an operator carries out only a clicking operation, an operation amount relating to any direction will be detected.

Generally, as an input device for an electronic apparatus, it is preferable that a switching input (clicking input) indicating an ON/OFF condition and an operational input indicating an operation amount in a predetermined direction can be independently detected and there is no interference between these inputs. In other words, preferably, in a case where an operator presses vertically the operation panel 10 downward while he/she intends to carry out a clicking operation, only a switching input for changeover from an OFF condition to an ON condition is to be detected so that no operational inputs indicating operation amounts in predetermined directions are detected, and to the contrary, when the operator presses the operation panel 10 diagonally downward while he/she intends to carry out an operational input indicating an operation amount in a predetermined direction, only the operation amount is to be detected while no switching inputs are detected. In an input device for an electronic apparatus according to this embodiment, these two types of inputs can be independently detected, and interference between them is prevented as much as possible.

First, regarding switching inputs, detection of an ON condition is carried out only when a vertical downward pressing force Fz− which is sufficient to invert the shape of the vicinity of the apex of the domed structure 30 is applied, so that a problem in that an ON condition of a switching input is detected by mistake although an operator intending to input an operational input indicating an operation amount in a predetermined direction can be prevented. For example, even when a diagonal downward operational input is applied as shown in FIG. 14 through FIG. 16, a vertical downward pressing force applied to the vicinity of the apex of the domed structure 30 is insufficient to invert the shape of the structure, detection of an ON condition is not carried out with respect to a switching input. (Of course, if the operator intentionally carries out a pressing operation combining a clicking operation and an operational input in a predetermined direction, both two inputs are detected.)

On the other hand, regarding an operational input indicating an operation amount in a predetermined direction, as mentioned above, although the capacitance values themselves of the four capacitance elements change, a measure is taken to prevent changes in the capacitance values from being outputted. To obtain an output of the detected value by using this measure, the measurements of the capacitance values of the capacitance elements may be made by using the outside electrodes E15 and E16. For example, the capacitance value of the second capacitance element C12 is originally measured by measuring the capacitance value between the intermediate electrode E12 and displacing conductive layer 26 by an electrical method, however in place of this, the capacitance value of the intermediate electrode E12 and the outside electrode E15 or E16 is measured by an electrical method. In short, among the electrodes in FIG. 10, the measured capacitance value between the intermediate electrode E11 and the outside electrode E15 or E16 is used as the detected capacitance value of the first capacitance element C11, the measured capacitance value between the intermediate electrode E12 and the outside electrode E15 or E16 is used as the measured capacitance value of the second capacitance element C12, the measured capacitance value between the intermediate electrode E13 and the outside electrode E15 or E16 is used as the measured capacitance value of the third capacitance element C13, and the measured capacitance value between the intermediate electrode E14 and the outside electrode E15 or E16 is used as the detected capacitance value of the fourth capacitance element C14.

By employing such a detection method, an actual detected capacitance value of each capacitance element is outputted under a condition where the displacing conductive layer 26 comes into electrical contact with the outside electrode E15 or E16. For example, in the condition of FIG. 12 or FIG. 13, the displacing conductive layer 26 is not contacted with the outside electrodes E15 and E16, so that the difference detected value of the above-mentioned pair of capacitance elements is maintained at zero. Therefore, when an operator carries out a switching input operation, an operation amount in a predetermined direction is prevented from being detected by mistake. As shown in FIG. 14, in response to a difference in detection of the above-mentioned pair of capacitance elements, an operation amount in a predetermined direction is outputted as a detected value after some degree of operation amount is inputted and a part of the displacing conductive layer 26 formed on the lower surface of the columnar projections P2 for electrodes comes into contact with the outside electrode E15 or E16. Therefore, the portion is a so-called insensitive zone until it comes into contact with the electrode, and the difference detected value to be outputted is maintained at zero. In the case of this embodiment shown herein, as shown in FIG. 6, a total of sixteen columnar projections P2 for electrodes are formed on the circumference of the reference concentric circle C2, and displacing conductive layers are formed on the lower surfaces of the sixteen columnar projections P2 for electrodes. Therefore, if any of the displacing conductive layers formed on the lower surfaces of the sixteen columnar projections P2 for electrodes comes into contact with the outside electrode E15 or E16, an intentional output of a difference detected value can be obtained.

As mentioned above, the input device for an electronic apparatus relating to the embodiment can realize both input functions, that is, a switching input (so-called clicking input) indicating an ON/OFF condition and an operational input indicating an operation amount in a predetermined direction while employing a relatively simple structure comprising basic components including the operation panel 10, elastic deformable body 20, domed structure 30, and substrate 40. Particularly, an input device for an electronic apparatus suitable for mass production can be realized if the deformable body 20 is obtained by integrally molding an elastic material such as silicon rubber or the like, the displacing conductive layer 26 is formed of a layer of a conductive coating applied on the lower surface of the elastic deformable body, the substrate 40 is formed of a printed circuit board for mounting circuits, electrodes on the upper surface of the substrate are formed of printed pattern layers, and insulation layers covering the electrodes are formed of resist layers.

As a result, in an input device for an electronic apparatus relating to this embodiment, when a switching input in the downward direction is made to the operation panel 10, the shape of the domed structure 30 is inverted, whereby the conductive contact surface 31 and the inside electrode E17 come into contact with each other to make an electrical connection between the pair of inside electrodes E17 and E18. Then, by electrically detecting this conductive condition, an ON/OFF condition is detected. When an operational input with a predetermined strength or more, which indicates an operation amount in a predetermined direction, is made to the operation panel 10, the capacitance values of the capacitance elements are calculated based on the electrical characteristics between the outside electrode E15 or E16 and the intermediate electrodes E11 through E14, whereby the inputted operation amount is detected.

In this detecting operation, components performing important functions are the supporting columnar projections P1 and P3 supporting the film portion of the elastic deformable body 20 and the columnar projections P2 for electrodes which form contact portions to be contacted with the outside electrodes E15 and E16. These columnar projections are formed from an elastic material, so that they elastically deform in response to action of a force applied to the operation panel 10, and the amounts of deformation change in accordance with the applied force. Due to such deformation of the columnar projections, the distance between a specific portion of the film portion and the upper surface of the substrate 40 is narrowed, and when the strength of the applied force exceeds a predetermined threshold, a portion of the displacing conductive layer 26 comes into contact with the outside electrodes E15 and E16, and as the electrical characteristics between the outside electrodes E15 and E16 and the intermediate electrodes E11 through E14, the capacitance values of the capacitance elements are measured, and then outputted as intentional detected values. Moreover, depending on the inputted operation amount, the electrode interval of the capacitance elements changes, so that a detected value in accordance with the operation amount can be outputted.

One advantage of this embodiment is that the structure in which the film portion of the elastic deformable body 20 is supported by the supporting columnar projections P1 and P3 greatly contributes to reduce the thickness of the entire device. That is, by the supporting function of the supporting columnar projections P1 and P3, displacement of the film portion is prevented unless a force with a predetermined strength or more is applied to the operation panel 10. Therefore, even if the entire elastic deformable body 20 is set to be very thin, the displacing conductive layer 26 and outside electrodes E15 and E16 are prevented from coming into contact with each other by mistake due to action of the tare weight of the film portion and forces other than the original operational input.

Section 3

FUNCTION OF SWITCHING ELEMENT OF THE FORCE DETECTOR OF THE INVENTION

The construction of the input device for an electronic apparatus using the force detector of the invention is mentioned in the above Section 1, and the operation of this device is mentioned in Section 2. The object of the invention is to efficiently suppress power consumption in a force detector using such capacitance elements. As aforementioned, in a force detector using capacitance elements as mentioned in Section 1 and Section 2, in order to electrically detect a capacitance value C of the capacitance elements, a C/V converter circuit for converting the capacitance value C into a voltage value V and a C/f converter circuit for converting the capacitance value C into a frequency f are necessary, however, generally C/V converter circuits and C/f converter circuits have oscillation circuits inside, so that power consumption during operation is relatively great. The basic spirit of the invention is to save power consumption by stopping the function of a detection circuit for detecting the capacitance value of the capacitance elements as an electric signal when detection of an external force is not necessary. Concretely, circuits with great power consumption such as a C/V converter circuit and a C/f converter circuit installed in a detection circuit may be operated in only a case where detection outputs are required.

In the device described in Section 1 and Section 2, a total of four capacitance elements, that is, two capacitance elements C11 and C12 disposed along the X-axis and two capacitance elements C13 and C14 disposed along the Y-axis are used, and by these capacitance elements, operational inputs in four directions inputted to the operation panel 10 are detected. That is, based on the difference in the capacitance value between the two capacitance elements C11 and C12 disposed along the X-axis, an operational input in the X-axis positive or negative direction is detected, and based on the difference in the capacitance value between the two capacitance elements C13 and C14 disposed along the Y-axis, an operational input in the Y-axis positive or negative direction is detected.

Figure 17:
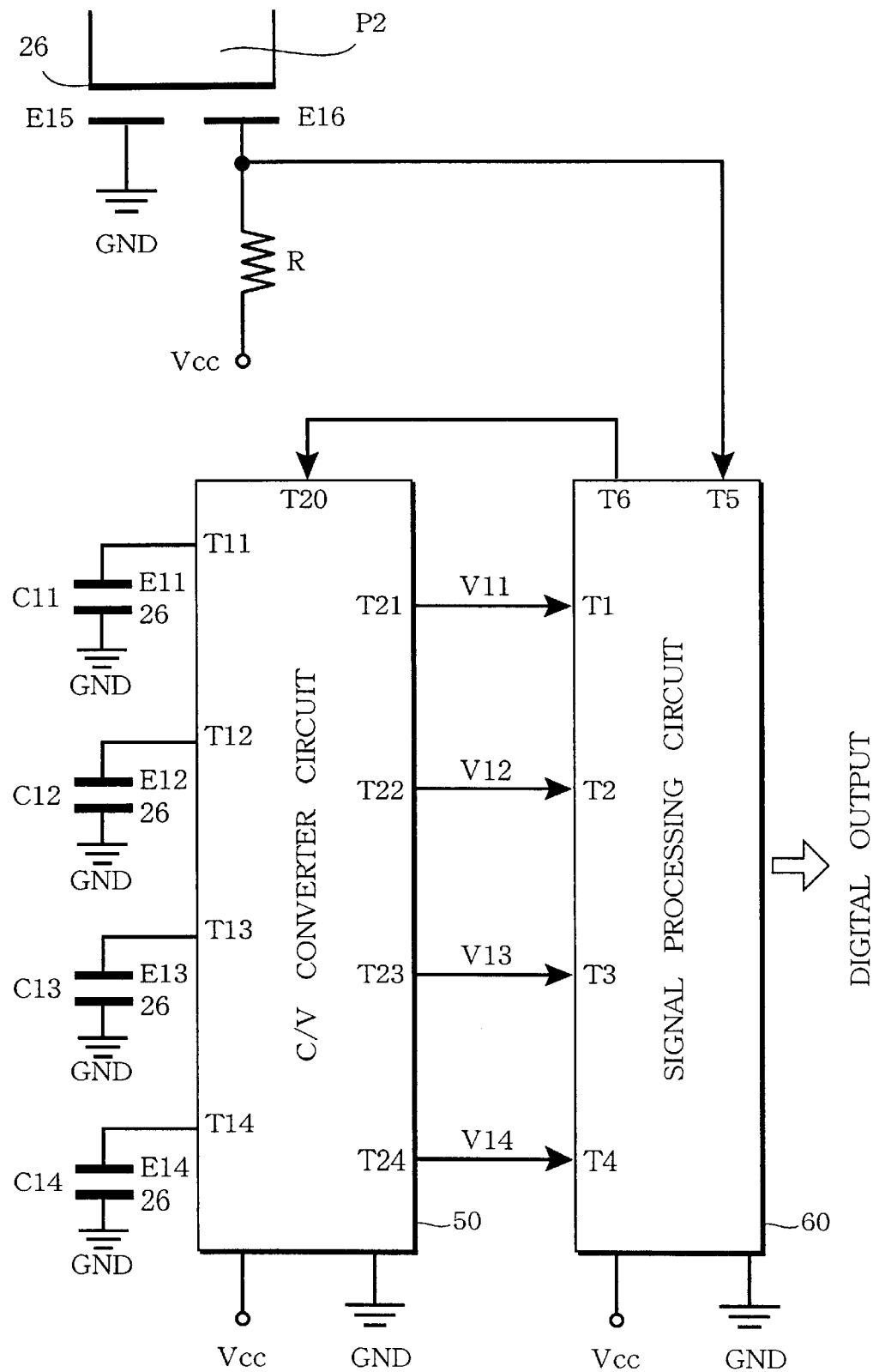
FIG. 17 is a circuit diagram showing an example of a detector circuit to be used as the input device for an electronic apparatus shown in FIG. 12.

FIG. 17 is a circuit diagram showing an example of a detection circuit for detecting operational input in four directions based on the capacitance values of these four capacitance elements C11 through C14. The basic components of this detection circuit are C/V converter circuit 50 and signal processing circuit 60. Both circuits are provided with terminals for supplying power Vcc and terminals for grounding. The C/V converter circuit 50 has a function for converting the capacitance values of the four capacitance elements C11 through C14 into analog voltage values V11 through V14 and outputting them. The signal processing circuit 60 converts these analog voltage values V11 through V14 into digital values, and then defines the difference between the voltage values V11 and V12 as an operational input value in the X-axis positive or negative direction, and defines the difference between the voltage values V13 and V14 as an operational input value in the Y-axis positive and negative direction, and outputs these operational input values as digital outputs, or executes predetermined operation processing based on these operational input values and outputs the results of the operation as digital outputs. The operation processing differs depending on the electronic apparatus for which this input device is used. Of course, a construction may also be employed in which a differential amplifier or the like is used to calculate the difference as an analog signal and convert this into a digital signal.

In a force detector used in this basic embodiment, as mentioned in Section 2, an insensitive zone is provided to prevent a change in the capacitance value from being outputted as a detected value unless an operational input applied to the operation panel 10 has a predetermined strength or more. For example, the capacitance value of the second capacitance element C12 is originally measured by electrically measuring the capacitance value between the intermediate electrode E12 and the displacing conductive layer 26. However, in place of this original method, a method in which the capacitance value between the intermediate electrode E12 and the outside electrode E15 (or E16) is electrically measured is employed. That is, detection of an operational input in the X-axis negative direction as an effective input becomes possible after some degree of operation amount is inputted and a portion of the displacing conductive layer 26 formed on the lower surfaces of the columnar projections P2 for electrodes comes into contact with the outside electrodes E15 and E16 as shown in FIG. 14, and the portion is an insensitive zone until the contact with the electrodes is obtained.

On the upper left of FIG. 17, a pair of outside electrodes E15 and E16 (contacting electrodes) formed on the substrate 40 and a portion of the displacing conductive layer 26 (mediating electrode) formed on the lower surface of the columnar projection P2 for an electrode are schematically shown. In this example, the outside electrode E15 that is positioned at the extreme outside is grounded, and outside electrode E16 inside E15 is connected to the power supply voltage Vcc via a resistor R. On the other hand, the displacing conductive layer 26 comprises a single conductive layer formed in the region shown with hatching applied in FIG. 7, however, wiring for other portions is not provided, so that the layer is in an electrical isolated condition. In the circuit diagram of FIG. 17, all the electrodes made of displacing conductive layer 26 which constitute the capacitance elements C11 through C14 (these capacitance elements are connected to the input stages at one side of the C/V converter circuit 50) are described as to be grounded. This is because, as shown in FIG. 14, detection of the capacitance values of the capacitance elements C11 through C14 is carried out on the assumption that a portion of the displacing conductive layer 26 formed on the lower surfaces of the columnar projections P2 for electrodes comes into contact with the outside electrodes E15 and E16 in a force detector, and at this point, the potential of the displacing conductive layer 26 is at a ground level via the outside electrode E15. In other words, before a portion of the displacing conductive layer 26 comes into contact with the outside electrodes E15 and E16, the displacing conductive layer 26 at one side of each capacitance element C11 through C14 electrically floats, so that the capacitance values cannot be detected by the detection circuit shown in the figure.

If so, always operating the C/V converter circuit 50 results in waste of power. The detection circuit shown in FIG. 17 cannot perform the original function unless the displacing conductive layer 26 is connected to the ground level via the outside electrode E15, so that maintaining the operating condition of the C/V converter circuit 50 makes no sense. Therefore, to allow the C/V converter circuit 50 to operate in only necessary cases, a switching element is provided. In the case of this embodiment, the switching element is comprised of the outside electrodes E15 and E16 (a pair of contacting electrodes) and displacing conductive layer 26 (mediating electrode). In a normal condition where an operator carries out no inputs into the operation panel 10 (the condition shown in FIG. 12), the displacing conductive layer 26 and the outside electrodes E15 and E16 are not in contact with each other. In this non-contact condition, the potential of the outside electrode E16 becomes equal to the power supply voltage Vcc which is connected via a resistor R. However, if an operator inputs an operational input with a predetermined strength or more into the operation panel 10, for example, as shown in FIG. 14, the displacing conductive layer 26 comes into contact with both outside electrodes E15 and E16 at the same time. In this contact condition, the potential of the outside electrode E16 drops to the ground level since the electrode is electrically connected with the outside electrode E15. As a result, based on the potential of the outside electrode E16, it can be recognized which of either an insulated condition (the displacing conductive layer 26 is not contacted) or an electric connected condition (the displacing conductive layer 26 is contacted) is of the pair of contacting electrodes E15 and E16.

For the detection circuit (C/V converter circuit 50 and signal processing circuit 60) shown in FIG. 17, two modes are prepared. The first mode is a detection mode in which a detecting function for detecting the capacitance values of the capacitance elements C11 through C14 as electric signals can be performed. The second mode is a standby mode in which a standby condition before transition into the detection mode can be maintained with less power consumption than in the detection mode although the detection function cannot be performed. These two modes are selected based on the electrical condition between the pair of contacting electrodes (outside electrodes E15 and E16) comprising a switching element. That is, when the electrical condition between the pair of contacting electrodes is an insulated condition, the standby mode is selected, and when it is an electrical connected condition, the detection mode is selected. Concretely, in the detection circuit shown in FIG. 17, the C/V converter circuit 50 has a function to be performed in the two modes, and a control signal supplied to the control terminal T20 controls which mode to operate. This control signal is generated by the signal processing circuit 60. The potential of the outside electrode E16 is inputted to the terminal T5 of the signal processing circuit 60, and the signal processing circuit 60 has a function for outputting a predetermined control signal from the terminal T6 based on this potential and supplying this signal to the control terminal T20 of the C/V converter circuit 50. That is, when the potential of the outside electrode E16 is the power supply voltage Vcc, the signal processing circuit 60 outputs a control signal for specifying the standby mode from the terminal T6, and when the potential of the outside electrode E16 is at the ground level, outputs a control signal for specifying the detection mode from the terminal T6.

As a result, the C/V converter circuit 50 operates in the standby mode in which power consumption is less until the displacing conductive layer 26 comes into contact with both outside electrodes E15 and E16, and operates in the detection mode in only a condition where the displacing conductive layer 26 is contacted by both outside electrodes E15 and E16. In other words, only when an operator intentionally applies an operational input with a predetermined strength or more in the X-axis or Y-axis direction, intentional voltage outputs V11 through V14 are outputted from the C/V converter circuit 50, and intentional digital outputs are obtained from the signal processing circuit 60. Thus, if the C/V converter circuit 50 with great power consumption is selectively operated for only necessary periods, power consumption can be significantly reduced as a whole. Particularly, if a force detector of the invention is used for a portable electronic apparatus such as a portable telephone, a great effect for reducing the consumption of built-in batteries can be expected.

Figure 18:
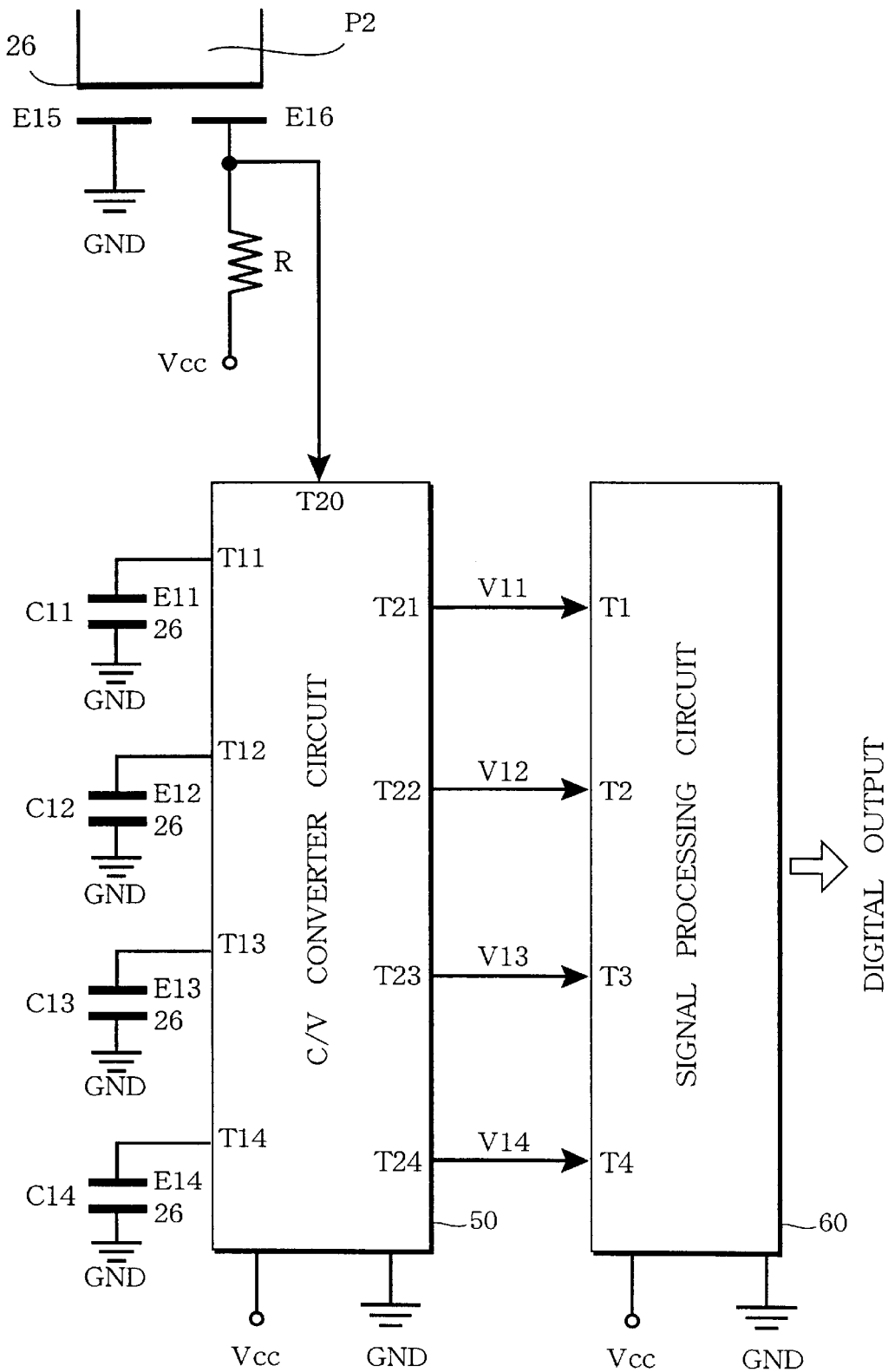
FIG. 18 is a circuit diagram showing another example of a detector circuit to be used as the input device for an electronic apparatus shown in FIG. 12.

FIG. 18 is a circuit diagram showing a modified example of the detection circuit of FIG. 17. In the example of FIG. 17, a signal from a switching element (that is, the potential of the outside electrode E16) is supplied to the terminal T5 of the signal processing circuit 60 and a control signal for switching the mode is generated within the signal processing circuit 60. However, in this modified example shown in FIG. 18, a signal from a switching element is directly supplied to the control terminal of the C/V converter circuit 50, and the signal processing circuit 60 does not relate to the mode switching processing. In the system shown in FIG. 18, the processing burden on the signal processing circuit 60 is reduced, however, the signal processing circuit 60 cannot recognize which mode the C/V converter circuit 50 currently operates in. To the contrary, in the system shown in FIG. 17, the processing burden on the signal processing circuit 60 increases, however, the signal processing circuit 60 can recognize which mode the C/V converter circuit 50 currently operates in. In practical use, depending on an electronic apparatus to which this input device is applied, a preferable system may be selected.

Figure 19:
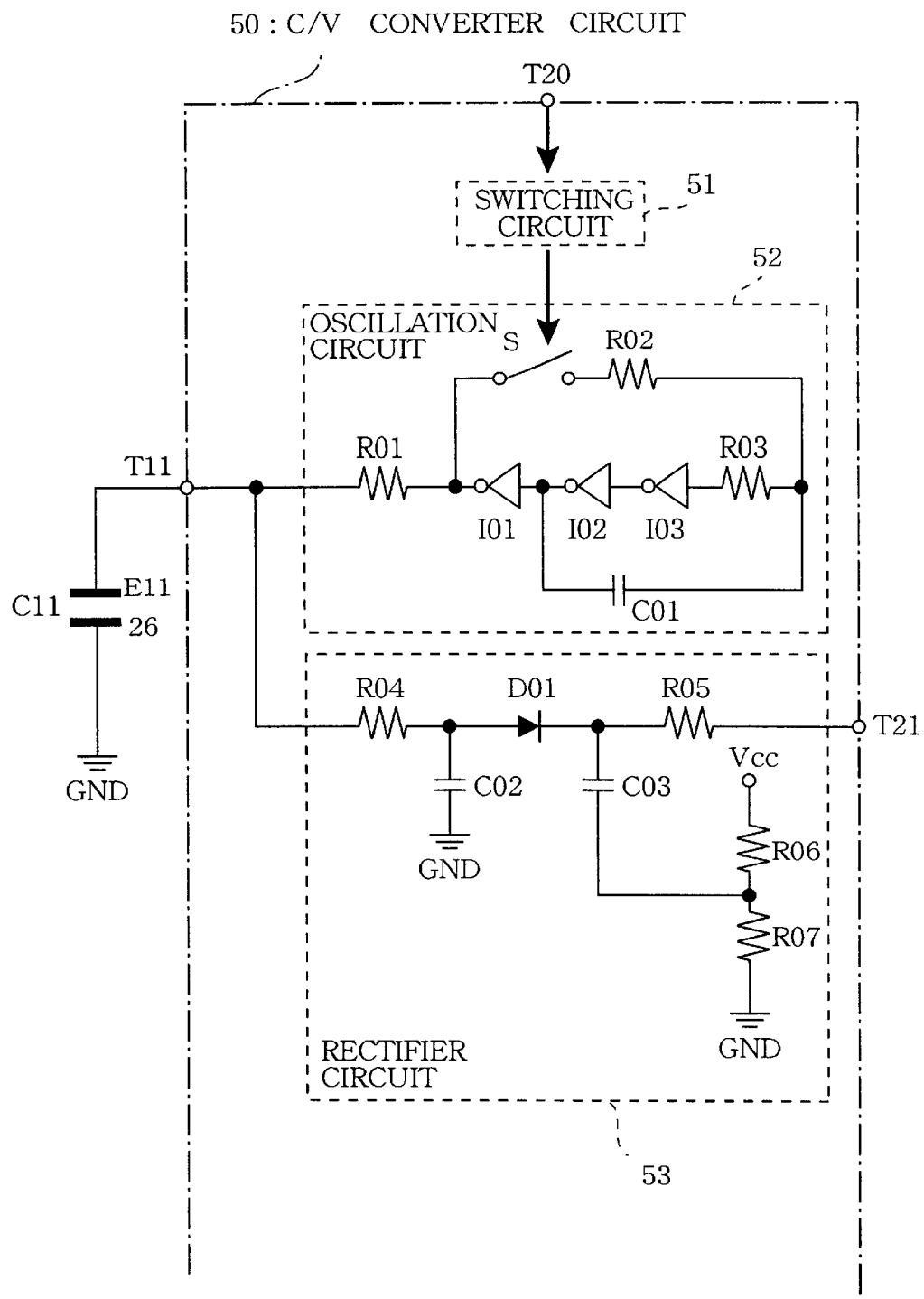
FIG. 19 is a circuit diagram showing details of the C/V converter circuit in the circuit diagram of FIG. 17 or FIG. 18.

FIG. 19 is a circuit diagram showing an example of the internal construction of the C/V converter circuit 50. Herein, for description convenience, only a section relating to the C/V conversion of the capacitance element C11 is illustrated. As mentioned above, for this detection circuit to carry out intentional operations, it is assumed that the displacing conductive layer 26 which is an electrode at one side of the capacitance element C11 is grounded via the outside electrode E15. Therefore, as illustrated, the displacing conductive layer 26 is grounded. The intermediate electrode E11 which is an electrode at the other side of the capacitance element C11 is connected to the terminal T11 of the C/V converter circuit 50.

Within the C/V converter circuit 50, switching circuit 51, oscillation circuit 52, and rectifier circuit 53 are provided. The switching circuit 51 has a function for controlling ON/OFF of the switching element S within the oscillation circuit 52 based on a control signal supplied to the control terminal T20. In actuality, these switching circuit 51 and switching element S may be comprised of various logical elements. The oscillation circuit 52 is comprised of inverter elements I01, I02, and I03 connected in series at three stages, resistance elements R01, R02, and R03, capacitor C01 and switching element S. The switching element S has a function, in response to signals supplied from the switching circuit 51, for opening and closing the circuit, and if the switch of the switching element S is turned ON, this oscillation circuit 52 starts oscillation, and an AC signal is supplied to the terminal T11 via the resistor R01. The terminal T11 is grounded via the capacitance element C11, so that the amplitude of the AC signal to be supplied to the terminal T11 changes in accordance with the capacitance value of the capacitance element C11 (that is, the interval between the electrode E11 and displacing conductive layer 26). This oscillation of the oscillation circuit 52 stops when the switch of the switching element S is turned OFF. On the other hand, rectifier circuit 53 is comprised of resistance elements R04, R05, R06, and R07, capacitors C02 and C03, and diode D01, and performs a function for smoothly rectifying the AC signal to be supplied to the terminal T11 and outputting it as a DC voltage. That is, the greater the amplitude of the AC signal of the terminal T11, the higher the voltage V11 to be outputted to the terminal T21.

As a result, when the control signal from the control terminal T20 is a signal indicating the standby mode, the switching element S within the oscillation circuit 52 is controlled and turned OFF by the switching circuit 51, and the oscillation circuit 52 stops the oscillation. Therefore, an AC signal is not supplied to the terminal T11, and the voltage outputted from the terminal T21 becomes 0V (ground level). This is the operation of the C/V converter circuit 50 in the standby mode. On the other hand, when the control signal from the control terminal T20 is a signal indicating the detection mode, the switching element S within the oscillation circuit 52 is controlled and turned ON by the switching circuit 51, and then the oscillation circuit 52 starts the oscillation. Therefore, an AC signal is supplied to the terminal T11, and at the terminal T21, a DC voltage V11 in accordance with the capacitance value of the capacitance element C11 is outputted. This is the operation of the C/V converter circuit 50 in the detection mode.

The C/V converter circuit 50 shown in FIG. 19 is an example of a general C/V converter circuit, and for carrying out the invention, other various C/V converter circuits may be used to comprise the detection circuit. Furthermore, as a circuit for detecting the capacitance values of the capacitance elements, other than the C/V converter circuit, a C/f converter circuit (a circuit for converting the capacitance value C into a frequency f) may be used. This C/f converter circuit also includes an oscillation circuit consuming great power, and the standby mode can be realized by stopping the oscillation of this oscillation circuit. Of course, the detection circuit for detecting the capacitance values as electric signals may be comprised of circuits other than C/V converter circuits and C/f converter circuits. In short, concretely, any detection circuit may be used in the invention if the circuit is constructed so that, for a certain detection circuit which can detect capacitance values as electric signals, a detection mode, in which a detecting function can be normally performed, and a standby mode, in which a standby condition (including a stop condition where power supply is completely insulated) before changing into the detection mode can be maintained with power consumption smaller than that of the detection mode although the detection function cannot be performed, are prepared, and based on the electrical condition between a pair of contacting electrodes (insulated condition or contacted condition), either one of the modes is selected.

Section 4

OTHER EMBODIMENTS OF AN INPUT DEVICE FOR AN ELECTRONIC APPARATUS RELATING TO THE INVENTION

Thus, a basic embodiment in which a force detector relating to the invention is used as an input device for an electronic apparatus is mentioned above, however, several other embodiments are described herein.

(1) Modified Example of the Contacting Electrodes

Figure 20:
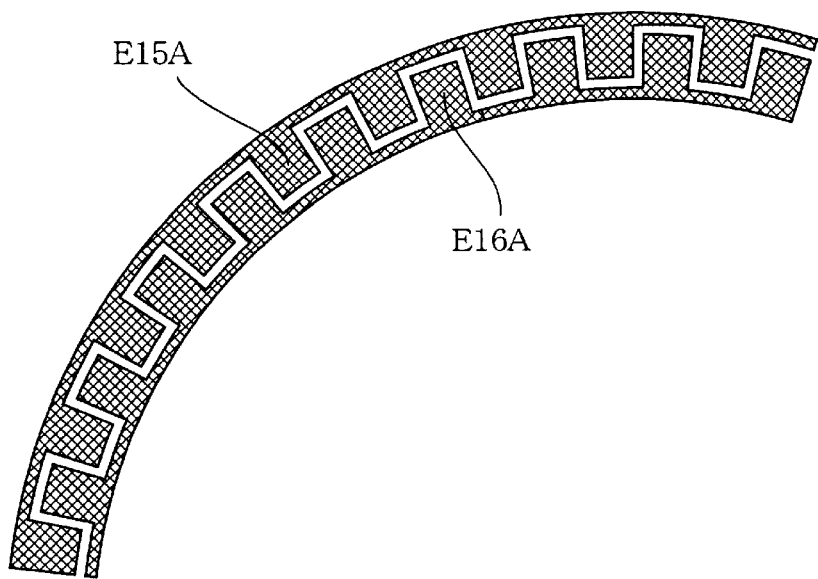
FIG. 20 is a top view showing a modified example of the pair of contacting electrodes shown in FIG. 10.

In the abovementioned basic embodiment, a switching element is comprised of a pair of ring-shaped contacting electrodes (that is, the outside electrodes E15 and E16) and the displacing conductive layer 26 formed on the bottom surfaces of the columnar projections P2 for electrodes. However, the pair of contacting electrodes to be used for the switching element do not always need to be ring-shaped. For example, the pair of contacting electrodes E15A and E16A partially shown in FIG. 20 are ring-shaped electrodes formed at almost the same positions as with the outside electrodes E15 and E16 shown in FIG. 10, however, they have teeth-shaped projections to be engaged with each other. (The hatching of FIG. 20 is not for showing a sectional view, but is for clearly showing the shapes of the electrodes.) The displacing conductive layer 26 serving as a mediating electrode needs to be contacted by both of the pair of contacting electrodes, however, the use of the pair of contacting electrodes E15A and E16A shown in FIG. 20 makes such simultaneous contact easier.

Figure 21:
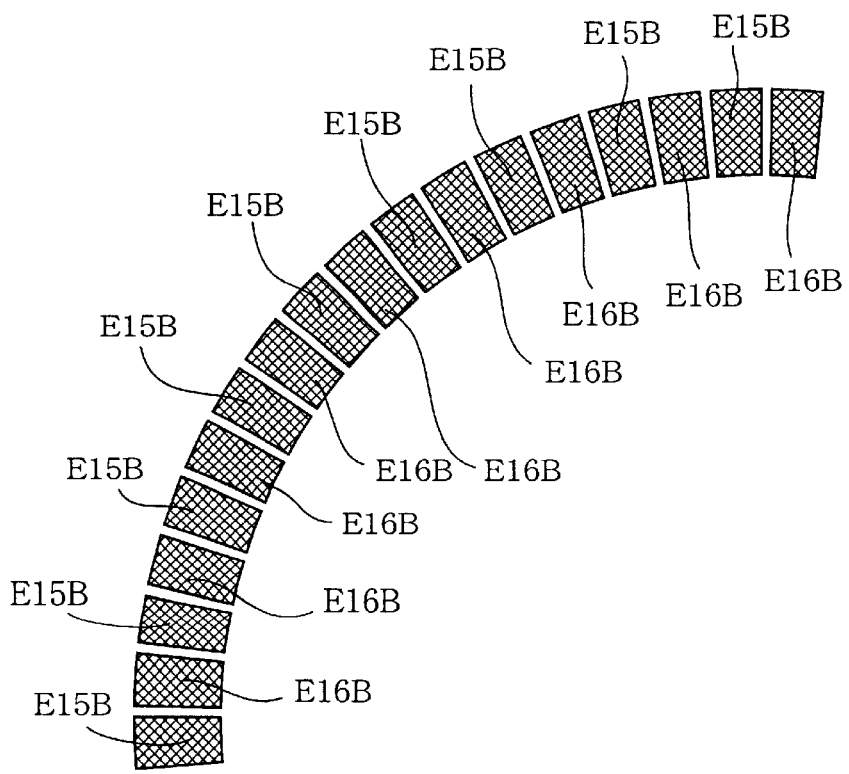
FIG. 21 is a top view showing another modified example of the pair of contacting electrodes shown in FIG. 10.
Figure 2:
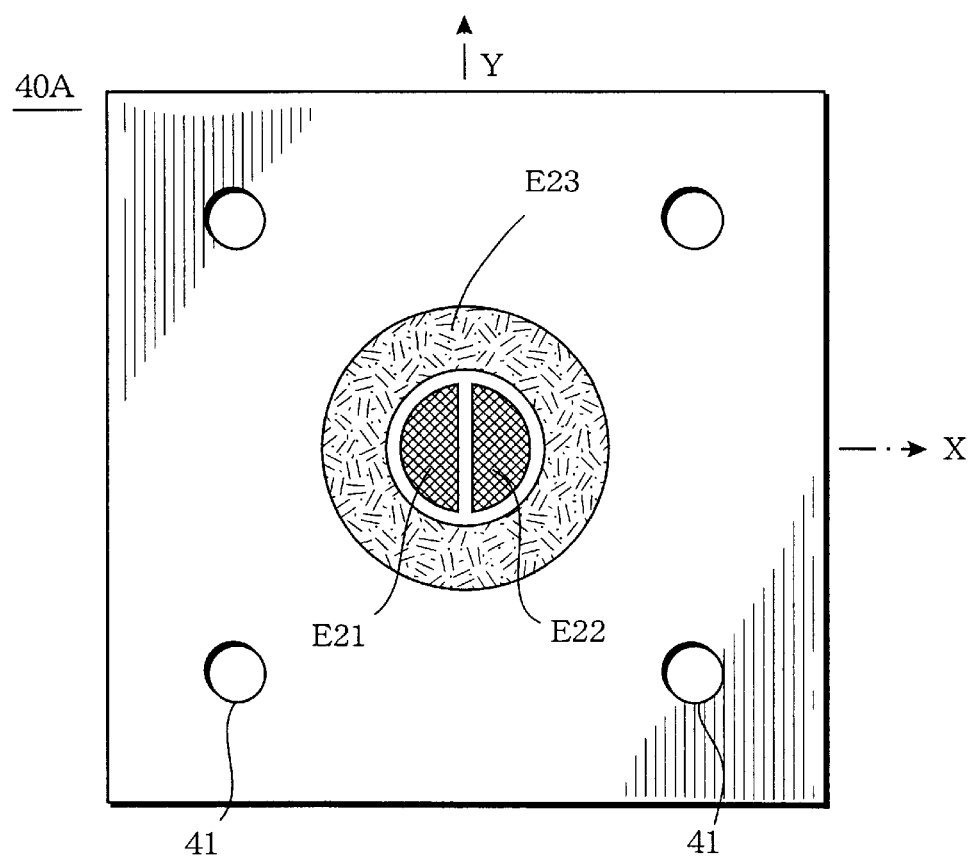

The contacting electrode groups E15B and E16B partially shown in FIG. 21 (the hatching is not for showing a sectional view but is for clearly showing the shapes of the electrodes) include a plural number N of electrodes E15B belonging to the first group and a plural number N of electrodes E16B belonging to the second group which are alternately disposed along a circumference defined on the substrate 40 (disposed at almost the same positions as with the outside electrodes E15 and E16 shown in FIG. 10). Thereby, the electrodes E15B belonging to the first group and the electrodes E16B belonging to the second group are disposed adjacent to each other, and the electrode E15B and electrode E16B disposed adjacent to each other comprise a pair of contacting electrodes. A total of N pairs of contacting electrodes are formed. Although only one pair of the contacting electrodes E15 and E16 are provided in the embodiment shown in FIG. 10, the example shown in FIG. 21 is a modified example in which plural pairs of contacting electrodes are provided. In this modified example, wiring must be laid for the N number of electrodes E15B and the N number of electrodes E16B, so that wiring becomes complex in practical use.

(2) Example of Application to Input Device for Electronic Apparatus with only One-dimensional Operation Amount Input In the abovementioned basic embodiment, a force detector having a function for detecting both clicking input (pressing force Fz−) and two dimensional operation amount input (operating forces Fx+, Fx−, Fy+, Fy−) is used with respect to the operation panel 10. However, the invention can also be applied to a force detector having only a one-dimensional operation input function. For example, if the substrate 40 as a component shown in FIG. 1 is replaced with a substrate 40A whose top view is shown in FIG. 22, and assembly is performed while the domed structure 30 is excluded, an input device for an electronic apparatus having only a one-dimensional (Z-axis direction) operation amount input function can be realized. In this case, the semicircular electrodes E21 and E22 shown in FIG. 22 are a pair of contacting electrodes whose conductive surfaces are exposed, and the washer-shaped electrode E23 is a detecting fixed electrode whose surface is covered by an insulating film (the hatching in FIG. 22 is not for showing a sectional view, but is for clearly showing the shapes of the electrodes). The capacitance element is comprised of the washer-shaped electrode E23 (detecting fixed electrode) and a portion of the displacing conductive layer 26 (detecting displacing electrode) opposed to the electrode.

When an operator carries out an operation to press-in the operation panel 10 downward by a force with some degree of strength (when a pressing force Fz− with a predetermined strength or more is applied), the central portion of the displacing conductive layer 26 serving as a mediating electrode comes into contact with both of the pair of contacting electrodes E21 and E22, and as long as the operator presses the panel with a stronger force, an intentional output of the capacitance value of the capacitance element can be obtained. In the above-mentioned basic embodiment, a pressing force Fz− in the Z-axis direction applied to the operation panel 10 is detected as only an ON/OFF switching input, however, in the embodiment shown herein, the pressing force Fz− in the Z-axis direction can be detected as an operation amount, so that a detected value in accordance with the strength of the force can be obtained. That is, detection of the pressing force Fz− becomes possible by using a phenomenon in which the greater the pressing force Fz− in the Z-axis direction, the closer the displacing conductive layer 26 to the electrode E23 and the higher the capacitance values.

Of course, the detection circuit operates in the standby mode until the strength of the pressing force Fz− becomes the predetermined strength, so that an output of detected values is not made, and accordingly, power is prevented from being wastefully consumed. Concretely, for example, if the electrode E21 is grounded, the electrode E22 is connected to the power supply voltage Vcc via a resistor, and wiring is not provided for the displacing conductive layer 26 so that the layer becomes an isolated floating electrode, in completely the same manner as with the switching element comprised of the electrodes E15 and E16 and displacing conductive layer 26 shown in FIG. 17, a switching element can be comprised of the electrodes E21 and E22 and displacing conductive layer 26. Therefore, a control is made so that, when the potential of the electrode E22 is equal to the power supply voltage Vcc, the detection circuit is changed into the standby mode, and when the potential of the electrode E22 drops to the ground level, the detection circuit is changed into the detection mode.

Figure 23:
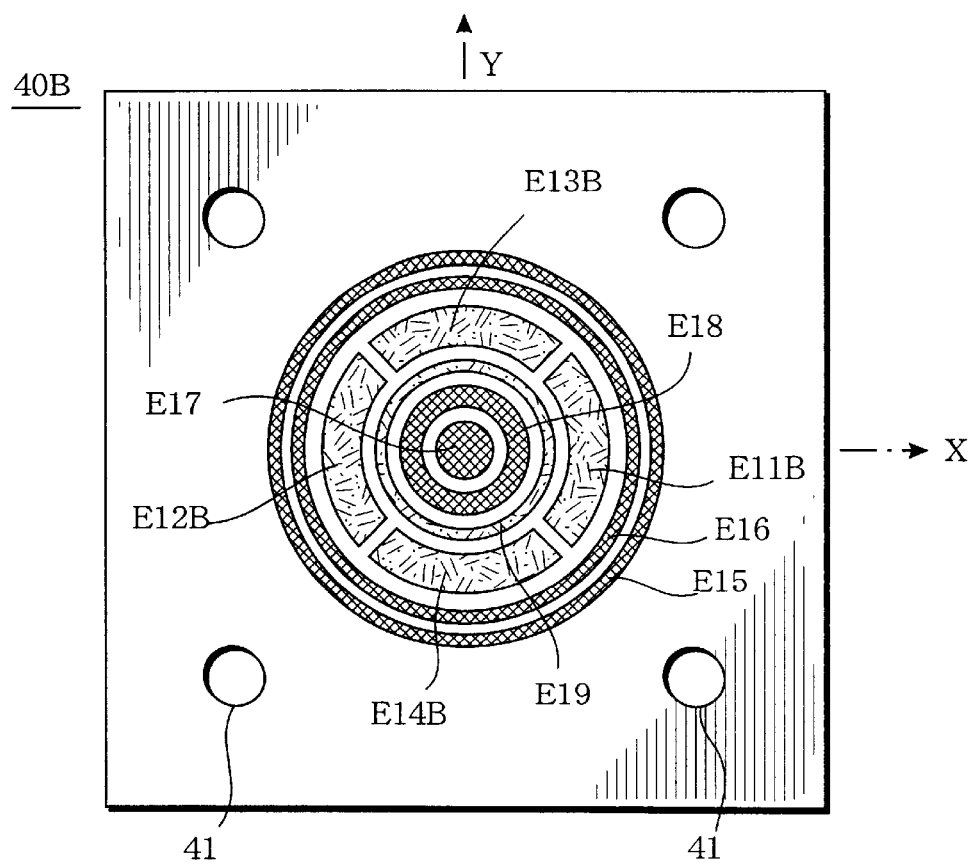
FIG. 23 is a top view of substrate 40B to be used as an input device for an electronic apparatus having a three-dimensional operational input function and a clicking function.

(3) Example of Application to Input Device for Electronic Apparatus for Inputting Three-dimensional Operation Amounts and Clicking Input If the substrate 40 in the components shown in FIG. 1 is replaced with a substrate 40B whose top view is shown in FIG. 23, an input device for an electronic apparatus for inputting three-dimensional operation amounts and clicking input can be realized (the hatching in FIG. 23 is not for showing a sectional view, but is for clearly showing the shapes of electrodes). The substrate 40B shown in FIG. 23 is obtained by adding washer-shaped electrode E19 to the substrate 40 shown in FIG. 10. To add the electrode E19, the fan-shaped electrodes E11 through E14 are replaced with electrodes E11B through E14B whose widths are slightly narrower, however, the function does not change. The added electrode E19 is a detecting fixed electrode whose surface is covered by an insulating film.

As a result, in this embodiment, a total of five detecting fixed electrodes E11B, E12B, E13B, E14B, and E19 are formed, and a portion of displacing conductive layer 26 opposed to these electrodes is used as a detecting displacing electrode, and therefore, a total of five capacitance elements C11, C12, C13, C14, and C19 are formed. Herein, the point in that the capacitance elements C11 and C12 are used for detecting operational inputs in the X-axis direction and the capacitance elements C13 and C14 are used for detecting operational inputs in the Y-axis direction is the same as in the above-mentioned basic embodiment. In the embodiment shown herein, detection of operational inputs in the Z-axis direction also becomes possible by the capacitance element C19. That is, detection of a pressing force Fz− becomes possible by using a phenomenon in that, as a pressing force Fz− in the Z-axis direction increases in strength, the displacing conductive layer 26 comes closer to the electrode E19, and the capacitance value increases.

When detecting an operation amount in the Z-axis direction, the switching element comprised of the outside electrodes E15 and E16 cannot be used. This is because, when a pressing force Fz− with a predetermined strength or more is applied, as in the example shown in FIG. 13, the domed structure 30 is inverted and the electrodes E17 and E18 are electrically connected, however, the displacing conductive layer 26 formed on the bottom surfaces of the columnar projections P2 for electrodes does not come into contact with the outside electrodes E15 and E16. In this condition, the switching element comprised of the outside electrodes E15 and E16 still indicates the standby mode.

Therefore, in the embodiment shown herein, the electrodes E17 and E18 and the domed structure 30 are used as a second switching element. The domed structure 30 is entirely formed of a conductive material (metal), and the electrodes E17 and E18 are originally for detecting clicking input (ON/OFF switching input) in accordance with inversion of the domed structure 30. Therefore, the electrodes E17 and E18 are maintained in an insulated condition until a pressing force Fz− with a predetermined strength or more is applied, and the electrodes have a property to change into an electrical conductive condition in accordance with inversion of the domed structure 30 when a pressing force Fz− with a predetermined strength or more is applied. Therefore, by using this property, when the electrodes E17 and E18 are electrically conducted, a control may be made to change the detection circuit into the detection mode. That is, as a total operation of this device, when either the electrical conductive condition between the electrodes E15 and E16 or the electrical conductive condition between the electrodes E17 and E18 is obtained, the detection circuit is changed to be in the detection mode, and when neither of them is obtained, the circuit may be changed to be in the standby mode. The electrical conductive condition between the electrodes E15 and E16 is obtained when an intentional operational input in the X-axis or Y-axis direction is applied to the operation panel 10, and the electrical conductive condition between the electrodes E17 and E18 is obtained when an intentional operational input in the Z-axis direction is applied to the operation panel 10. Therefore, in both cases, processing for detecting the capacitance values of the capacitance elements is executed by changing the detection circuit to be in the detection mode. In addition, in practical use, it is preferable that the electrode E17 or E18 is connected to the ground level so that the capacitance value between the grounded electrode and electrode E19 can be detected by the detection circuit.

The switching element in the abovementioned embodiments is comprised of a pair of contacting electrodes and a mediating electrode which can simultaneously come into contact with both of the pair of contacting electrodes. In the basic embodiment described in Section 1, a portion of the displacing conductive layer 26 formed on the lower surface of the elastic deformable body 20 is used as the mediating electrode, however, it is not always necessary that the mediating electrode is provided on the elastic deformable body 20. In the embodiment shown herein, the domed structure 30 disposed between the elastic deformable body 20 and substrate 40 is used as a mediating electrode. In a case where the displacing conductive layer 26 is used as a mediating electrode, this mediating electrode comes into contact with neither of the pair of contacting electrodes in a normal condition (when no intentional operational inputs are applied), and when an external force with a predetermined strength or more is applied (an intentional operational input is applied), simultaneously comes into contact with the pair of contacting electrodes. As in the embodiment shown herein, in a case where the domed structure 30 disposed on the electrode E18 is used as a mediating electrode, this mediating electrode is normally contacted with only one (electrode E18) of the contacting electrodes, and when an external force with a predetermined strength or more is applied, the electrode simultaneously comes into contact with both of the pair of contacting electrodes (electrodes E17 and E18).

Figure 24:
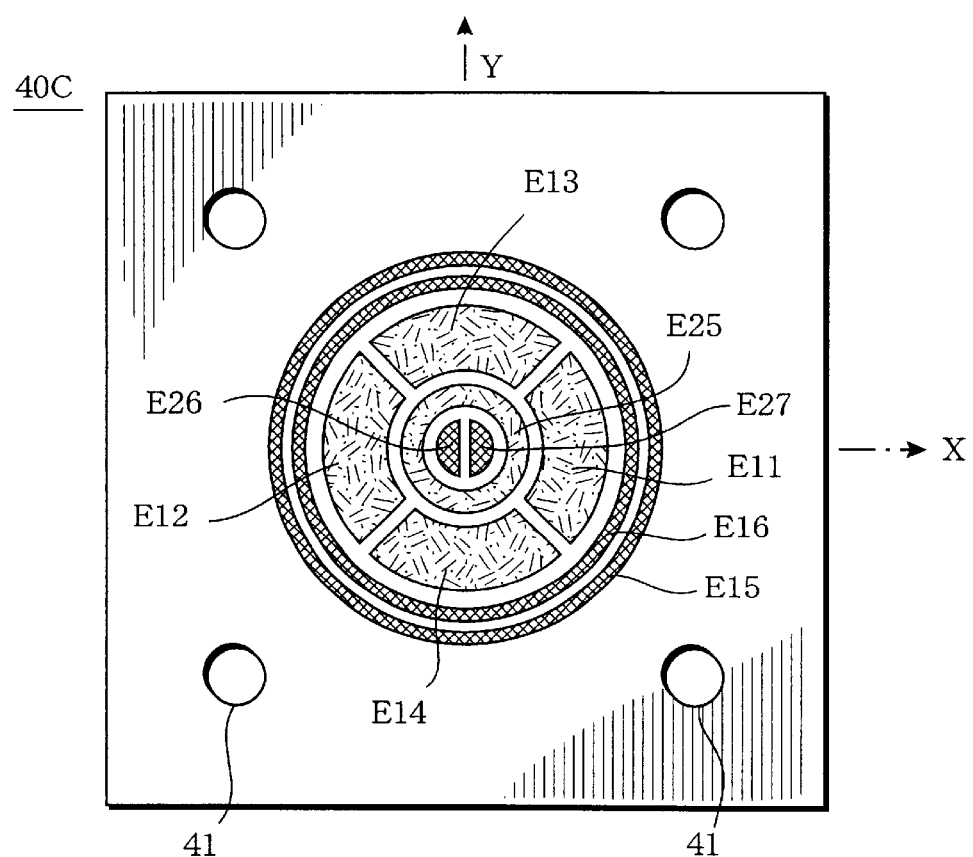
FIG. 24 is a top view of substrate 40C to be used as an input device for an electronic apparatus having a three-dimensional operational input function.
Figure 2:
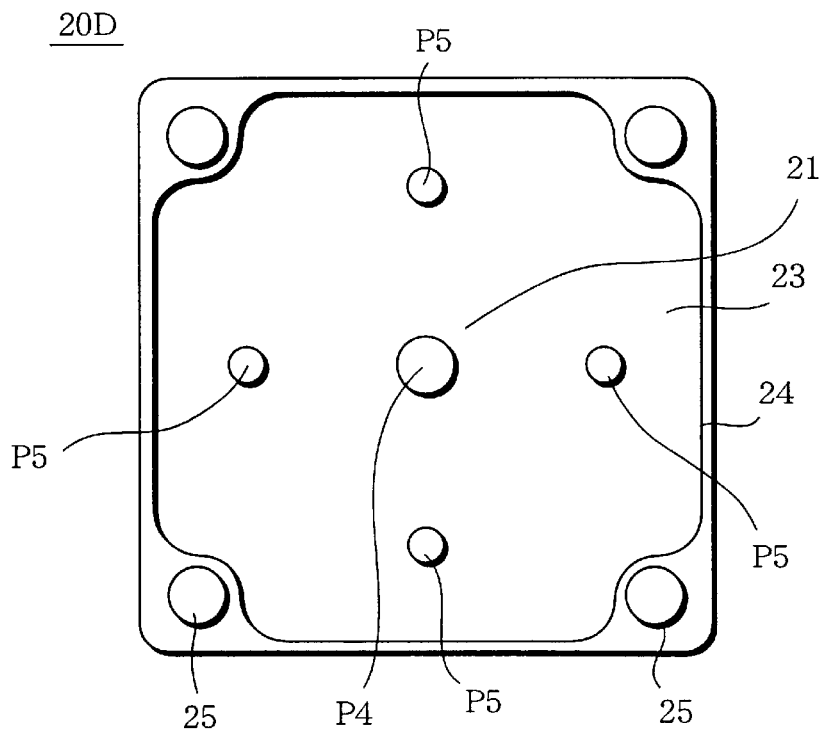
Figure 2:
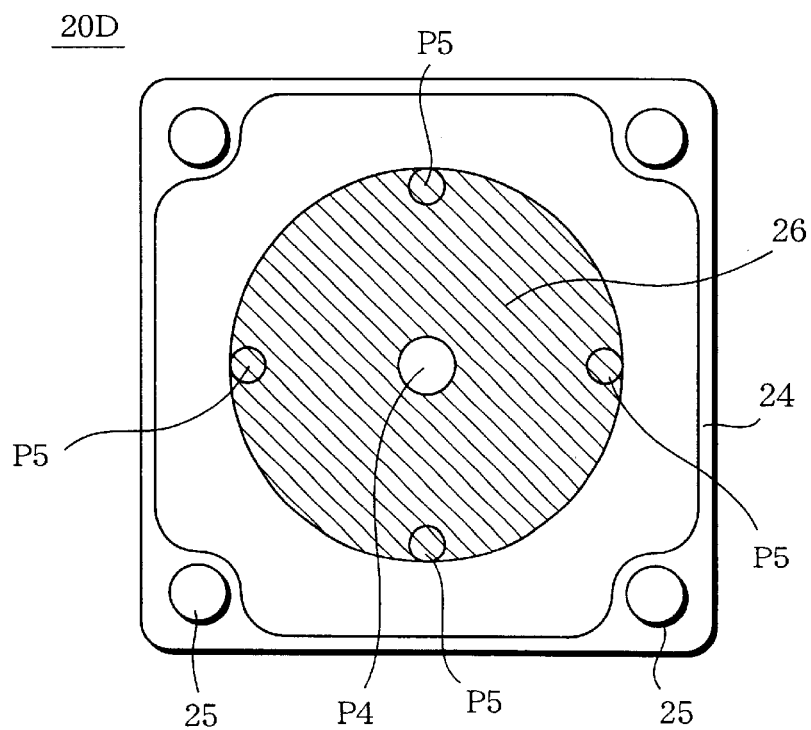

(4) Example of Application to Input Device for Electronic Apparatus with Inputs for Three-dimensional Operation Amounts If the substrate 40 in the components shown in FIG. 1 is replaced with a substrate 40C whose top view is shown in FIG. 24 and the domed structure 30 is eliminated, an input device for an electronic apparatus with an input for three-dimensional operation amounts can be realized (the hatching in FIG. 24 is not for showing a sectional view, but is for clearly showing the shapes of the electrodes). This embodiment is equivalent to a condition where the clicking input function is eliminated from the embodiment using the substrate 40B shown in FIG. 23.

In this embodiment, a total of five detecting fixed electrodes E11, E12, E13, E14, and E25 (insulating films are formed on all surfaces) are formed, and a portion of displacing conductive layer 26 opposed to these electrodes are used as a detecting displacing electrode. As a result, a total of five capacitance elements C11, C12, C13, C14, and C25 are formed. Herein, the point in that the capacitance elements C11 and C12 are used for detecting operational inputs in the X-axis direction and the capacitance elements C13 and C14 are used for detecting operational inputs in the Y-axis direction is the same as in the above-mentioned basic embodiment. The point in that the detection of operational inputs in the Z-axis direction becomes possible by the capacitance element C25 is the same as in the embodiment using the substrate 40B shown in FIG. 23. However, in the present embodiment, the domed structure 30 is not used, and a function for detecting clicking input is not provided. The semicircular electrodes E26 and E27 provided at the center of the substrate 40C are a pair of contacting electrodes, and a portion of the displacing conductive layer 26 opposed to the electrodes functions as a mediating electrode.

Also in this embodiment, when either the electrical conductive condition between the electrodes E15 and E16 or the electrical conductive condition between the electrodes E26 and E27 is obtained, the detection circuit may be changed to be in the detection mode, and when neither of the conditions are obtained, the detection circuit may be changed to be in the standby mode. When the electrodes E15 and E16 reach an electrical conductive condition, an intentional operational input in the X-axis or Y-axis direction is applied to the operation panel 10, and when the electrodes E26 and E27 are electrically connected, an intentional operational input in the Z-axis direction is applied to the operation panel 10. Therefore, in both cases, the detection circuit is changed to be in the detection mode and processing for detecting the capacitance values of the capacitance elements is carried out. In practical use, it is preferable that the electrodes E26 or E27 is connected to the ground level and the capacitance value between the grounded electrode and the electrode E25 can be detected.

(5) Example of Application to Input Device for Electronic Apparatus using a Plurality of Domed Structures Herein, an input device for an electronic apparatus relating to still another embodiment of the invention is explained. FIG. 25 is an exploded side sectional view showing components by breaking down this input device for an electronic apparatus. As illustrated, this input device for an electronic apparatus is comprised of operation panel 10, elastic deformable body 20D, domed structure 30, and substrate 40D. In actuality, the input device is constructed so that five domed structures 30 are disposed on the substrate 40D (disposition locations are described later), and the elastic deformable body 20D is covered thereon, and the operation panel 10 is further attached on the material. This input device can also carry out switching inputs indicating ON/OFF conditions and operational inputs indicating operation amounts in predetermined directions.

In comparison with the basic embodiment shown in FIG. 1, the operation panel 10 and domed structure 30 are completely the same (however, the number of provided domed structures 30 is five). The elastic deformable body 20D shown in FIG. 25 is slightly different in shape from the elastic deformable body 20 shown in FIG. 1, however, the function is almost the same. The upper surface of the elastic deformable body 20D is completely the same as that of the elastic deformable body 20 shown in FIG. 1 as shown in the top view of FIG. 4. On the other hand, FIG. 26 is a bottom view of this elastic deformable body 20D. As illustrated, this elastic deformable body 20D is almost square in a plan view. Basic components thereof are, as shown in the side sectional view of FIG. 25, inner film portion 21, ring-shaped protruding portion 22, outer film portion 23, side wall portion 24, fixed leg portions 25, and columnar projections P4 and P5. As shown in the bottom view of FIG. 26, at the four corners of the lower surface of the elastic deformable body 20D, columnar fixed leg portions 25 extend downward. The four fixed leg portions 25 are inserted into fixing holes 41 (see FIG. 25) formed at four positions of the upper surface of the substrate 40D, whereby the elastic deformable body 20D is fixed to a predetermined position on the substrate 40D.

As shown in FIG. 26, on the lower surfaces of the film portions 21 and 23, columnar projections P4 and P5 extending downward are formed. The central columnar projection P4 formed at the center is for pressing the vicinity of the apex of the domed structure 30 disposed at the center of the substrate 40D, and the peripheral columnar projections P5 formed at the four peripheral positions are for pressing the vicinities of the apexes of the four domed structures 30 disposed around the substrate 40. The side surface shapes of the columnar projections P4 and P5 are clearly shown in the side sectional view of FIG. 25. As shown in the side sectional view of FIG. 25, the peripheral columnar projections P5 are formed immediately under the ring-shaped protruding portion 22.

Displacing conductive layer 26 is also formed from a conductive coating which serves as a detecting displacing electrode on the lower surface of the elastic deformable body 20D. FIG. 27 is a bottom view of the elastic deformable body 20D for showing the region at which the displacing conductive layer 26 is formed. In the figure, the displacing conductive layer 26 is formed in the area with hatching applied (the hatching in FIG. 27 is not for showing a sectional view). As mentioned above, although the columnar projections P4 and P5 are formed on the lower surface of the elastic deformable body 20D, the displacing conductive layer 26 is not formed on the bottom surface and side surface of the central columnar projection P4, and the displacing conductive layer 26 is formed on the bottom surfaces and side surfaces of the peripheral columnar projections P5 provided at the four positions.

Figure 28:
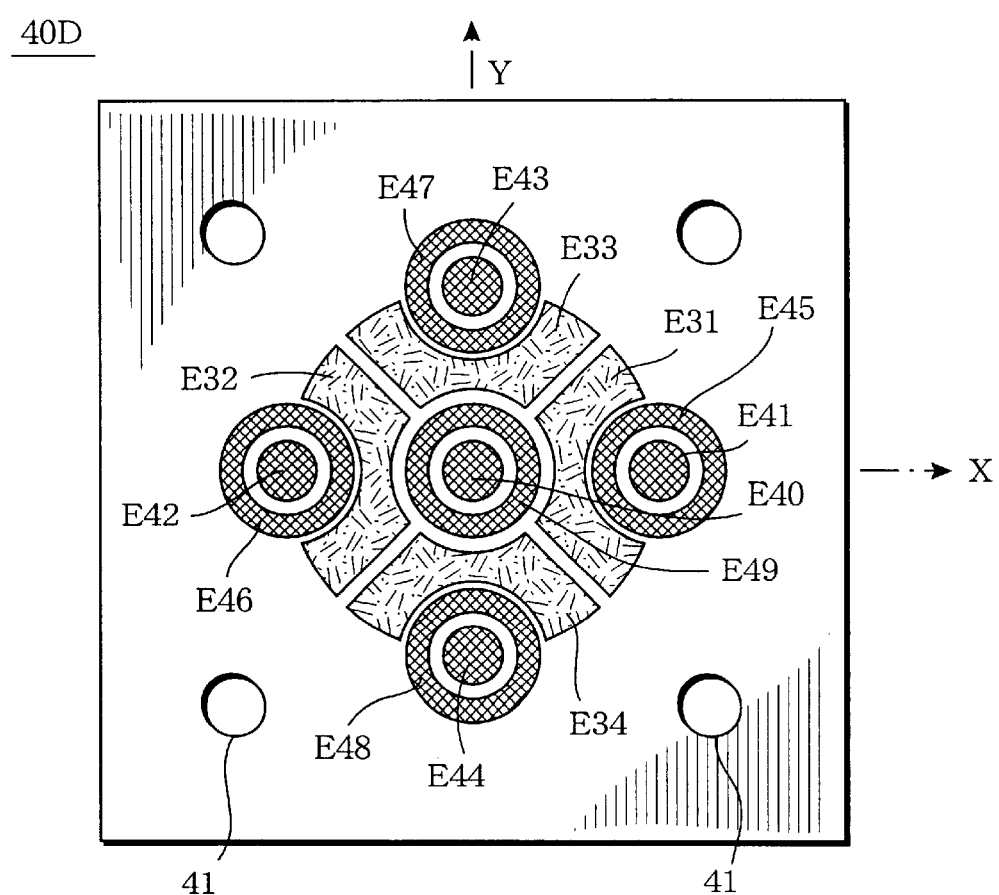
FIG. 28 is a top view of the substrate 40D, a side section along the center (XZ plane) of which is shown in FIG. 25.

Next, the construction of the substrate 40D is explained with reference to the top view of FIG. 28 (the hatching in FIG. 28 is not for showing a sectional view, but is for clearly showing the shapes of electrodes). The fixing holes 41 provided at the four corners are made in the upper surface of the substrate 40D for insertion of the fixed leg portions 25 of the elastic deformable body 20D. On the upper surface of the substrate 40D, as illustrated, four detecting fixed electrodes E31 through E34, whose upper surfaces are covered by insulating films, and five pairs of contacting electrodes E40 through E49, whose conductive surfaces are exposed, are formed. The pair of contacting electrodes E40 and E49 disposed at the center are to be used for detecting clicking input. On the other hand, the four pairs of contacting electrodes E41 through E48 disposed outside the detecting fixed electrodes E31 through E34 function as switching elements.

Figure 29:
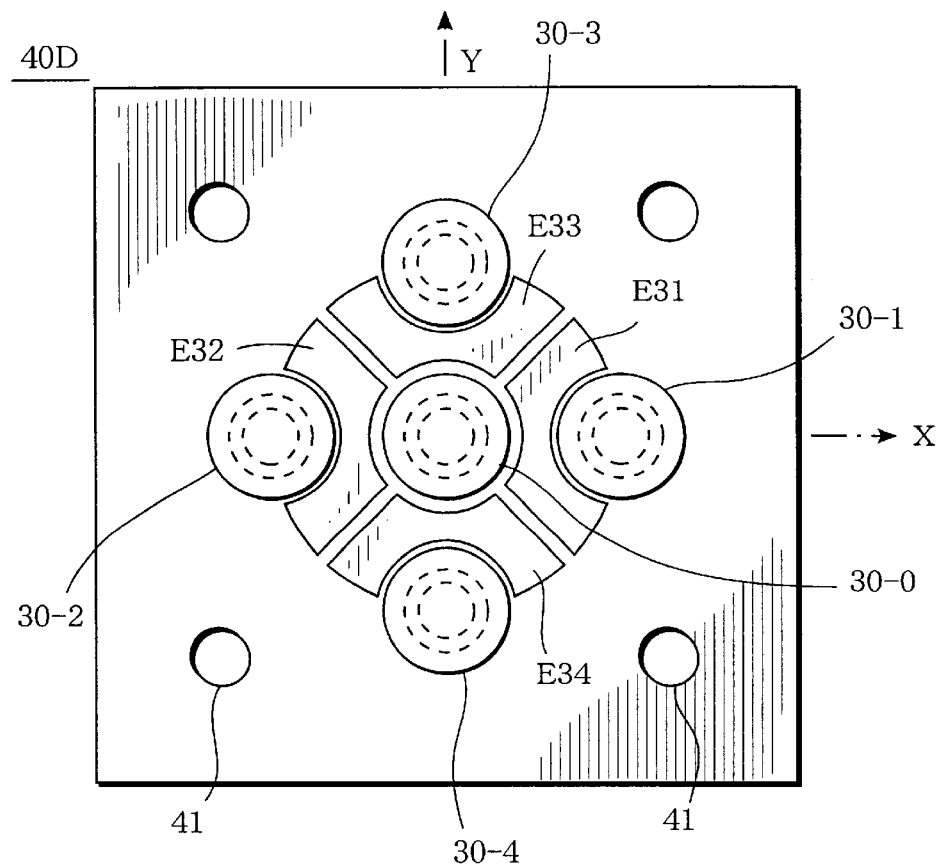
FIG. 29 is a top view showing a condition where 5 domed structures 30 are disposed on the substrate 40D shown in FIG. 28.

Five domed structures 30 are disposed and turned down on the electrodes E45 through E49 on the upper surface of the substrate 40D. FIG. 29 is a top view showing a condition where five domed structures 30 are disposed at predetermined positions on the upper surface of the substrate 40D shown in FIG. 28. In actuality, the domed structures 30 are fixed on the upper surface of the substrate 40D by using an adhesive agent or adhesive tape. As illustrated, one of a total of the five domed structures 30 is disposed at the center of the substrate 40D, and the remaining four structures are disposed at the peripheral portion of the substrate 40D. Herein, for description convenience, the structure disposed at the center of the substrate 40 D is referred to as a central domed structure 30-0, the structure disposed in the X-axis positive region of the peripheral portion is referred to as a peripheral domed structure 30-1, the structure disposed in the X-axis negative region of the peripheral portion is referred to as a peripheral domed structure 30-2, the structure disposed in the Y-axis positive region of the peripheral portion is referred to as a peripheral domed structure 30-3, and the structure disposed in the Y-axis negative region of the peripheral portion is referred to as a peripheral domed structure 30-4 as illustrated. The central domed structure 30-0 is disposed on the electrode E49 so that the Z-axis becomes its center axis. On the other hand, the four peripheral domed structures 30-1 through 30-4 are disposed on the electrodes E45 through E48, respectively.

Figure 30:
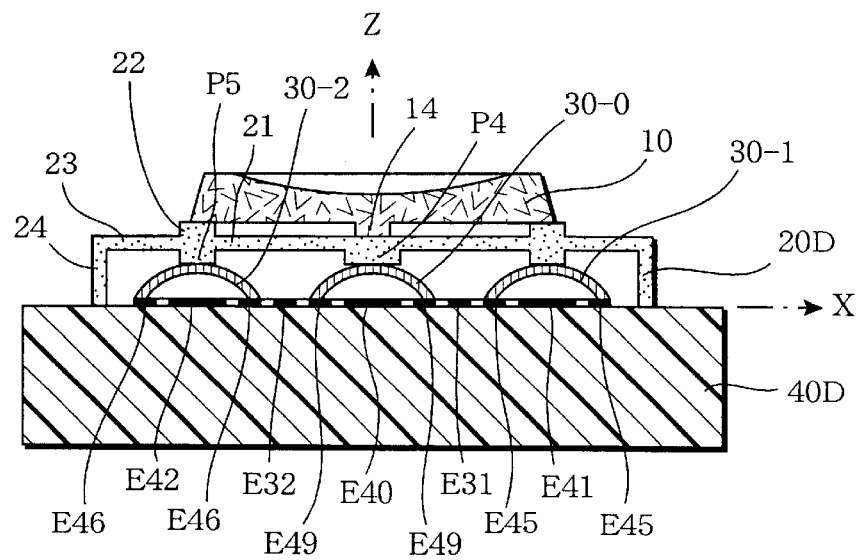
FIG. 30 is a side sectional view of an input device for an electronic apparatus constructed by assembling the components shown in FIG. 25.

FIG. 30 is a side sectional view of the input device for an electronic apparatus thus assembled along the XZ plane. The point in that four capacitance elements are formed of the four detecting fixed electrodes E31 through E34 and a portion (detecting displacing electrode) of the displacing conductive layer 26 opposed to these electrodes to detect operational inputs in the X-axis and Y-axis directions is the same as in the above-mentioned basic embodiment. However, in the embodiment shown herein, four peripheral domed structures 30-1 through 30-4 and paired contacting electrodes formed thereunder comprise a total of four switching elements. For example, one switching element is comprised by the peripheral domed structure 30-1 and a pair of contacting electrodes E41 and E45. The pair of contacting electrodes E41 and E45 comprising this switching element are normally in an insulated condition, however, when an operational input Fx+ with a predetermined strength or more in the X-axis positive direction is applied to the operation panel 10, the pair of contacting electrodes change into an electrical conductive condition due to inversion of the peripheral domed structure 30-1 serving as a mediating electrode.

As a result, in the embodiment, when an operation input with a predetermined strength or more in the X-axis positive or negative direction or Y-axis positive or negative direction is applied, any of the four peripheral domed structures 30-1 through 30-4 is inverted, the lower surface in the vicinity of the apex of the structure comes into contact with the contacting electrodes E41 through E44, and therefore, any of the four pairs of the contacting electrodes change into an electrical conductive condition. Therefore, as a detection circuit, when any of the paired contacting electrodes of the four switching elements change into an electrical conductive condition, operation in the detection mode is carried out, and when all the paired electrodes are in an insulated condition, operation in the standby mode is carried out.

In this embodiment, the central domed structure 30-0 is used for only detecting clicking input, and does not serve as a switching element. Therefore, even when the central domed structure 30-0 is inverted and the electrodes E40 and E49 change into an electrical conductive condition, a clicking input is only detected, and the detection circuit maintains the standby mode.

(6) Construction of the Domed Structure

In the several above-mentioned embodiments, the domed structures 30 are used. In these embodiments, metal domes are used as the domed structures 30. Metal domes are convenient since all surfaces thereof serve as conductive contacting surfaces 31. Of course, it is not always necessary that the domed structures 30 are made of metal. For example, it is also allowable that the domed structures are made of resins and the like, and conductive material films are adhered to necessary portions of the surfaces of the structures to form conductive contacting surfaces.

A first reason for forming the conductive contacting surface on the surface of the domed structure 30 is in order to cause the surface to function as a mediating electrode to electrically connect a pair of contacting electrodes. For example, all the five domed structures 30-0 through 30-4 shown in FIG. 29 function as a mediating electrode to connect a pair of contacting electrodes positioned below (a washer-shaped electrode and a circular electrode inside the washer-shaped electrode), whereby, when inversion is caused by action of an external force, the pair of contacting electrodes can be made to be electrically connected. In order to perform such a function as mediating electrodes, it is necessary that conductive contacting surfaces 31 are formed from at least the lower surfaces in the vicinities of the apexes of the domed structures 30 (portion to be contacted with the circular contacting electrode) to the bottom circumferential surfaces (portion to be contacted with the washer-shaped contacting electrode). If domed structures 30 with such construction are used as mediating electrodes, the mediating electrodes normally maintain a contacted condition with only one of the contacting electrodes, and when an external force with a predetermined strength or more is applied, due to inversion of the domed structures 30, the structures are contacted with both of the pair of contacting electrodes, simultaneously.

Needless to say, when the pair of contacting electrodes are similar to the contacting electrodes E26 and E27 shown in FIG. 24, formation of a conductive contacting surface 31 on the lower surface (portion to be contacted with the contacting electrodes E26 and E27) in the vicinity of the apex of the domed structure 30 is sufficient. If such a domed structure 30 is used as a mediating electrode, this mediating electrode normally maintains a condition where the electrode is contacted with neither of the pair of contacting electrodes, and when an external force with a predetermined strength or more is applied, due to inversion of the domed structure 30, comes into contact with both of the pair of contacting electrodes, simultaneously.

The second reason for forming the conductive contacting surface on the surfaces of the domed structure 30 is to perform a wiring function for the capacitance elements by making the displacing conductive layer 26 formed on the elastic deformable body (a portion of which functions as a detecting displacing electrode) and the contacting electrodes formed on the substrate to be electrically connected. The elastic deformable body 20 is a component which elastically deforms, so that it is not preferable that wiring is laid on the elastic deformable body 20. Therefore, it is not preferable that external wiring is connected to the displacing conductive layer formed at the elastic deformable body side. Accordingly, in the above-mentioned embodiments, no wiring is laid at the displacing conductive layer 26 and the layer is electrically floated. However, the displacing conductive layer 26 is an element comprising electrodes at one side of each capacitance element, so that when detecting the capacitance values, the detection system requires some wiring. The domed structure 30 can be caused to perform this wiring role. For example, in the device shown in FIG. 30, when an operational input Fx+ with a predetermined strength or more in the X-axis positive direction is applied to the operation panel 10, due to inversion of the peripheral domed structure 30-1 serving as a mediating electrode, the pair of contacting electrodes E41 and E45 become electrically connected. At this time, if the domed structure 30-1 is made of metal, the displacing conductive layer 26 formed on the bottom surface of the peripheral columnar projection P5 becomes electrically connected to the pair of contacting electrodes E41 and E45 via the domed structure 30, so that wiring for the displacing conductive layer 26 is secured. In actuality, for example, if the contacting electrode E45 is connected to a ground level, the displacing conductive layer 26 can be fixed to the ground level, so that the capacitance values between the ground level and detecting fixed electrodes may be detected.

In order for the domed structure 30 to perform such a wiring function, it is simplest that the entire domed structure is formed of metal. However, when the domed structure is made of a resin or the like, it is necessary that a portion of the surface is formed of a conductive material such as a conductive film, so that at least the upper and lower surfaces in the vicinity of the apex of the structure are in an electrical conductive condition.

(7) Modified Example of a Pair of Contacting Electrodes

In the aforementioned embodiments, both of a pair of contacting electrodes included in a switching element are formed on the substrate, and a mediating electrode is brought into contact with both of the pair of contacting electrodes, simultaneously, whereby the pair of contacting electrodes are made to be in an electrical connected condition. However, to carry out this invention, it is not always necessary that the pair of contacting electrodes are provided at the substrate side and a mediating electrode is used. For example, it is also allowable that a pair of contacting electrodes are comprised of a contacting fixed electrode formed on the substrate and a contacting displacing electrode formed at the elastic deformable body side, and when an external force with a predetermined strength or more is applied to the elastic deformable body, due to deformation of this elastic deformable body, the contacting fixed electrode formed on the substrate and the contacting displacing electrode formed on the elastic deformable body are physically contacted with each other.

However, to electrically detect whether or not the contacting fixed electrode formed on the substrate and the contacting displacing electrode formed on the elastic deformable body are physically contacted with each other, wiring is necessary for the respective electrodes. For practical use, it is not preferable that wiring is laid at the elastic deformable body side. Therefore, in practical use, as in the above-mentioned embodiments, it is preferable that a pair of contacting electrodes are provided on the substrate and the electrodes are made electrically connected to each other by using the mediating electrode. If such a method is employed, wiring is unnecessary at the mediating electrode side, so that if wiring is laid at only the substrate side, it becomes unnecessary to lay wiring at the elastic deformable body side.

(8) Modified Example of the Detection Circuit

In the abovementioned embodiments, a C/V converter circuit or C/f converter circuit is used as a detection circuit, however, the detection circuit to be used to carry out the invention is not limited to a circuit using these circuits, and any type circuit may be used only if the detection circuit has a function for detecting a capacitance value of a capacitance element, which is comprised of a detecting fixed electrode formed on the substrate and a detecting displacing electrode formed on the elastic deformable body, as an electric signal. Although the detection mode and the standby mode are prepared for the C/V converter circuit 50 in the above-mentioned embodiments, the portion to operate in the two modes may be any portion of the detection circuit. The point is that the detection circuit can perform, as a whole, operation in the two modes, that is, in the detection mode in which a detection function for detecting a capacitance value of a capacitance element as an electric signal, and in the standby mode in which a standby condition before transition to the detection mode can be maintained with power consumption less than in the detection mode although the detection function cannot be performed. Herein, in the standby mode, it is not always necessary that some operation is being carried out, and if a change into the detection mode is possible based on changes in the condition of the switching element, the completely stopped condition of the circuit does not pose a problem. For example, a method may be employed in which a condition where power supply to the detection circuit is completely stopped is defined as a standby mode, and when the status of the switching element is changed, power supply is started and changeover into the detection mode is carried out. The switching element in the invention may employ any construction only if the switching element can change the electrical conductive condition between the pair of contacting electrodes to carry out switchover from the standby mode to the detection mode or switchover from the detection mode to the standby mode.

Figure 31:
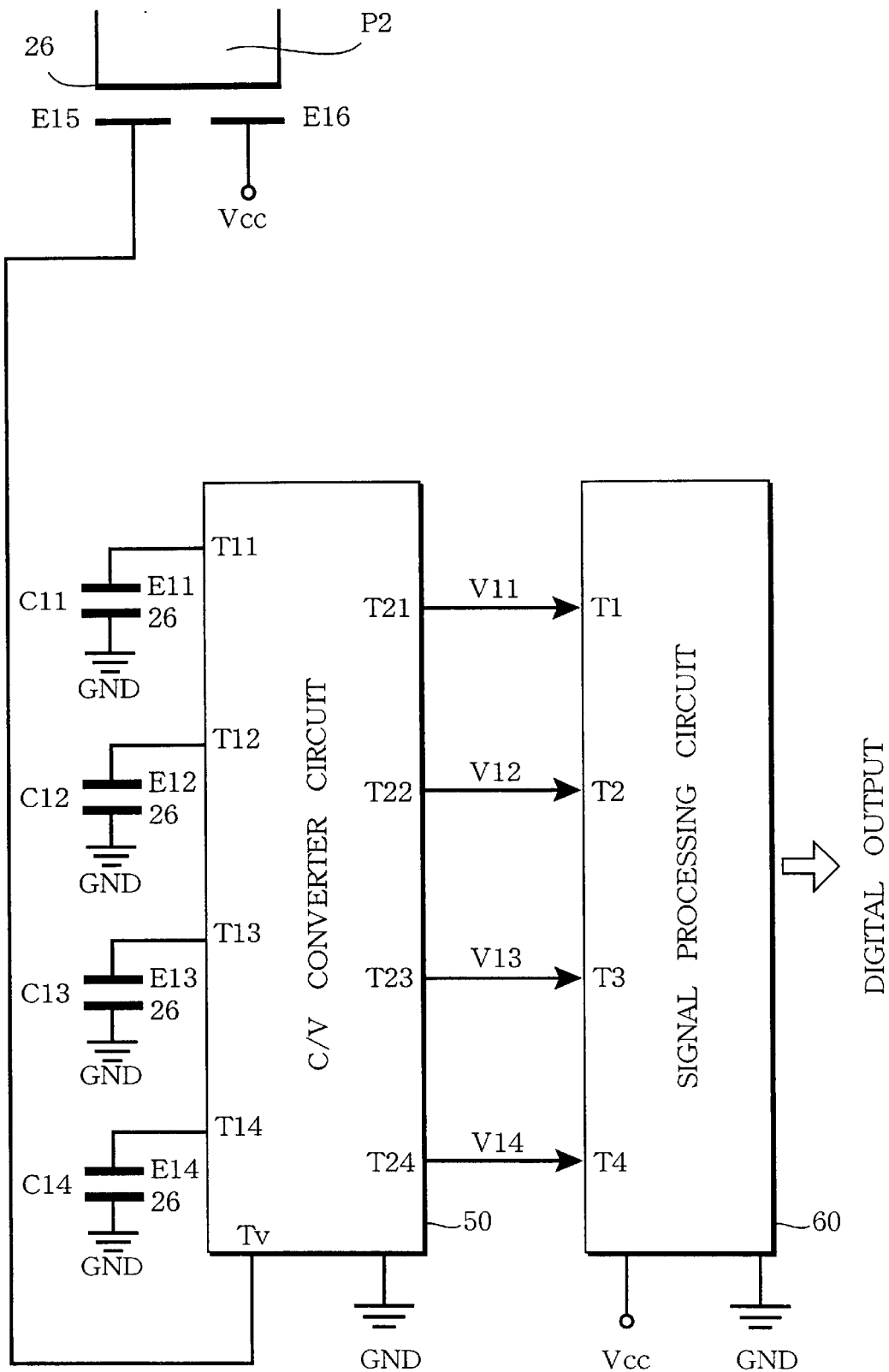
FIG. 31 is a circuit diagram showing still another modified example of the detector circuit shown in FIG. 17.

FIG. 31 is a circuit diagram showing still another modified example of the detection circuit shown in FIG. 17. As with the circuit shown in FIG. 17, the basic components of the circuit of this modified example are C/V converter circuit 50 and signal processing circuit 60, and basic operations of these are the same as with the circuit of FIG. 17. However, although a control signal from the terminal T6 of the signal processing circuit 60 is supplied to the control terminal T20 of the C/V converter circuit 50 to switch the mode of the C/V converter circuit 50 in the circuit shown in FIG. 17, in the circuit shown in FIG. 31, a method is employed in which power supply to the C/V converter circuit 50 is directly controlled based on the electrical contact condition of the pair of contacting electrodes comprising a switching element, that is, outside electrodes E15 and E16. Concretely, as illustrated, the power supply voltage Vcc is connected to the outside electrode E16, and the outside electrode E15 is connected to the power supply terminal Tv of the C/V converter circuit 50. By such a construction, the power supply voltage Vcc is not supplied to the outside electrode E15 until the displacing conductive layer 26 comes into contact with both outside electrodes E15 and E16, so that the power supply voltage Vcc is not supplied to the C/V converter circuit 50, either. That is, in this condition (standby condition), no power is supplied to the C/V converter circuit 50 at all, and intentional voltage outputs V11 through V14 which should be originally outputted are not outputted. Therefore, as a matter of course, since the C/V converter circuit 50 does not consume power, power consumption of the entire detection system can be significantly saved. However, when the displacing conductive layer 26 comes into contact with both of the outside electrodes E15 and E16, the power supply voltage Vcc is supplied to the power supply terminal Tv of the C/V converter circuit 50 via the outside electrode E15, and then, the C/V converter circuit 50 starts its original operation (detection mode).

(9) Modified Example using Variable Resistance Elements

In all the above-mentioned embodiments, applied forces are detected based on changes in the capacitance values of the capacitance elements, however, the invention can be carried out even when variable resistance elements are used in place of the capacitance elements. Herein, a modified example of the invention using variable resistance elements is explained.

Figure 32:
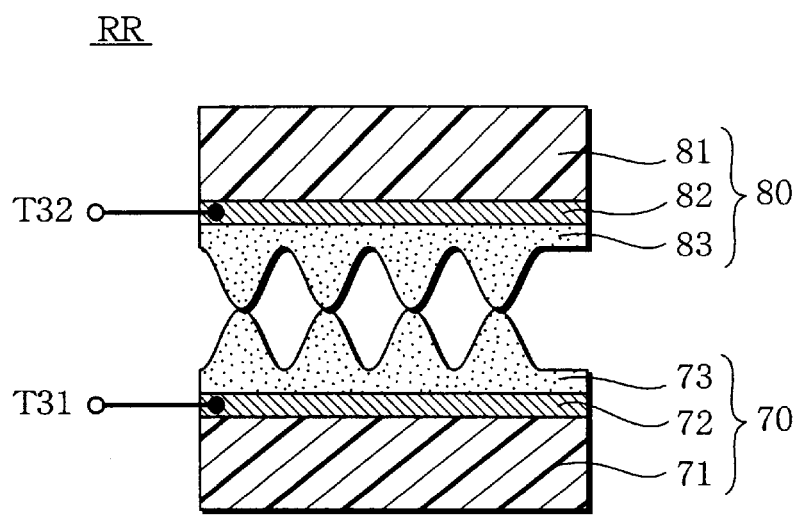
FIG. 32 is a side sectional view showing an example in which variable resistance element RR is comprised of a pair of resistors 73 and 83 having waved uneven structures on the surfaces.

First, the detailed structure of a variable resistance element used in this modified example is explained. FIG. 32 is a side sectional view showing the construction of a variable resistance element RR. The variable resistance element RR shown herein has a structure in which a first sheet 70 and a second. sheet 80 are laminated so as to be vertically symmetric. The first sheet 70 is comprised of, as illustrated, a first film 71, a first conductive layer 72 formed thereon, and a first resistor 73 further formed thereon. The second sheet 80 is comprised of, as illustrated, a second film 81, a second conductive layer 82 formed thereon, and a second resistor 83 further formed thereon. For description convenience, the qualifiers "first" and "second" attached herein to the components are for distinguishing the two sheets, and the actual structures of the first sheet 70 and the second sheet 80 are completely the same. Therefore, if one of the two similar sheets is turned upside down and then overlapped onto the other one, a variable resistance element RR is obtained. In practical use, it is preferable that both sheets are adhered by some method so as not to move.

Figure 33:
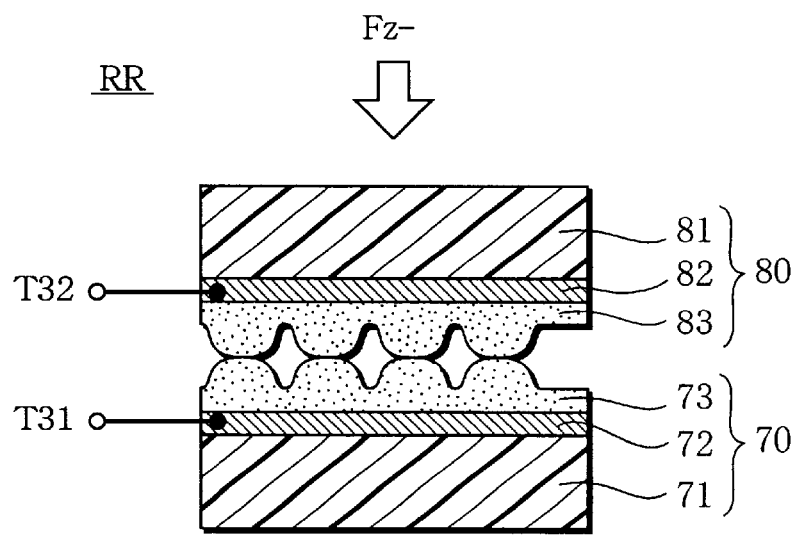
FIG. 33 is a side sectional view showing a deformed condition where a pressure −Fz is applied to the variable resistance element RR shown in FIG. 32.

Both of the first resistor 73 and second resistor 83 are formed with a material which elastically deforms, and opposed to each other. The upper surface of the first resistor 73 and the lower surface of the second resistor 83 are uneven so as to have waved sections, and in response to a pressure applied vertically in the figure, the area of the contact surface between the first resistor 73 and second resistor 83 changes. That is, in a condition where a vertical pressure is not applied to this variable resistance element RR, as shown in FIG. 32, the apex points of the waved uneven structures of the resistors 73 and 83 are contacted with each other, and the area of the contacting surface between them is very small. However, for example, when an external downward force Fz– is applied to the variable resistance element RR as shown in FIG. 33, the portions with the waved uneven structures of the resistors 73 and 83 deform due to pressure as illustrated, and the contacting area between them increases.

Since the first conductive layer 72 is connected to the lower surface of the first resistor 73, and the second conductive layer 82 is connected to the upper surface of the second resistor 83, when the resistance value between the terminal T31 connected to the first conductive layer 72 and the terminal T32 connected to the second conductive layer 82 is measured, the resistance value changes depending on the contacting area between them. Therefore, based on this resistance value, the external vertical force applied to the variable resistance element RR can be detected. That is, the two sheets 70 and 80 function as a variable resistance element RR with a property of changing in resistance between two predetermined points in accordance with applied pressures.

In practical use, for example, the following method may be employed to manufacture the first sheet 70. First, a first film 71 formed of an FPC (flexible print circuit) film is prepared, and a layer of copper or the like is formed on the upper surface to form a first conductive layer 72. Subsequently, pressure sensitive conductive ink is applied on the upper surface of the first conductive layer 72, and the surface of this pressure sensitive conductive ink is processed to have an uneven structure with a waved section, whereby a first resistor 73 made of the pressure sensitive conductive ink may be manufactured. Of course, the second sheet 80 can be manufactured by the same method. In the illustrated example, uneven structures with waved sections are formed at the upper surface of the first resistor 73 and the lower surface of the second resistor 83, however, such an uneven structure is not always necessary for both the resistors, and if at least one of them has a surface with this structure, a variable resistance element can be constructed. The point is that at least a surface of either one of the first resistor 73 and the second resistor 83, opposed to the other resistor, may have an uneven structure to elastically deform so that the area of the contact surface between the resistors changes in accordance with pressures applied to them.

Figure 34:
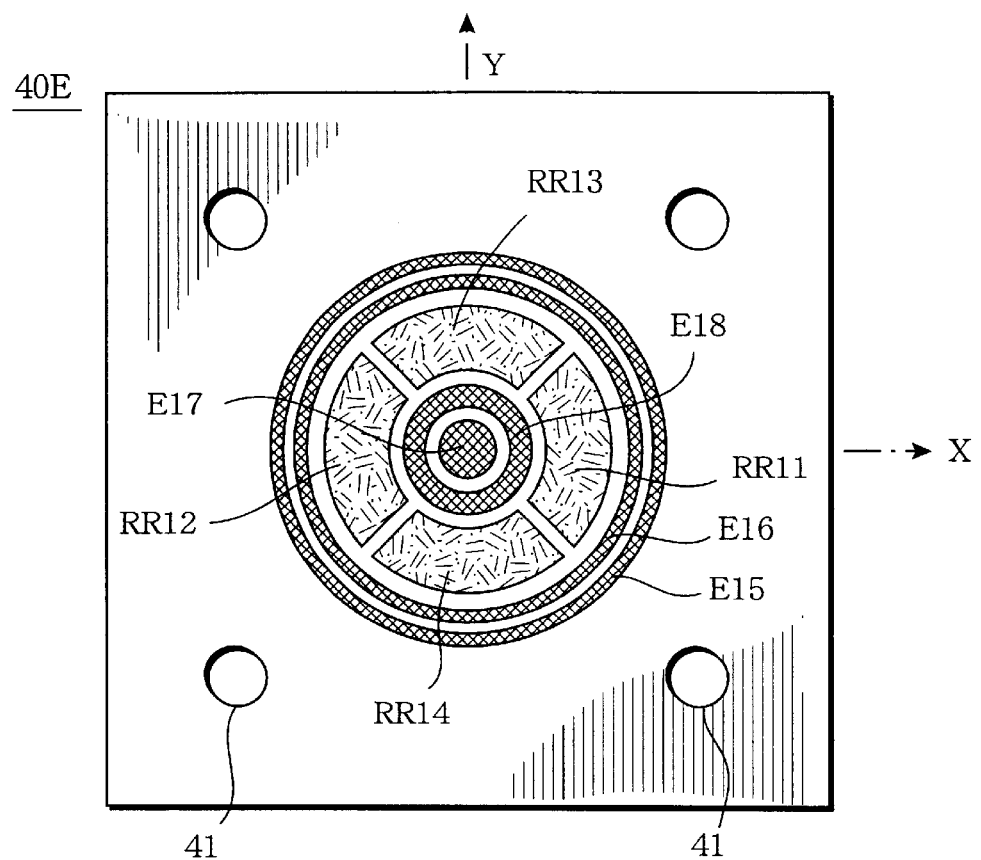
FIG. 34 is a top view of substrate 40E constructed by disposing variable resistance elements RR11 through RR44 in place of the electrodes E11 through E14 on the substrate 40 shown in FIG. 10.

The variable resistance element RR shown in FIG. 32 may be used in place of, for example, the capacitance element in the force detector of FIG. 1. In this case, the four electrodes E11 through E14 formed on the substrate 40 shown in FIG. 10 may be replaced with the above-mentioned variable resistance elements RR to form the substrate 40E shown in the top view of FIG. 34. Concretely, four variable resistance elements RR11 through RR14 plane forms of which are fan-shaped as the electrodes E11 through E14 of FIG. 10 and which have the side sectional structures as shown in FIG. 32 are prepared, and adhered to predetermined positions on the substrate 40E (the lower surface of the first film 71 may be adhered to the upper surface of the substrate 40E), whereby the four variable resistance elements RR11 through RR14 perform a function equivalent to that of the four capacitance elements C11 through C14. However, an applied external force is to be detected in relation to the variable resistance elements RR11 through RR14 based on the resistance value between the terminals T31 and T32 shown in FIG. 32. In short, detection using changes in resistance of the variable resistance elements in place of changes in capacitance value of the capacitance elements becomes possible.

The variable resistance elements RR11 through RR14 can be manufactured to be very thin sheet members, so that the side sectional structure of the force detector using the four variable resistance elements RR11 through RR14 in place of the four electrodes E11 through E14 becomes almost equal to that of the force detector shown in FIG. 12. However, in the case of the force detector of FIG. 12, although the capacitance elements are composed of combinations of the four electrodes E11 through E14 and conductive layer (displacing conductive layer 26 shown in FIG. 7) opposed to the electrodes, the variable resistance elements RR shown in FIG. 32 function as variable resistance elements by themselves, and therefore, in the device of the modified example described herein, the columnar projections P1 may only perform the function as projections for applying pressure, and it is not necessary that the displacing conductive layer 26 is provided on the lower surfaces of the columnar projections P1.

Figure 35:
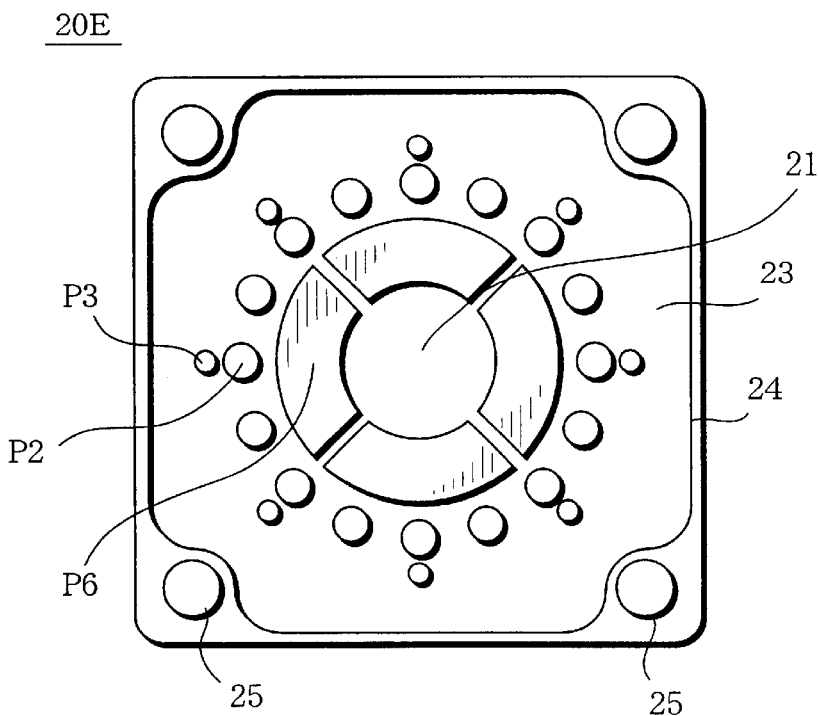
FIG. 35 is a bottom view of elastic deformable body 20E suitable for a case using the substrate 40E shown in FIG. 34.
Figure 36:
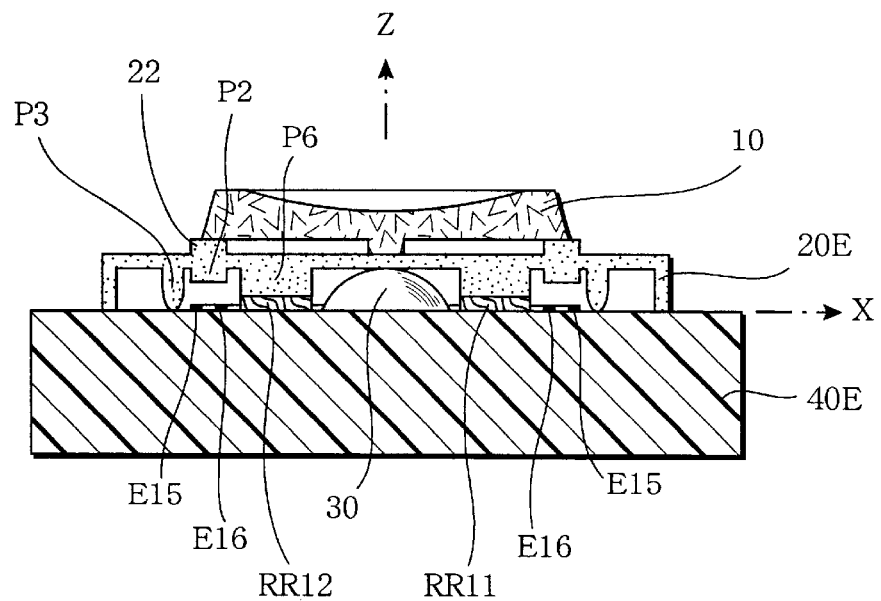
FIG. 36 is a side sectional view of a force detector comprising the substrate 40E of FIG. 34 and the elastic deformable body 20E of FIG. 35, wherein the domed structure 30 is not shown in a sectional view, but shown in a side view.

When the columnar projections P1 shown in FIG. 5 are caused to function as projections for applying pressure, pressure concentrates in the vicinity of the center of the upper surface of the variable resistance element RR shown in FIG. 32, so that occurrence of deformation inclines toward the vicinities of the centers of the resistors 73 and 83, and therefore, an efficient detection sensitivity cannot be obtained. Therefore, as shown in FIG. 33, in order to cause deformation of the resistors 73 and 83 to evenly occur on the entire surfaces and improve the detection sensitivity, in place of the elastic deformable body 20 shown in FIG. 5, the elastic deformable body 20E, a bottom view of which is shown in FIG. 35, may be used. This elastic deformable body 20E shown in FIG. 35 is formed so that the eight columnar projections P1 of the elastic deformable body 20 shown in FIG. 5 are replaced by four plate projections P6. The plane forms of the plate projections P6 are fan-shaped similar to the shapes of the four variable resistance elements RR11 through RR14 formed on the substrate 40E, and are disposed above these resistance elements. In addition, it is not necessary to form a conductive layer on the lower surface of each plate projection P6. FIG. 36 is a side sectional view showing a modified example in which a substrate 40E including four variable resistance elements RR11 through RR14 in place of the four electrodes E11 through E14 is used in the force detector shown in FIG. 12, and the elastic deformable body 20 is replaced with the elastic deformable body 20E shown in FIG. 35. All the variable resistance elements RR11 through RR14 have the same sectional structure as that of the variable resistance element RR shown in FIG. 32, and, a pressure is applied to the entire surfaces of the variable resistance elements through the plate projections P6 disposed above. Therefore, a more efficient detection sensitivity can be obtained.

In FIG. 35, an example in which four fan-shaped plate projections P6 are formed is shown, and these projections may be joined with each other to form a single washer-shaped plate projection as a whole. The variable resistance elements RR11 through RR14 may also be arranged so that the portions of the film 71 and film 81 are joined with each other and four fan-shaped conductive layers and resistors are formed on the single film which is washer-shaped as a whole. Furthermore, in the above-mentioned explanation, all the variable resistance elements RR are fixed to the substrate 40E side, however, it is also allowable that, among the variable resistance elements RR, the first sheet 70 is fixed to the substrate 40E side (the first film 71 is adhered to the upper surface of the substrate 40E), and the second sheet 80 is fixed to the plate projection P6 side (elastic deformable body 20E side/the second film 81 is adhered to the lower surface of the plate projection P6).

Figure 37:
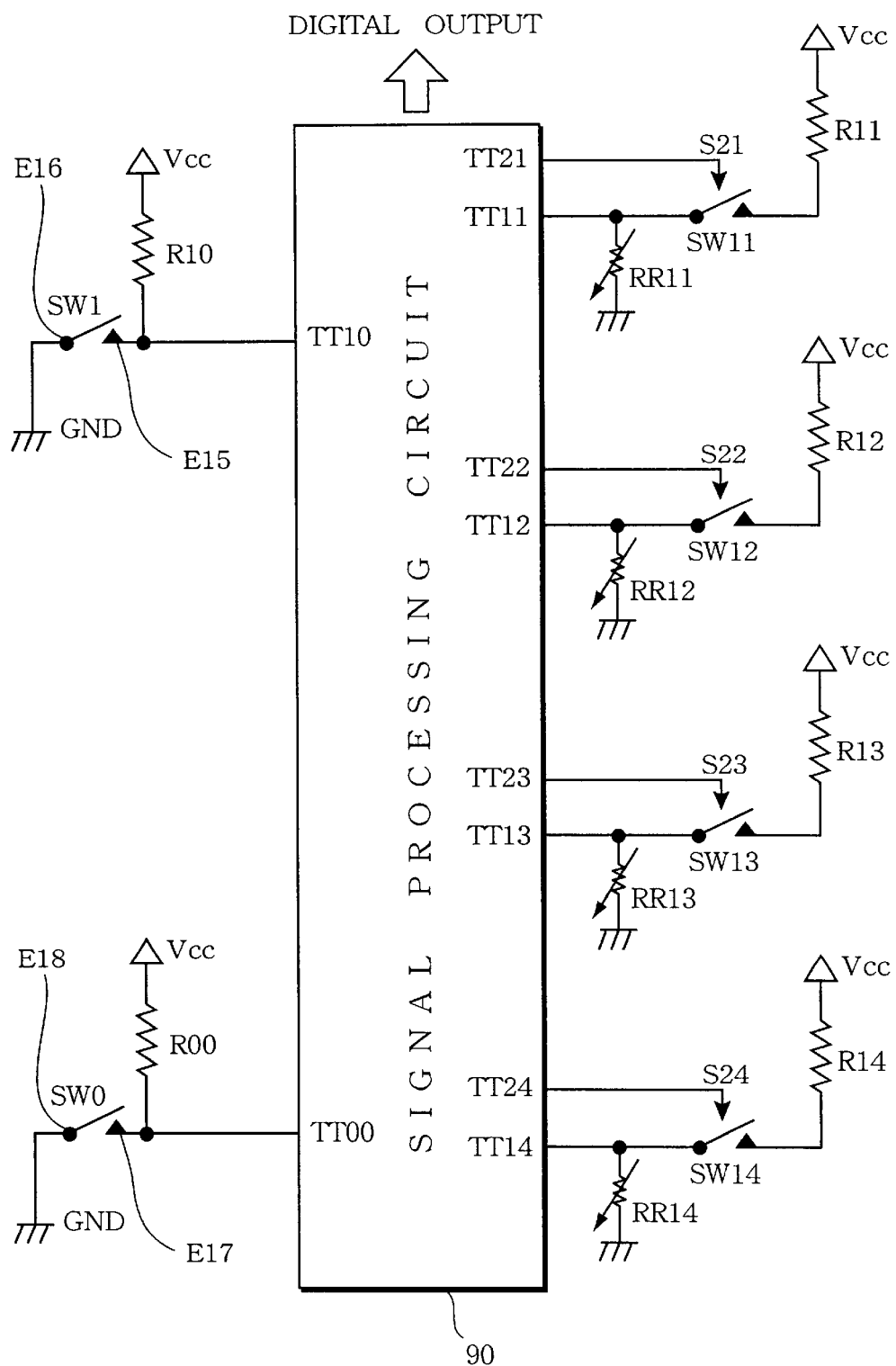
FIG. 37 is a circuit diagram showing an example of a detector circuit to be used for the force detector of FIG. 36.

FIG. 37 is a circuit diagram showing an example of a detection circuit which can be used for the force detector shown in FIG. 36. This detection circuit comprises signal processing circuit 90 with analog signal input terminals, wherein an inputted analog signal is converted into a digital signal, and a predetermined operation with respect to the digital signal is executed inside, whereby an output as a digital signal is obtained. This signal processing circuit 90 is also constructed as a one-chip integrated circuit, and analog voltage values equivalent to the resistance values of the variable resistance elements RR11 through RR14 are inputted to analog input terminals TT11 through TT14 shown on the right of the figure. The lower ends of each variable resistance element RR11 through RR14 are grounded, and the upper ends are connected to the analog input terminals TT11 through TT14 and connected to the power supply voltage Vcc via switches SW11 through SW14 and resistors R11 through R14.

When the switches SW11 through SW14 are turned on, a voltage is applied from the power supply Vcc to the variable resistance elements RR11 through RR14, and respective voltages determined by the resistance values of the variable resistance elements RR11 through RR14 are applied to the analog input terminals TT11 through TT14, whereby digital values in accordance with the resistance values are obtained. The inputted operation amount in the X-axis direction can be determined based on the resistance value of the variable resistance element RR11 or RR12 (or the difference in the resistance value between them), and the inputted operation amount in the Y-axis direction can be determined based on the resistance value of the variable resistance element RR13 or RR14 (or the difference in the resistance value between them).

The switches SW11 through SW14 are switches for controlling voltage supply to the variable resistance elements, and while all the switches SW11 through SW14 maintain OFF conditions, the voltage of the power supply Vcc is not applied to the variable resistance elements and a current does not flow into the variable resistance elements. This indicates that the signal processing circuit 90 is in the standby mode. On the other hand, when any of the switches SW11 through SW14 are turned on, the voltage of the power supply Vcc is applied to the variable resistance element connected to the switch that has been turned on, whereby a current is caused to flow into the variable resistance element. Therefore, as mentioned above, a digital value corresponding to the resistance value of the variable resistance element is detected. This indicates that the signal processing circuit 90 is in the detection mode.

The ON/OFF control of the switches SW11 through SW14 is carried out in accordance with control signals S21 through S24 outputted from control terminals TT21 through TT24. In actuality, the switches SW11 through SW14 are comprised of semiconductor switches such as logical elements or the like, and the control signals S21 through S24 become digital logical signals. The signal processing circuit 90 has a CPU and a program for operating the CPU that are installed inside, and the logical values of the control signals S21 through S24 are determined by logical operations at the CPU.

To the input terminal TT10 on the left in FIG. 37, the power supply voltage Vcc or ground voltage is applied in accordance with the ON/OFF condition of the switch SW1. That is, when the switch SW1 is in an OFF condition, the power supply voltage Vcc is applied to the input terminal TT10 via the resistor R10, however, when the switch SW1 is turned on, the input terminal TT10 turns to the ground potential. Therefore, the signal processing circuit 90 can recognize the ON/OFF conditions of the switch SW1 based on the potential of the input terminal TT10.

This switch SW1 is comprised of, in reality, in the force detector shown in FIG. 36, the outside electrodes E15 and E16 (a pair of contacting electrodes) formed on the substrate 40E, and when the outside electrodes E15 and E16 are insulated, the switch SW1 is turned off, and when the electrodes are in an electrical conductive condition, the switch SW1 is turned on. Therefore, for example, in the condition shown in FIG. 36 (where a predetermined operation amount or more in the X-axis direction or Y-axis direction is not inputted), the switch SW1 is turned off, however, in a condition where a bottom conductive layer of the columnar projections P2 for electrodes come into contact with the outside electrodes E15 and E16 (a predetermined operation amount or more in the X-axis direction or Y-axis direction is inputted), the switch SW1 is turned on.

Thus, the signal processing circuit shown in FIG. 37 carries out controls so that, when the potential of the input terminal TT10 is the power supply voltage Vcc (the switch SW1 is in an OFF condition), control signals S21 through S24 for turning the switches SW11 through SW14 off are outputted from the control terminals TT21 through TT24, and when the potential of the input terminal TT10 is the ground potential (the switch SW1 is in an ON condition), control signals S21 through S24 for turning the switches SW11 through SW14 on are outputted from the control terminals T21 through T24. Thereby, only when a predetermined operation amount or more containing an X-axis directional or Y-axis directional component is inputted, a current is caused to flow into the variable resistance elements RR11 through RR14, whereby detection becomes possible. As a result, the standby mode in which the detection circuit cannot perform the original detection function is maintained until the switch SW1 is turned on, so that power consumption is saved.

On the other hand, to the input terminal TT00 shown on the left in FIG. 37, in accordance with the ON/OFF conditions of the switch SW0, the power supply voltage Vcc or ground voltage is applied. That is, when the switch SW0 is in an OFF condition, the power supply voltage Vcc is applied to the input terminal TT00 via the resistor R00, however, when the switch SW0 is turned on, the input terminal TT00 turns to the ground potential. Therefore, the signal processing circuit can recognize the ON/OFF conditions of the switch SW0 based on the potential of the input terminal TT00. This switch SW0 is, in reality, a switch comprised of the inside electrodes E17 and E18 (see FIG. 34) formed on the substrate 40E in the force detector shown in FIG. 36, and is turned off when the inside electrodes E17 and E18 are insulated, and turned on when the electrodes are in an electrical conductive condition. Therefore, the ON/OFF conditions of the switch SW0 indicate a switching input (clicking input according to the shape inversion of the domed structure 30) made by an operator.

(10) Other Modified Examples

In the above-mentioned embodiments, examples in which force detectors relating to the invention are used as input devices for electronic apparatuses are explained. However, the purpose of the force detectors of the invention is not limited to these input devices, and as a matter of course, they can also be used for detectors to be used for controlling robots and industrial machinery. If the operation panel is replaced by a weight body so that a force applied to the weight body is detected based on the acceleration, the force detector may be used as an acceleration detector. In this case, unless a predetermined or higher acceleration is applied, the detection circuit is in the standby mode, so that power consumption can be saved.

As described above, according to the invention, a force detector which can efficiently suppress power consumption can be realized.

What is claimed is:

1. A force detector having a function for detecting a strength of an applied external force, comprising:

a substrate, an upper surface of said substrate being included in an XY-plane of an XYZ three-dimensional coordinate system having an X-axis, a Y-axis and a Z-axis;

an elastic deformable body which is disposed at a position opposed to the substrate, at least a portion of said elastic deformable body being made of material having elastic deformability, and said elastic deformable body displacing with respect to the substrate due to an elastic deformation caused by the applied external force;

a first force detecting element disposed between said substrate and said elastic deformable body at a position on an X-axis positive region and changes in a predetermined electrical characteristic due to a displacement of said elastic deformable body;

a first switching element located at a position outside of said first force detecting element on said X-axis positive region, said first switching element including a first pair of contacting electrodes and carrying out a switching function so that an electrical insulated condition is normally maintained between said first pair of contacting electrodes, and when an external force with more than a predetermined strength with respect to said X-axis positive region is applied to said elastic deformable body, an electrical conductive condition is obtained between said first pair of contacting electrodes in response to a deformation of said elastic deformable body;

a second force detecting element disposed between said substrate and said elastic deformable body at a position on an X-axis negative region and changes in a predetermined electrical characteristic due to a displacement of said elastic deformable body;

a second switching element located at a position outside of said second force detecting element on said X-axis negative region, said second switching element including a second pair of contacting electrodes and carrying out a switching function so that an electrical insulated condition is normally maintained between said second pair of contacting electrodes, and when an external force with more than a predetermined strength with respect to said X-axis negative region is applied to said elastic deformable body, an electrical conductive condition is obtained between said second pair of contacting electrodes in response to a deformation of said elastic deformable body;

a third force detecting element disposed between said substrate and said elastic deformable body at a position on an Y-axis positive region and changes in a predetermined electrical characteristic due to a displacement of said elastic deformable body;

a third switching element located at a position outside of said third force detecting element on said Y-axis positive region, said third switching element including a third pair of contacting electrodes and carrying out a switching function so that an electrical insulated condition is normally maintained between said third pair of contacting electrodes, and when an external force with more than a predetermined strength with respect to said Y-axis positive region is applied to said elastic deformable body, an electrical conductive condition is obtained between said third pair of contacting electrodes in response to a deformation of said elastic deformable body;

a fourth force detecting element disposed between said substrate and said elastic deformable body at a position on an Y-axis negative region and changes in a predetermined electrical characteristic due to a displacement of said elastic deformable body;

a fourth switching element located at a position outside of said second force detecting element on said Y-axis negative region, said fourth switching element including a fourth pair of contacting electrodes and carrying out a switching function so that an electrical insulated condition is normally maintained between said fourth pair of contacting electrodes, and when an external force with more than a predetermined strength with respect to said Y-axis negative region is applied to said elastic deformable body, an electrical conductive condition is obtained between said fourth pair of contacting electrodes in response to a deformation of said elastic deformable body;

wherein an electrical characteristic of said first to fourth force detecting elements is detected as an electric signal, when an electrical conductive condition is obtained on at least one of said first to fourth pairs of contacting electrodes.

2. A force detector according to claim 1:

wherein a pair of contacting electrodes included in a switching element are comprised of a contacting fixed electrode disposed on the substrate and a contacting displacing electrode disposed on the elastic deformable body, and when an external force with more than a predetermined strength is applied to the elastic deformable body, due to a deformation of the elastic deformable body, said contacting displacing electrode comes into physical contact with said contacting fixed electrode.

3. A force detector according to claim 1:

wherein a switching element includes a pair of contacting electrodes disposed on the substrate and a mediating electrode which comes into a condition to contact with both of said pair of contacting electrodes to make an electrical conductive condition between said pair of contacting electrodes, and wherein said mediating electrode is disposed so that said mediating electrode is normally maintained to be contacted with neither of said pair of contacting electrodes, or contacted with either one of the said pair of contacting electrodes, and when an external force with more than a predetermined strength is applied to the elastic deformable body, due to a deformation of the elastic deformable body, said mediating electrode comes into a condition to contact with both of said pair of contacting electrodes.

4. A force detector according to claim 3:

wherein the mediating electrode is formed at a position at which a deformation of the elastic deformable body occurs.

5. A force detector according to claim 4:

wherein a first ring-shaped electrode and a second ring-shaped electrode are provided on the substrate, the second ring-shaped electrode being disposed adjacent to and outside the first ring-shaped electrode, the first pair of contacting electrodes are constituted by a part of said first ring-shaped electrode and a part of said second ring-shaped electrode positioned on the X-axis positive region, the second pair of contacting electrodes are constituted by a part of said first ring-shaped electrode and a part of said second ring-shaped electrode positioned on the X-axis negative region, the third pair of contacting electrodes are constituted by a part of said first ring-shaped electrode and a part of said second ring-shaped electrode positioned on the Y-axis positive region, and the fourth pair of contacting electrodes are constituted by a part of said first ring-shaped electrode and a part of said second ring-shaped electrode positioned on the Y-axis negative region, and a mediating electrode is disposed at a position so as to be able to be contacted with both said first ring-shaped electrode and said second ring-shaped electrode.

6. A force detector according to claim 4:

wherein a plural number N of electrodes belonging to a first group and a plural number N of electrodes belonging to a second group are arranged on the substrate outside of the first to fourth force detecting elements so that the i-th electrode ($1 \leq i \leq N$) belonging to the first group and the i-th electrode belonging to the second group are adjacent to each other, the respective first to fourth pairs of contacting electrodes are constituted by an electrode belonging to the first group and an electrode belonging to the second group which are adjacent to each other, and an electrical characteristic of said first to fourth force detecting elements is detected as an electric signal, when an electrical conductive condition is obtained between an electrode belonging to the first group and an adjacent electrode belonging to the second group.

7. A force detector according to claim 6:

wherein electrodes belonging to the first group and electrodes belonging to the second group are alternately disposed along a circumference defined on the substrate, and the mediating electrode is disposed along a circumference on the elastic deformable body opposed to said circumference defined on the substrate.

8. A force detector according to claim 3:

wherein a fifth switching element located at a position of an origin of the XYZ three-dimensional coordinate system is provided, said fifth switching element including a fifth pair of contacting electrodes on the substrate, and a domed structure is provided and disposed turned down in a vicinity of said fifth pair of contacting electrodes on the substrate, said domed structure having a property whereby a vicinity of an apex elastically deforms to be convex downward when a downward pressing force with more than predetermined strength is applied to a vicinity of said apex, and having a conductive contacting surface which is used as a mediating electrode so that, when an external force with more than the predetermined strength is applied to the elastic deformable body, a shape of said domed structure is inverted due to a deformation of the elastic deformable body, and said conductive contacting surface comes into a condition to contact with both of said fifth pair of contacting electrodes.

9. A force detector according to claim 8:

wherein the mediating electrode is comprised of a conductive contacting surface which extends from a lower surface part of an apex of the domed structure to a bottom circumferential part of the domed structure, one electrode among the fifth pair of contacting electrodes being disposed at a position to be contacted with said bottom circumferential part of the domed structure, another electrode among the fifth pair of contacting electrodes being disposed at a center of the domed structure, and wherein said mediating electrode normally maintains a contacted condition with only said one electrode, and comes into a condition to contact with both of said fifth pair of contacting electrodes due to a shape inversion of the domed structure when an external force with more than a predetermined strength is applied to the elastic deformable body.

10. A force detector according to claim 8:
wherein the fifth pair of contacting electrodes are disposed in a region surrounded by a bottom circumferential surface of the domed structure, the mediating electrode comprised of a conductive contacting surface formed on a lower surface of an apex of the domed structure normally maintains non-contact condition to be contacted with neither of the fifth pair of contacting electrodes, and when an external force with more than a predetermined strength is applied to the elastic deformable body, the mediating electrode comes into a condition to contact with both of the fifth pair of contacting electrodes due to a deformation of the elastic deformable body.

11. A force detector according to claim 1:
wherein an operation panel made of a rigid material is attached to the elastic deformable body, and the elastic deformable body deforms based on an operational input applied to said operation panel.

12. A force detector according to claim 1:
wherein the elastic deformable body comprises a film portion disposed almost in parallel to an upper surface of the substrate, a side wall portion for fixing a surrounding of said film portion to said upper surface of the substrate, and columnar projections extending downward from a plurality of positions of a lower surface of said film portion, at least a part of said film portion and said columnar projections being made of elastic material.

13. A force detector according to claim 12:
wherein the elastic deformable body is made of an integrally-molded rubber.

14. An input device for an electronic apparatus for applying operational input indicating an operation amount in a predetermined direction to the electronic apparatus which executes particular processing based on a predetermined program, wherein said input device comprises a force detector according to claim 1, and handles an external force detected by the force detector as an operation amount.

15. A force detector according to claim 1:
the detector including a detection circuit for detecting a change in an electrical characteristic of the force detecting elements as an electric signal;
wherein said detection circuit selectively operates in two modes of a detection mode and a standby mode, said detection circuit performing a detecting function for outputting a change in said electrical characteristic as an electric signal when said detection circuit operates in said detection mode, said detection circuit maintaining a standby condition waiting for a transition to said detection mode without performing the detecting function when said detection circuit operates in said standby mode, a power consumption in said standby mode being less than a power consumption in said detection mode; and
wherein said standby mode is selected when all the electrical conditions of the first to fourth pairs of contacting electrodes are an insulated condition, and said detection mode is selected when an electrical condition of at least one of the first to fourth pairs of contacting electrodes is a conductive condition.

16. A force detector according to claim 15:
wherein a capacitance element is used as a force detecting element, and the detection circuit detects a capacitance value of said capacitance element as an electric signal, said capacitance element comprising a detecting fixed electrode provided on the substrate and a detecting displacing electrode provided at a position on the elastic deformable body which is opposed to said detecting fixed electrode and at which a displacement occurs.

17. A force detector according to claim 16:
wherein on a surface of at least either one of the detecting fixed electrode and the detecting displacing electrode, an insulating film is formed to prevent an electrical contact between said detecting fixed electrode and said detecting displacing electrode.

18. force detector according to claim 16:
wherein the detection circuit has a C/V converter circuit for converting a capacitance value C of the capacitance element into a voltage value V, and a control is carried out so that said C/V converter circuit is operated in the detection mode and is not operated in the standby mode.

19. A force detector according to claim 18:
wherein the C/V converter circuit comprises an oscillation circuit for supplying an AC signal to one of the electrodes comprising the capacitance element, and a switching circuit which causes said oscillation circuit to oscillate in the detection mode, and stop an oscillation of said oscillation circuit in the standby mode.

20. A force detector according to claim 16:
wherein the detection circuit has a C/f converter circuit for converting a capacitance value C of the capacitance element into a frequency f, and control is carried out so that said C/f converter circuit is operated in the detection mode and is not operated in the standby mode.

21. A force detector according to claim 16:
wherein the detecting displacing electrode is comprised of a conductive coating layer applied on a surface of an integrally molded rubber.

22. A force detector according to claim 15:
wherein a switching element includes a pair of contacting electrodes disposed on the substrate and a mediating electrode which comes into a condition to contact with both of said pair of contacting electrodes to make an electrical conductive condition between said pair of contacting electrodes,
wherein said mediating electrode is disposed so that said mediating electrode is normally maintained to be contacted with neither of said pair of contacting electrodes, or contacted with either one of said pair of contacting electrodes, and when an external force with more than a predetermined strength is applied to the elastic deformable body, due to a deformation of the elastic deformable body, said mediating electrode comes into a condition to contact with both of said pair of contacting electrodes to select the detection mode, and
wherein a capacitance element is used as a force detecting element, and the detection circuit detects a capacitance value of said capacitance element as an electric signal, said capacitance element comprising a detecting fixed electrode provided on the substrate and a detecting displacing electrode provided at a position on the elastic deformable body which is opposed to said detecting fixed electrode and at which a displacement occurs, the mediating electrode and said detecting displacing electrode being electrically connected, and the detection circuit has a function for detecting a capacitance value between a contacting electrode which is contacted with the mediating electrode and said detecting fixed electrode as a capacitance value of the capacitance element in the detection mode.

23. A force detector according to claim 15:

wherein a capacitance element is used as a force detecting element, and the detection circuit detects a capacitance value of said capacitance element as an electric signal, said capacitance element comprising a detecting fixed electrode provided on the substrate and a detecting displacing electrode provided at a position on the elastic deformable body which is opposed to said detecting fixed electrode and at which a displacement occurs, wherein a fifth switching element located at a position of an origin of the XYZ three-dimensional coordinate system is provided, said fifth switching element including a fifth pair of contacting electrodes on the substrate, wherein a domed structure is provided an disposed turned down in a vicinity of said fifth pair of contacting electrodes on the substrate, said domed structure having a property whereby a vicinity of an apex elastically deforms to be convexed downward when a downward pressing force with more than predetermined strength is applied to a vicinity of said apex, and having a conductive contacting surface which is used as a mediating electrode so that, when an external force with more than a predetermined strength is applied to the elastic deformable body, a shape of said domed structure is inverted due to a deformation of the elastic deformable body, and said conductive contacting surface comes into a condition to contact with both of said fifth pair of contacting electrodes to select the detection mode, and wherein at least an upper surface and a lower surface of a vicinity part of an apex of said domed structure are comprised of a conductive material and are electrically connected with each other, a mediating conductive layer electrically connected to said detecting displacing electrode is formed at a portion of the elastic deformable body to be contacted with a vicinity part of the apex of the domed structure, and the detection circuit has a function for detecting a capacitance value between one of said fifth pair of contacting electrodes which is electrically contacted with said mediating conductive layer via the domed structure and said detecting fixed electrode as a capacitance value of the capacitance element in the detection mode.

24. A force detector according to claim 15:

wherein a variable resistance element with a property by which a resistance value between two predetermined points changes depending on an applied pressure is used as a force detecting element, and the detection circuit detects a resistance value between said two points of said variable resistance element as an electric signal.

25. A force detector according to claim 24:

wherein a variable resistance element has a first resistor and a second resistor disposed at a position opposed to the first resistor, and a surface of at least one resistor of the first and second resistors, which is opposed to the other resistor, has an uneven structure to elastically deform, and a contact surface area between the first resistor and the second resistor changes in accordance with a pressure applied in response to an applied external force which is a detecting subject so that a resistance value between a predetermined point connected to the first resistor and a predetermined point connected to the second resistor changes in accordance with changes in said contact surface area.

26. A force detector according to claim 25:

wherein the first resistor and the second resistor are formed from a sensitive conductive ink.

27. A force detector according to claim 25:

wherein the detection circuit has a circuit for detecting a resistance value between the two points of the resistors by applying a voltage between said two points, and control is carried out so that the voltage is applied in the detection mode and is not applied in the standby mode.

28. A force detector according to claim 27:

wherein an electrical conductive/insulated condition between the pair of contacting electrodes comprising a switching element is used as an ON/OFF switch to apply a voltage to the two points of the resistors.

29. A force detector according to claim 15 wherein each of said first, second, third, and fourth force detecting elements has an outer periphery with a recess in which the respective pair of contacting electrodes are disposed.

30. A force detector according to claim 1, wherein each of said first, second, third, and fourth pair of contacting electrodes of said first, second, third, and fourth switching elements includes a center electrode and an outer electrode surrounding the center electrode in spaced relation.

31. A force detector according to claim 30 comprising a fifth switching element including a fifth pair of contacting electrodes on the substrate, said fifth pair of contacting electrodes including a center electrode and an outer electrode surrounding the center electrode in spaced relation.

32. A force detector according to claim 30 wherein each of said first, second, third, and fourth switching elements comprises a dome structure disposed at each pair of contacting electrodes and being flexible to establish electrical contact between said contacting electrodes when said dome structure is deformed.

33. A force detector according to claim 32 wherein said dome structure has a conductive contacting surface normally out of contact with its respective pair of contacting electrodes and when an external force greater than a predetermined value is applied to the dome structure, contact is made with said pair of contacting electrodes.

* * * * *